United States Patent
Taniguchi et al.

(10) Patent No.: US 7,166,893 B2
(45) Date of Patent: Jan. 23, 2007

(54) SEMICONDUCTOR INTEGRATED CIRCUIT DEVICE

(75) Inventors: Yasuhiro Taniguchi, Kodaira (JP); Shoji Shukuri, Koganei (JP); Kenichi Kuroda, Tachikawa (JP); Shuji Ikeda, Koganei (JP); Takashi Hashimoto, Iruma (JP)

(73) Assignee: Renesas Technology Corp., Tokyo (JP)

( * ) Notice: Subject to any disclaimer, the term of this patent is extended or adjusted under 35 U.S.C. 154(b) by 25 days.

(21) Appl. No.: 10/252,101

(22) Filed: Sep. 23, 2002

(65) Prior Publication Data

US 2003/0151109 A1 Aug. 14, 2003

Related U.S. Application Data

(62) Division of application No. 09/471,321, filed on Dec. 23, 1999, now Pat. No. 6,569,742.

(30) Foreign Application Priority Data

Dec. 25, 1998 (JP) ................................ 10-369017

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .................. 257/336; 257/344; 257/365; 257/369; 257/391; 257/392; 257/E21.435; 257/E29.278

(58) Field of Classification Search ........ 257/390–392, 257/336, 344, 365, 369, E29.278, E21.435

See application file for complete search history.

(56) References Cited

U.S. PATENT DOCUMENTS

| 4,205,330 | A | * | 5/1980 | Klein | 257/392 |
| 4,876,213 | A | * | 10/1989 | Pfiester | 438/231 |
| 5,210,437 | A | * | 5/1993 | Sawada et al. | 257/392 |
| 5,254,866 | A | * | 10/1993 | Ogoh | 257/369 |
| 5,620,920 | A | | 4/1997 | Wilmsmeyer | |
| 5,736,767 | A | * | 4/1998 | Yoshitomi et al. | 257/344 |
| 5,897,348 | A | | 4/1999 | Wu | |
| 5,917,218 | A | * | 6/1999 | Choi et al. | 257/345 |
| 5,981,324 | A | | 11/1999 | Seo et al. | |
| 6,198,140 | B1 | * | 3/2001 | Muramoto et al. | 257/392 |
| 6,221,709 | B1 | * | 4/2001 | Sagarwala et al. | 438/231 |
| 6,281,558 | B1 | * | 8/2001 | Sayama et al. | 257/391 |

FOREIGN PATENT DOCUMENTS

| JP | 62-283666 | 12/1987 |
| JP | 63-226055 | 9/1988 |

(Continued)

Primary Examiner—Jerome Jackson
Assistant Examiner—Jesse A. Fenty
(74) Attorney, Agent, or Firm—Antonelli, Terry, Stout and Kraus, LLP.

(57) ABSTRACT

A MISFET capable of a high speed operation includes a metal silicide layer in a high concentration region aligned with a gate side wall layer on a self-alignment basis. A MISFET which can be driven at a high voltage includes an LDD portion having a width greater than the width of the side wall layer, a high concentration region in contact with the LDD portion and a metal silicide layer in the high concentration region.

46 Claims, 40 Drawing Sheets

FOREIGN PATENT DOCUMENTS

| | | |
|---|---|---|
| JP | 6-181293 | 6/1994 |
| JP | 7-106559 | 4/1995 |
| JP | 7-183506 | 7/1995 |
| JP | 7-211898 | 8/1995 |
| JP | 7-263682 | 10/1995 |
| JP | 9-82949 | 3/1997 |
| JP | 10-12748 | 1/1998 |

\* cited by examiner

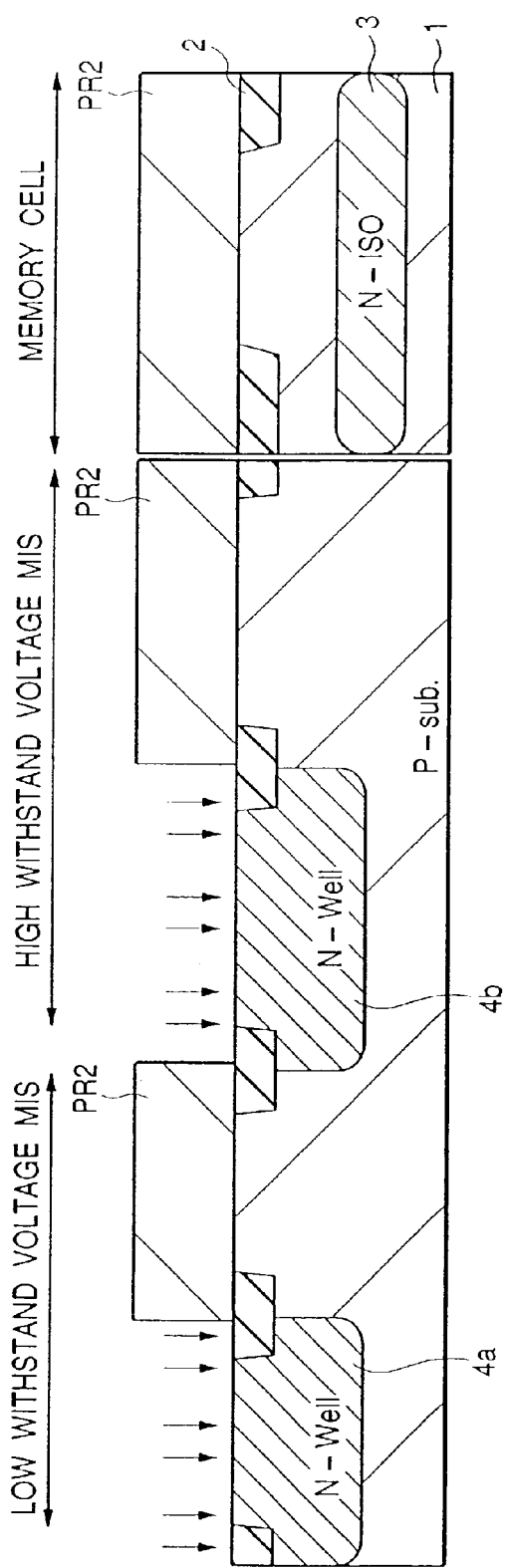
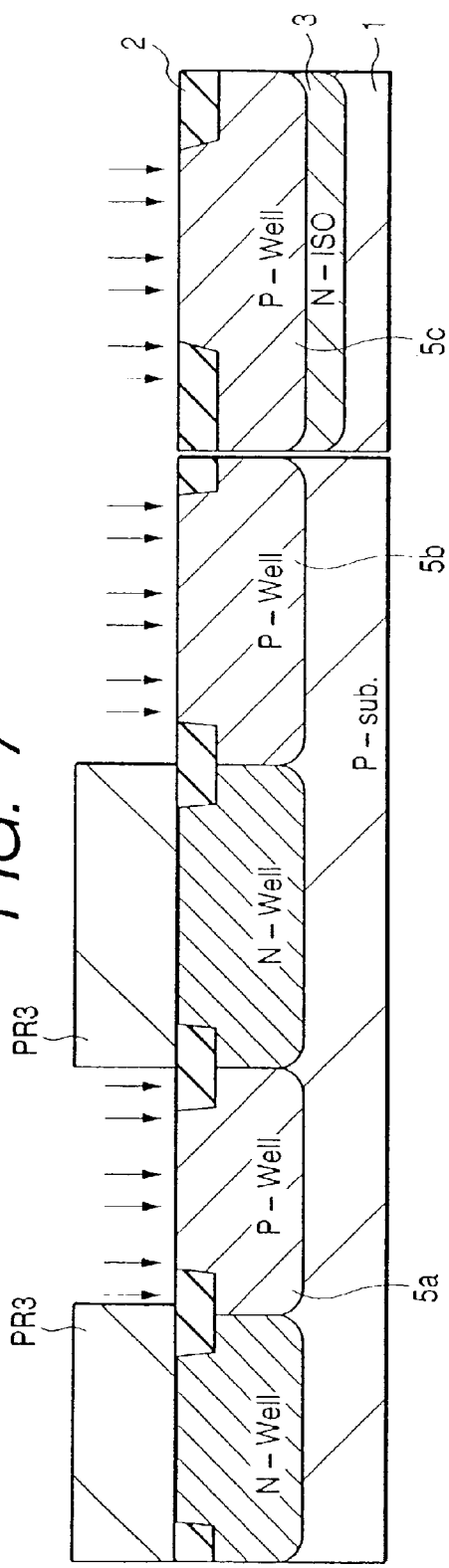

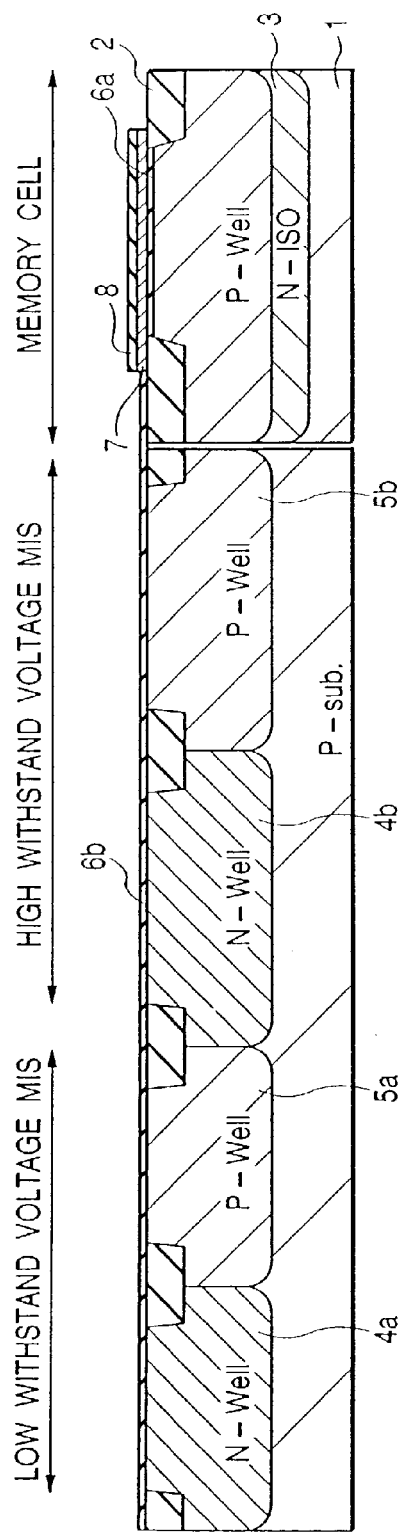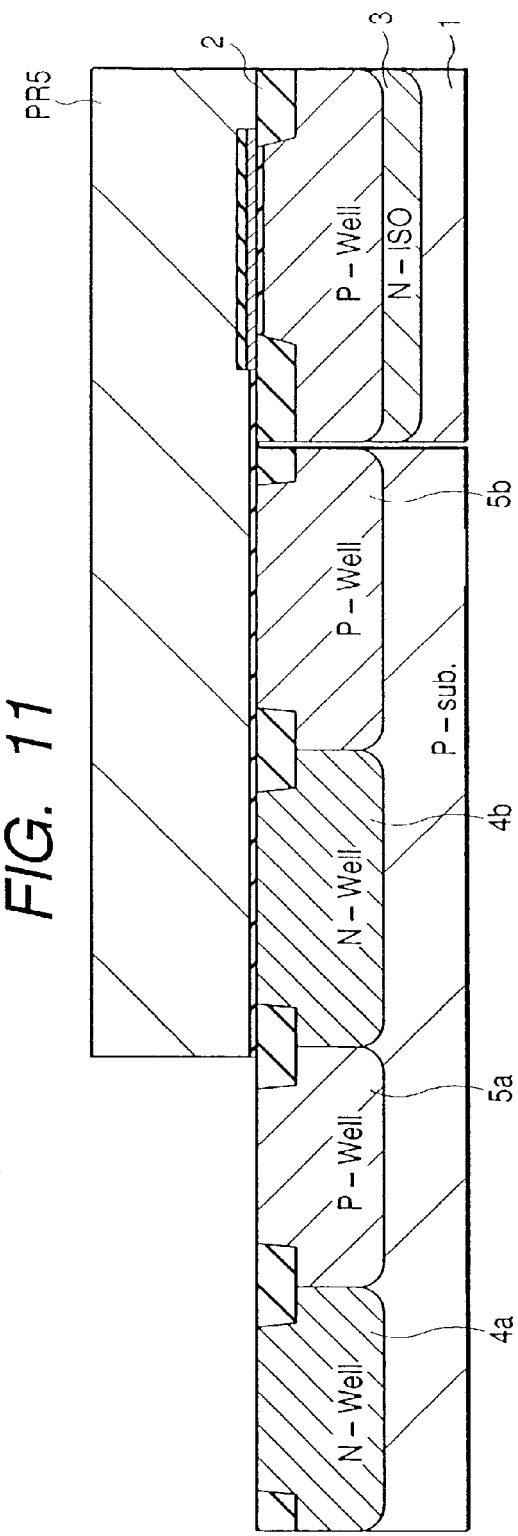

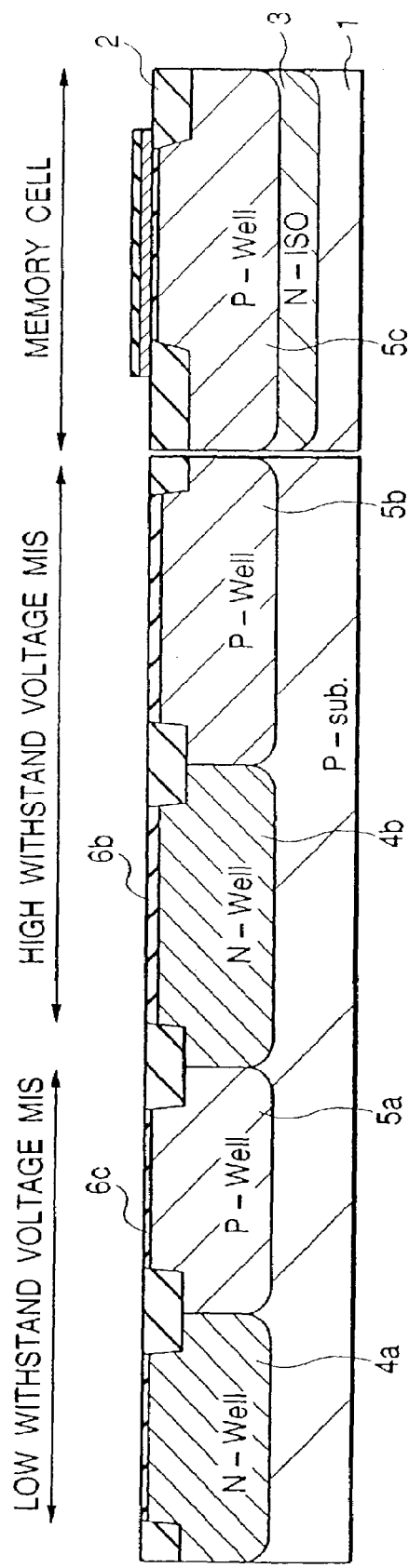
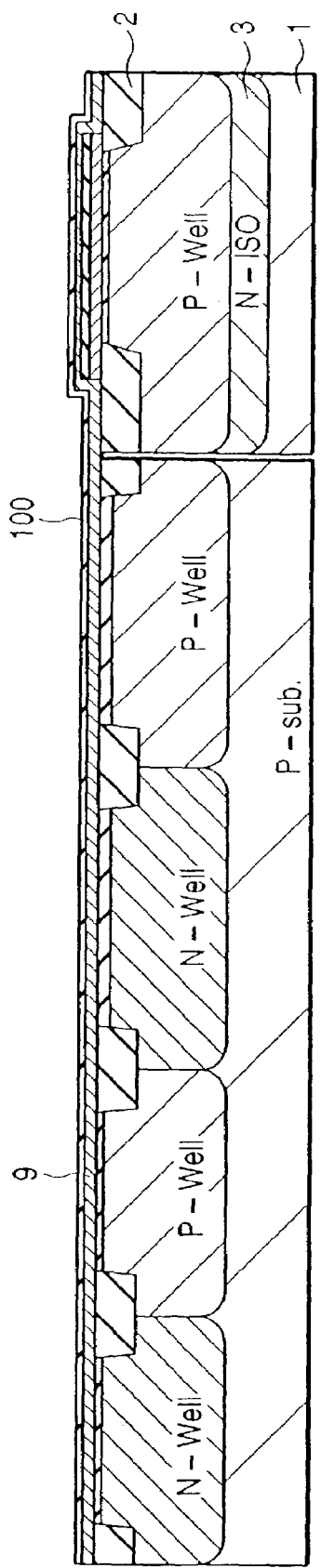

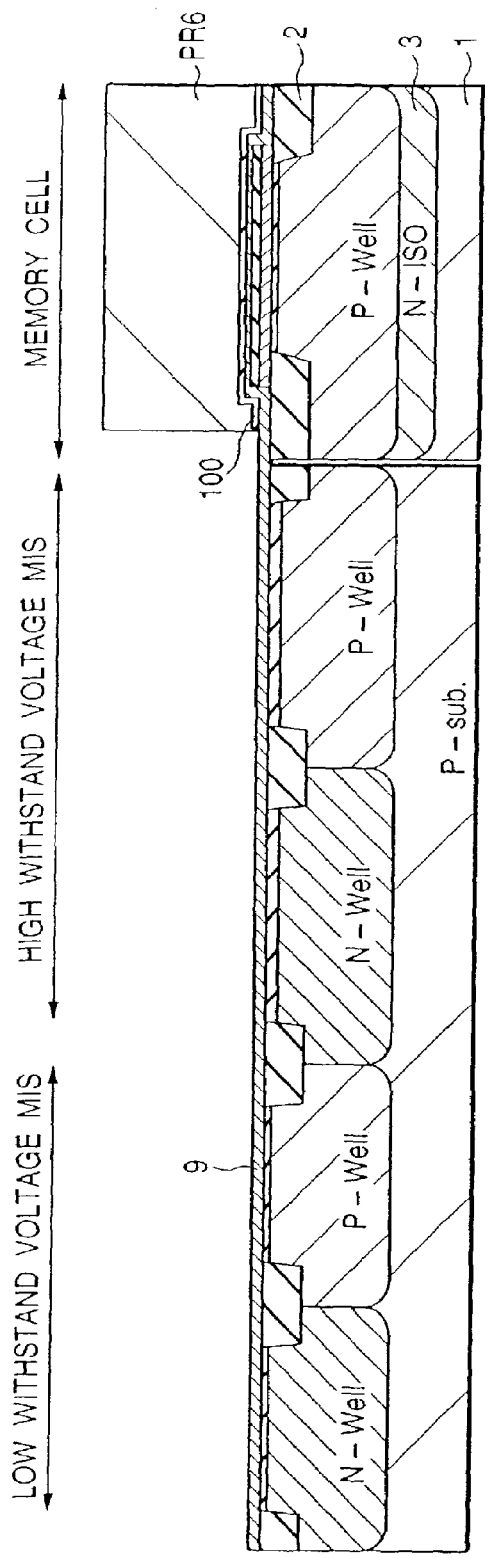
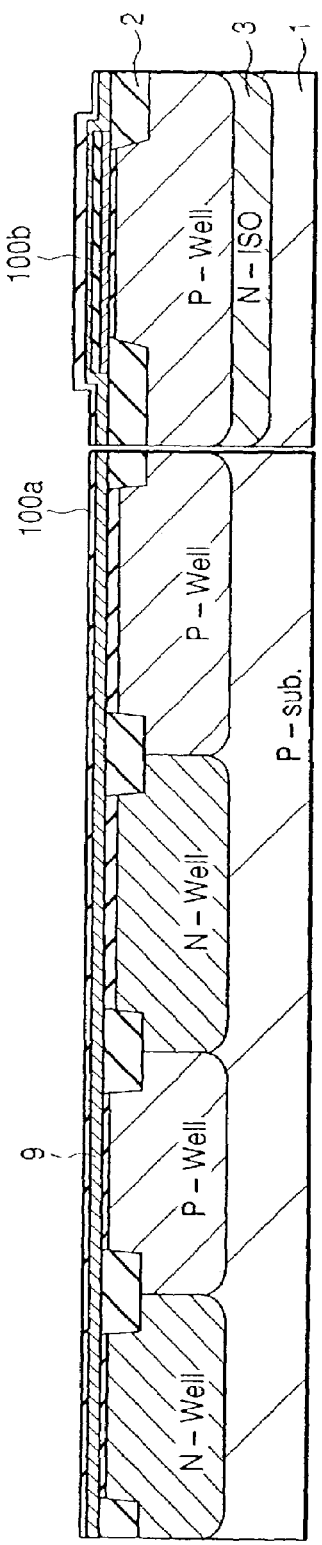

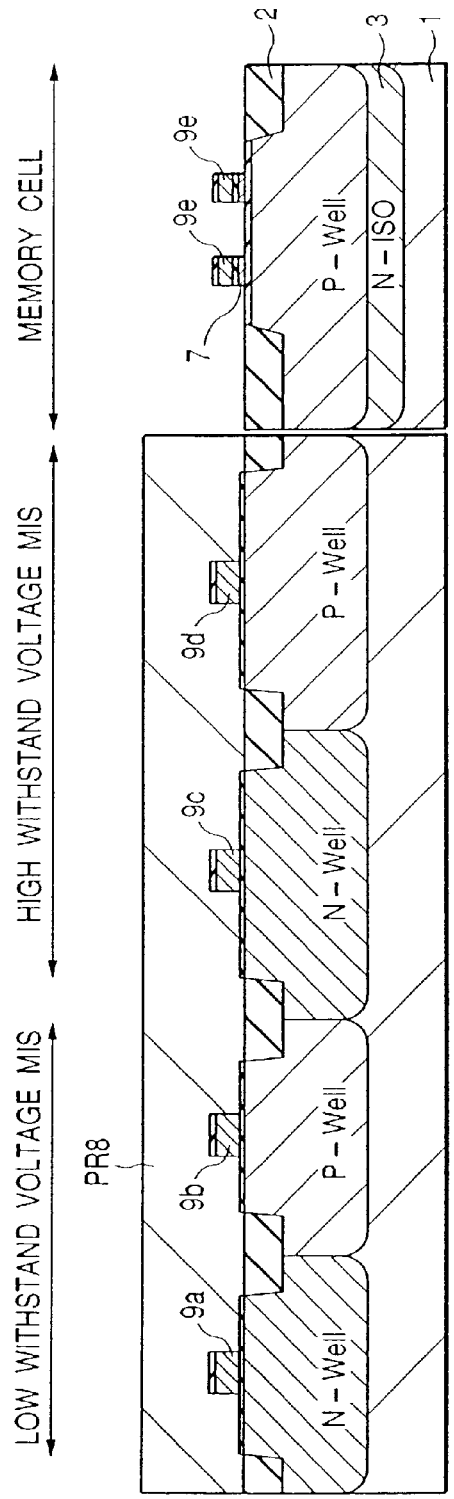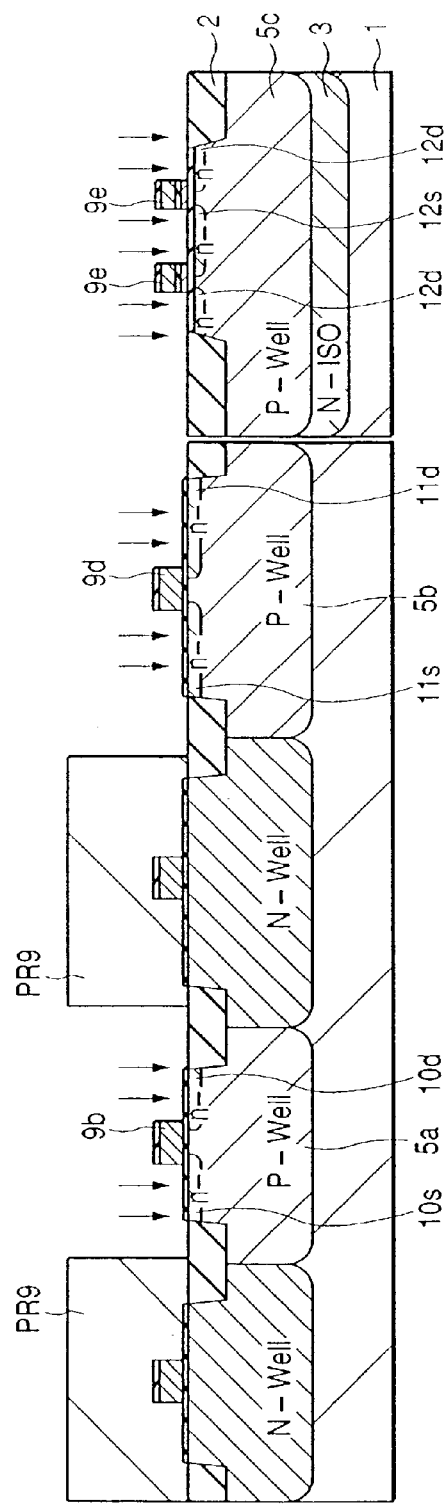

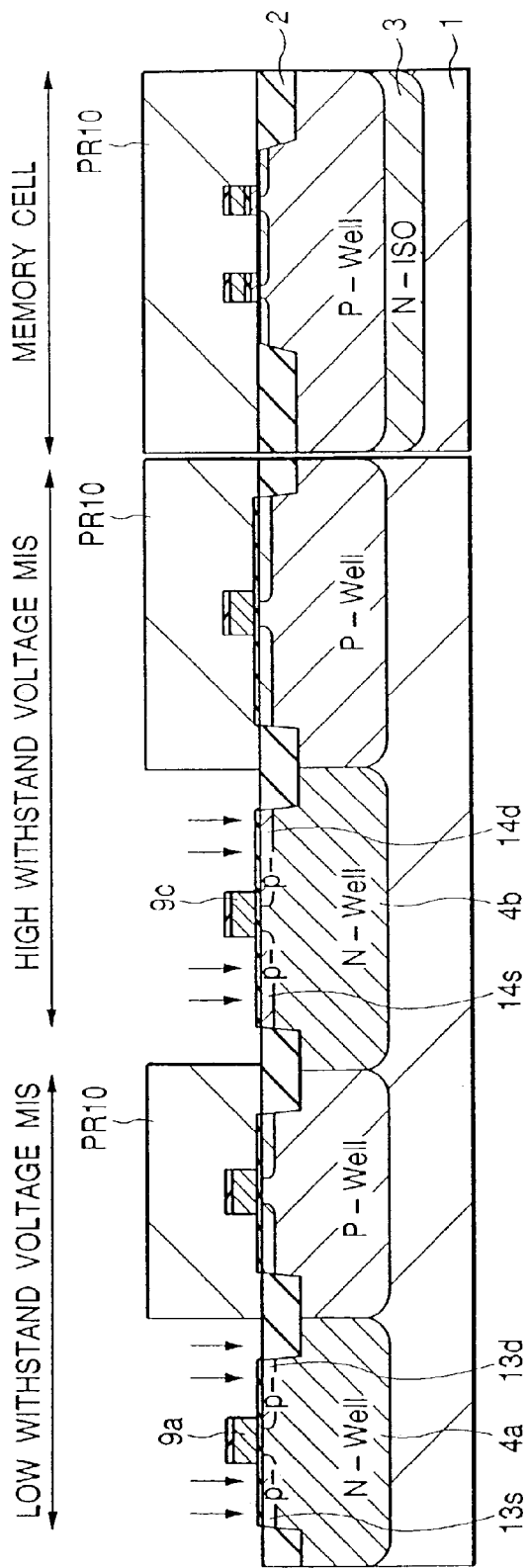
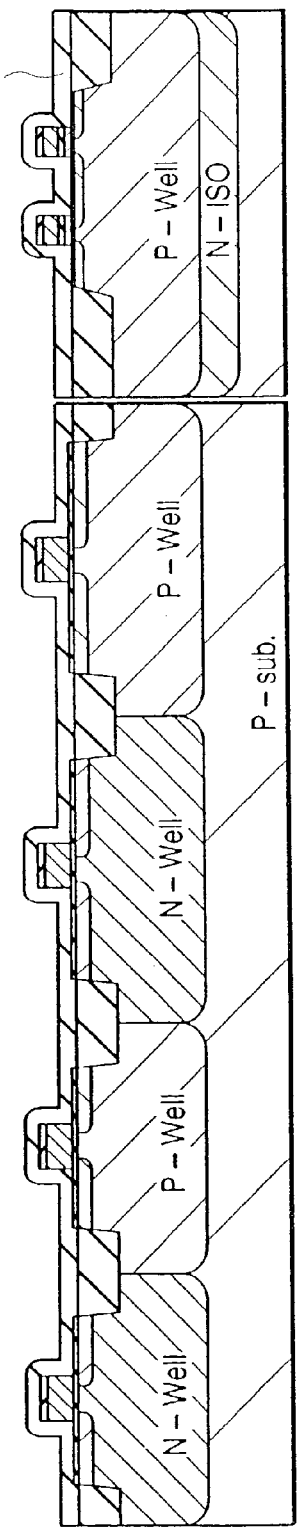
FIG. 20
FIG. 21

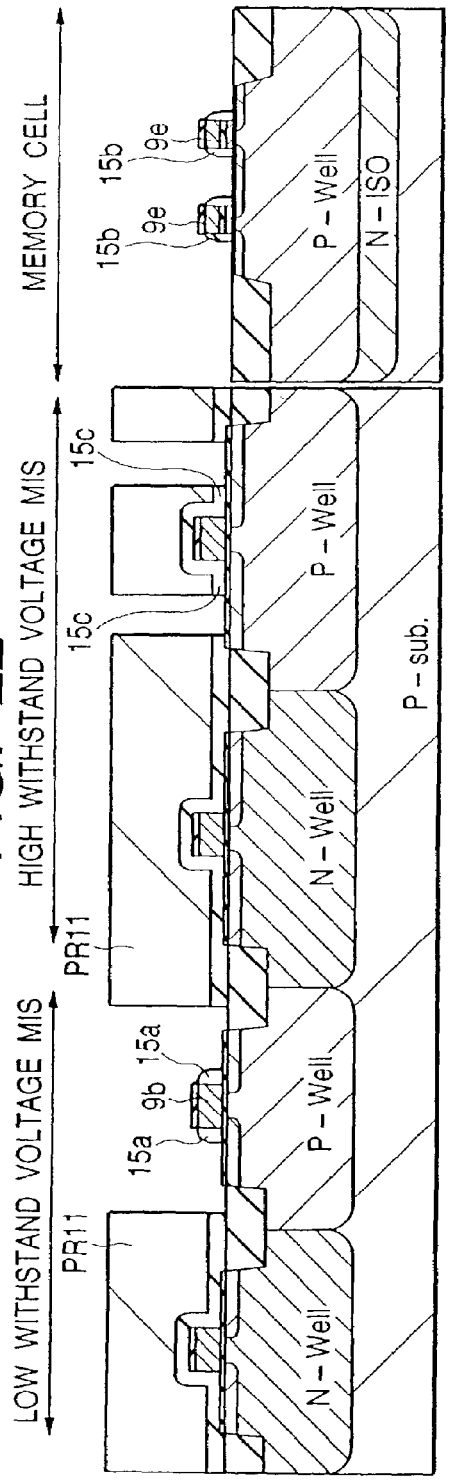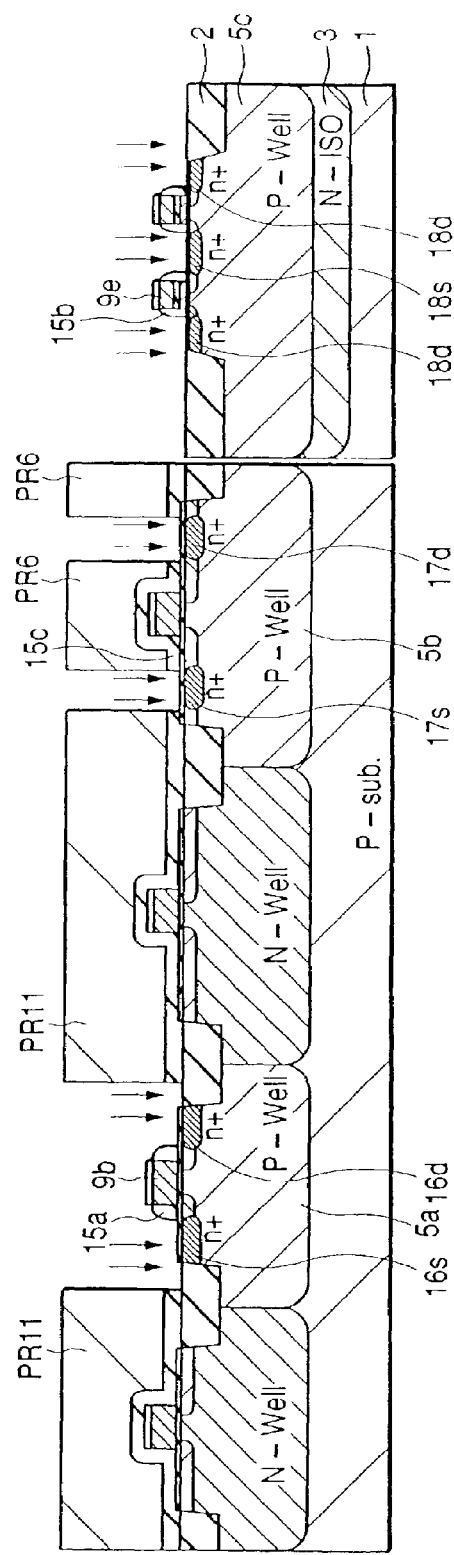

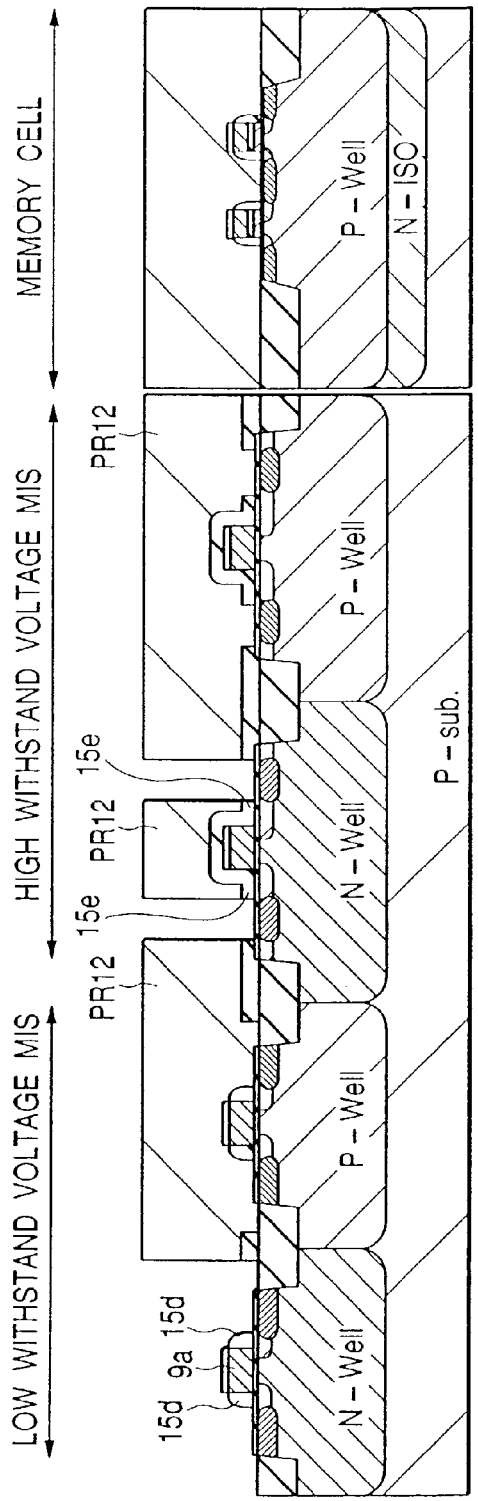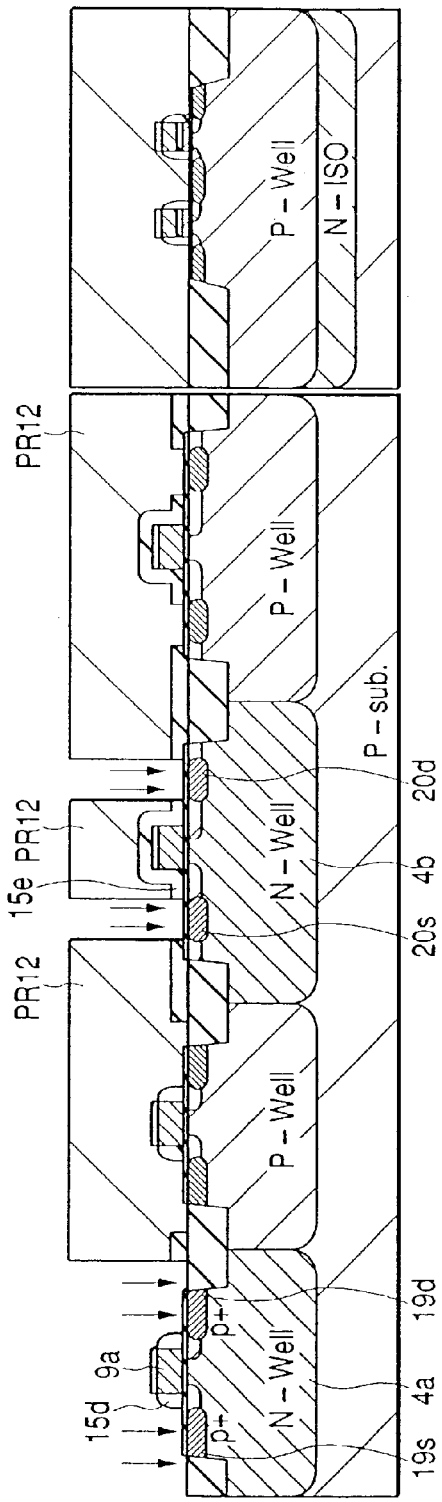

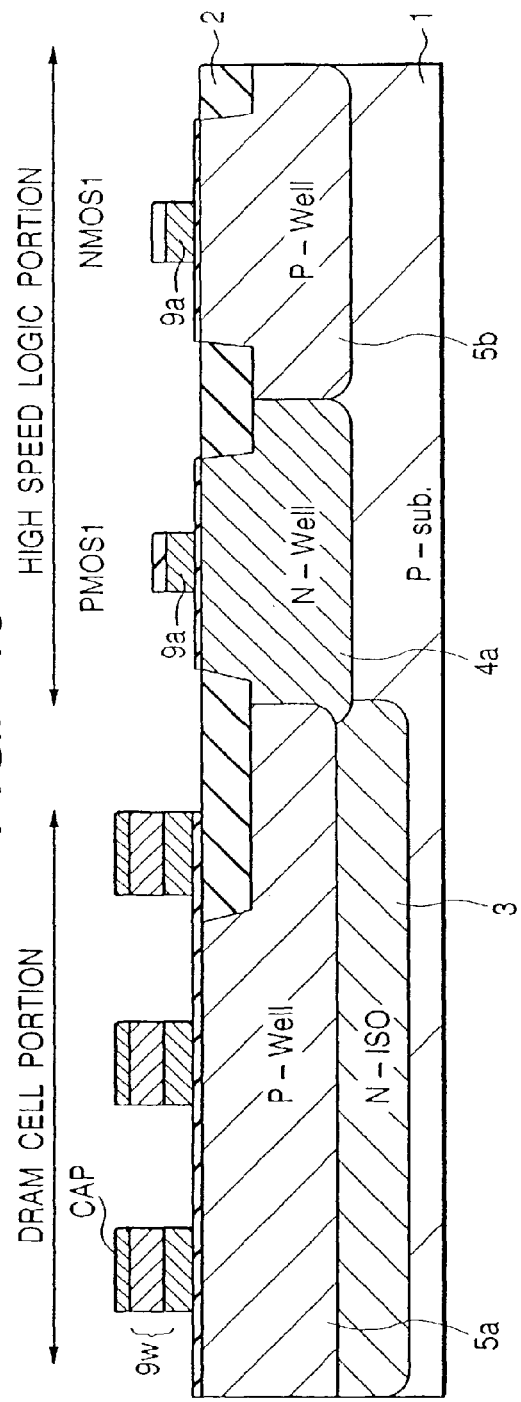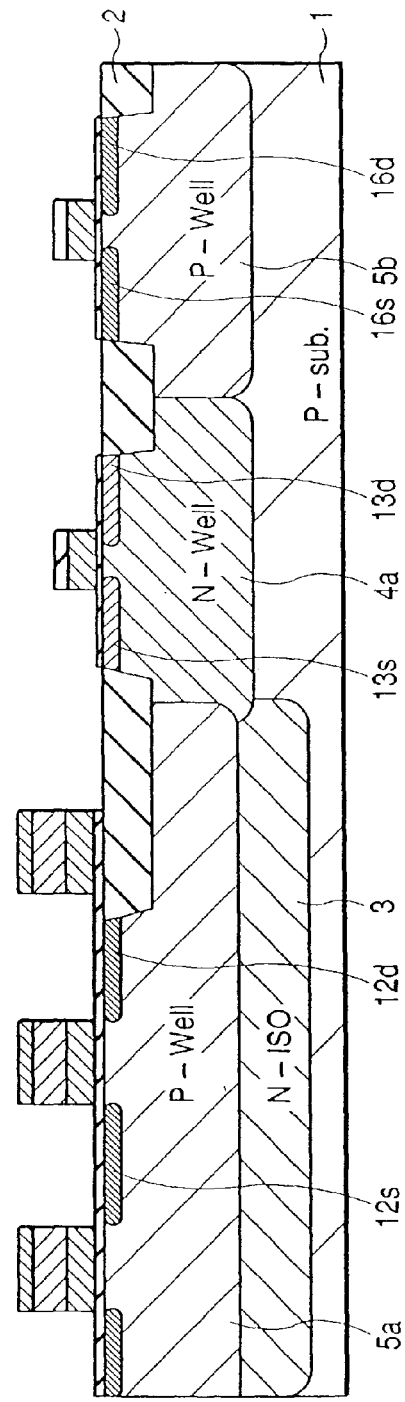

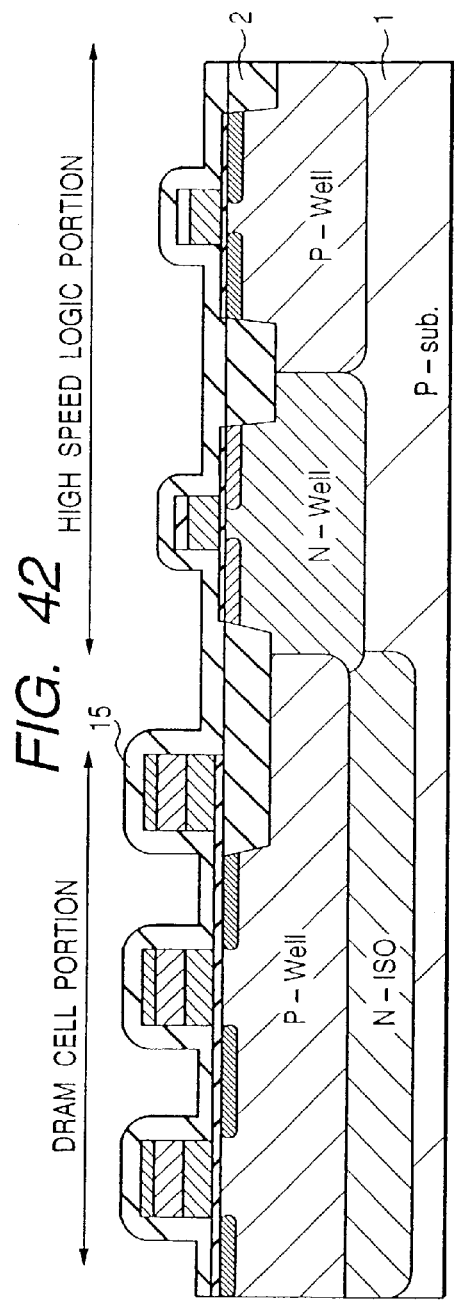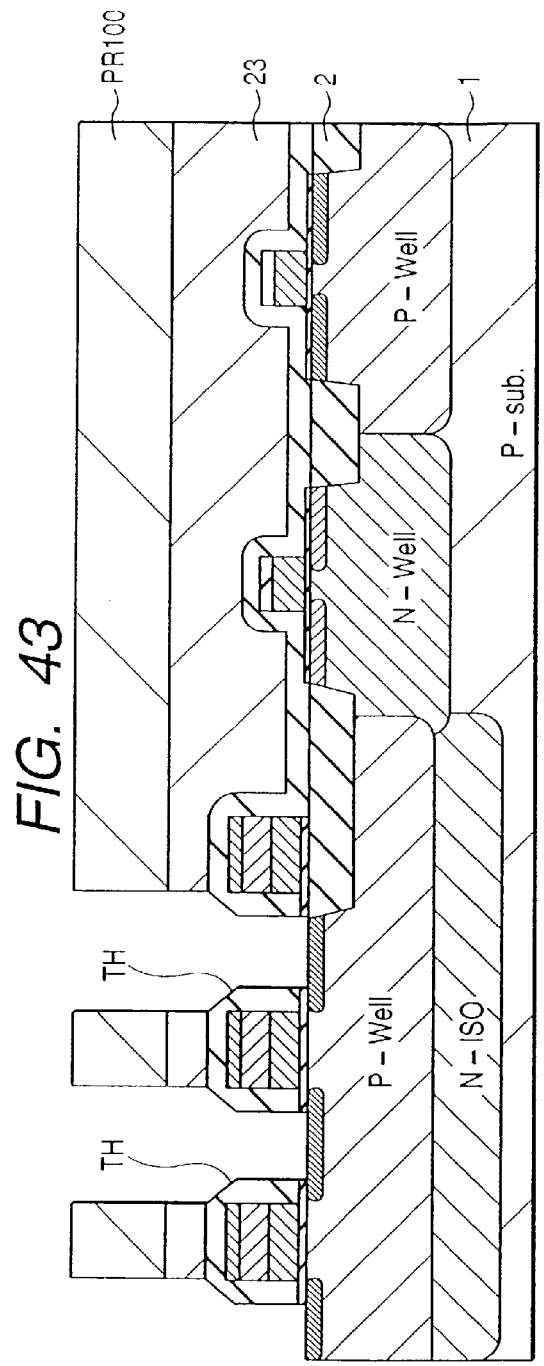

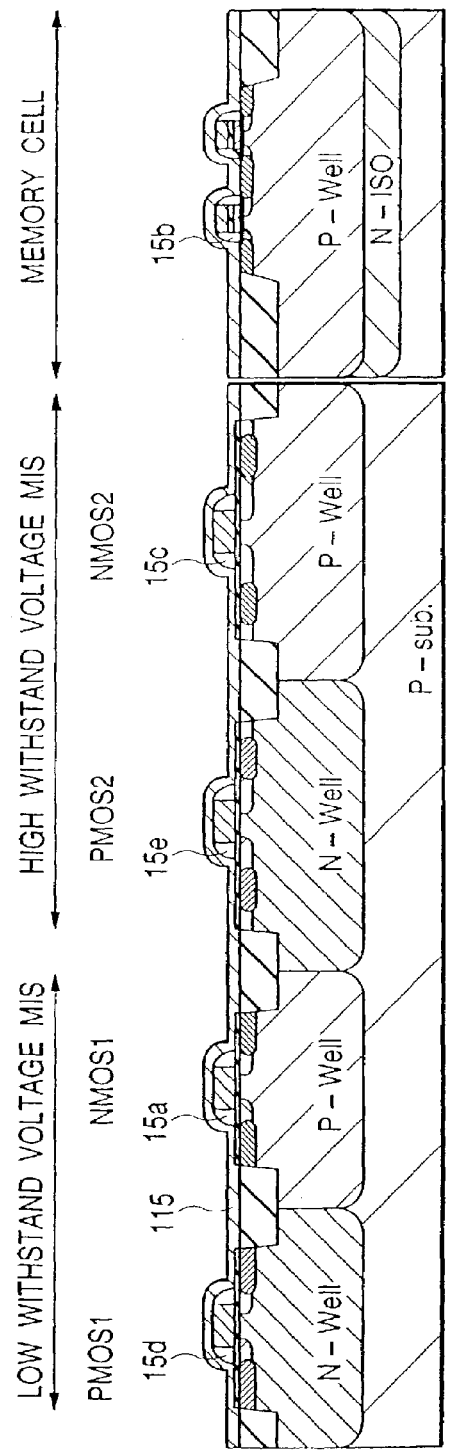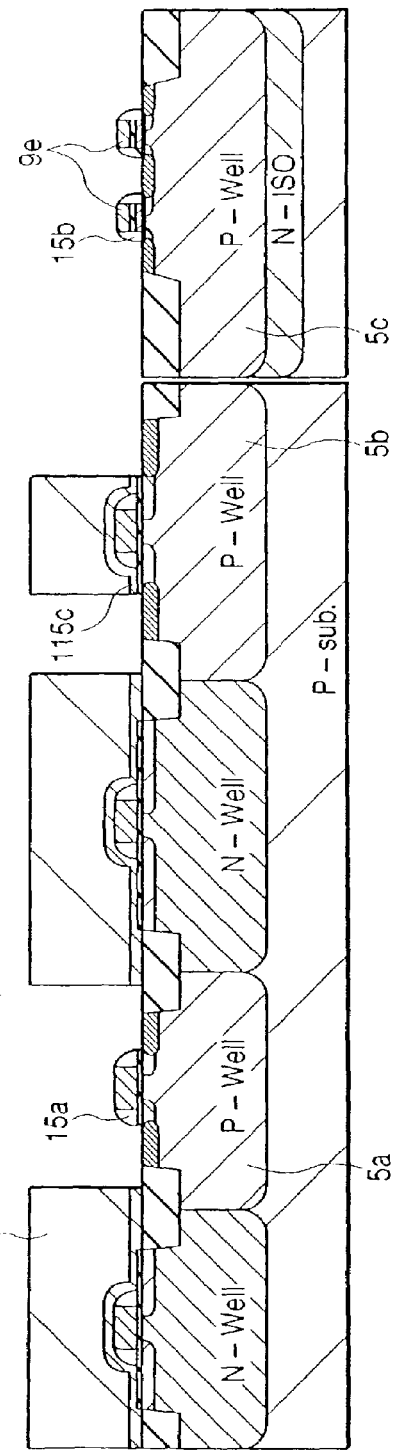

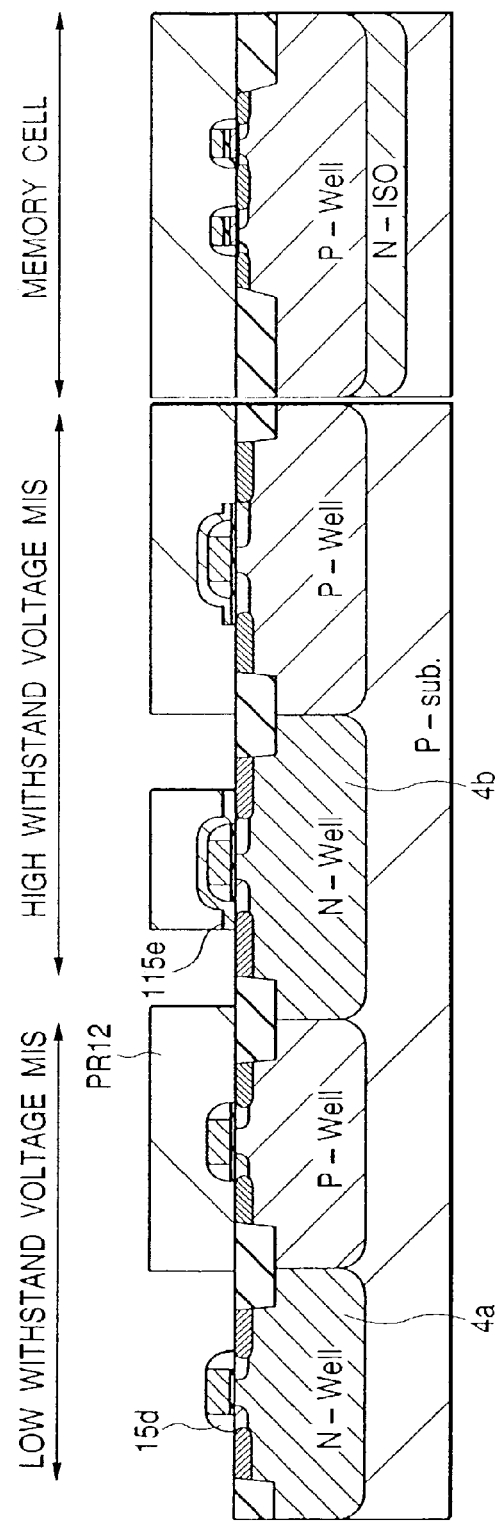
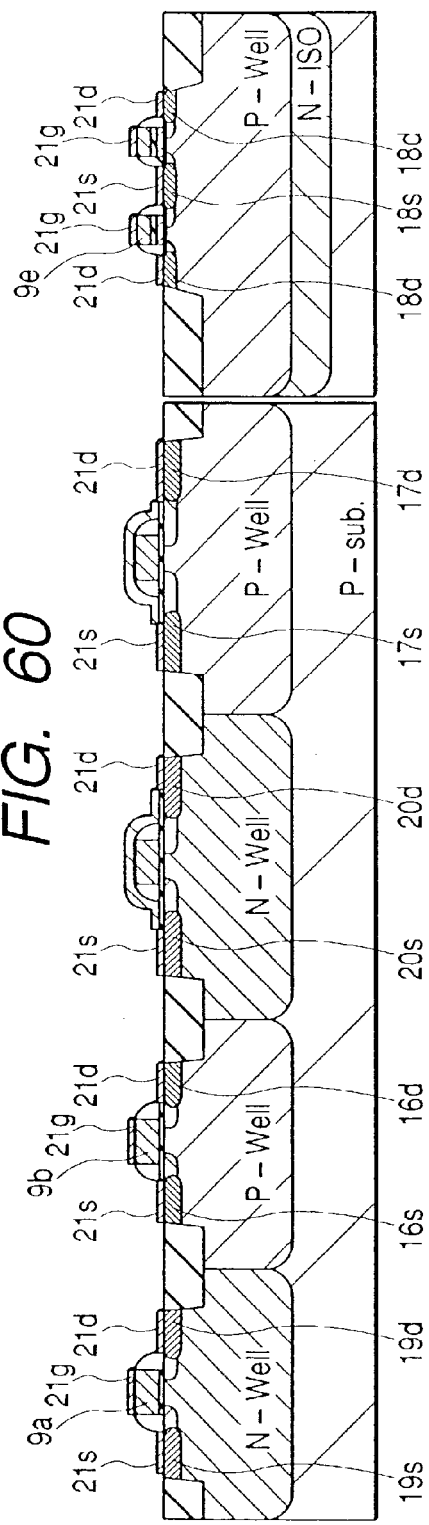

SEMICONDUCTOR INTEGRATED CIRCUIT DEVICE

CROSS-REFERENCE TO RELATED APPLICATIONS

This application is a divisional application of application Ser. No. 09/471,321, filed Dec. 23, 1999 U.S. Pat. No. 6,569,742.

FIELD OF THE INVENTION

The present invention relates to a semiconductor integrated circuit device and a method of manufacturing the same; and, more particularly, the invention relates to a technique which may be advantageously applied to a system on chip wherein a flash memory (EEPROM: electrically erasable programmable ROM) and a CMOS logic circuit (complementary metal oxide semiconductor logic circuit) are mounted on one chip, or to a system wherein a DRAM (dynamic random access memory) and a CMOS logic circuit are mounted on one chip.

BACKGROUND OF THE INVENTION

In the field of advanced technologies such as multi-media and data communication, an effort is recently being put into the development of systems on chip wherein a microcomputer, DRAM, ASIC (application specific integrated circuit), flash memory and the like are mounted on one chip for higher data rates, reduced space requirements (improved packaging density) and lower power consumption.

For example, needs for reduced power consumption in the market have accelerated a trend toward lower voltages. Specifically, the power supply voltage has been reduced from 5 V to 3.3 V. This trend toward low power has opened the door to products of 0.25 micron processing in the field of LSI (large scale integrated circuit) processing techniques, and the main stream of such products is systems which operate on 2.5 V or 1.8 V, interface at a high voltage and operate on a low operating voltage internally.

Referring to device structures, the trend toward higher fineness and higher speeds has spotlighted techniques to achieve lower resistance using a refractory metal silicide film. Especially, the use of a technique for reducing resistance referred to as a "salicide (self-aligned silicide) technique" is effective in providing a system on chip.

The following known articles numbered 1 through 7 disclose salicide techniques.

(1) Japanese laid-open patent publication No. H7-211898 (article 1)

Article 1 discloses a semiconductor device for maintaining the durability of a gate oxide film of a semiconductor device at an I/O portion and a method of manufacturing the same. It also discloses a technique applied to a CMOS, characterized in that a diffusion layer having a concentration lower than that in the source and drain diffusion layers is formed between the source and drain diffusion layers and a gate and in that the low concentration diffusion layer is a non-salicide region unlike the source and drain diffusion regions. The known article 1 will be described later in more detail.

(2) Japanese laid-open patent publication No. H7-106559 (article 2)

Article 2 discloses a method of manufacturing a semiconductor device in which high reliability and cost reduction is achieved by simultaneously forming an insulation film covering the sides of a gate electrode and an insulation film covering the boundary between a device isolating region and a transistor active region. It also discloses a technique for reducing leakage during processing of a side spacer insulation film (silicon oxide film) around a gate by extending a mask up to the end of the device isolating region to leave it, thereby offsetting the source, drain and a suicide film from the device isolating region.

(3) Japanese laid-open patent publication No. H7-183506 (article 3)

Article 3 discloses a transistor having a structure which minimizes both of the layer resistance of a titanium suicide film that constitutes a gate electrode and the layer resistance of a titanium silicide film that constitute source and drain regions having a salicide structure. It also discloses a technique in which a polycrystalline silicon film dominated by (111)-orientation is used as the gate electrode on which the titanium silicide film is formed. That is, the article 1 presents a salicide technique based on the formation of titanium silicide on a gate electrode.

(4) Japanese laid-open patent publication No. H7-263682 (article 4)

Article 4 discloses a method of manufacturing a MISFET having a salicide structure which makes it possible to reduce leakage current and to reduce parasitic resistance.

According to Article 4, a first diffusion layer is formed using ion implantation and a heating process; thereafter, second ion implantation is carried out using side walls as a mask to form a second diffusion layer; and rapid thermal annealing (RTA) is used to activate the impurity in the second diffusion layer. This removes crystal defects in the diffusion layer as a result of the ion implantation and prevents any reduction of the concentration of the impurity in the vicinity of the interface between the surface of the diffusion layer and the bottom of a silicide layer to reduce parasitic resistance.

(5) Japanese laid-open patent publication No. H9-82949 (article 5)

Article 5 discloses a semiconductor device which has less leakage current and an operation speed higher than that in a case wherein neither metal suicide layer nor metal layer is formed on the source and drain regions and a method of manufacturing the same. According to Article 5, an offset layer is formed between the interface of a p-n junction of the source and drain and the end of a metal suicide layer or metal layer in order to suppress the generation of any leakage current between them. The offset layer is controlled by the thickness of a side wall spacer provided on a side wall of the gate (the width of the side wall in the direction of the channel length).

(6) Japanese laid-open patent publication No. H10-12748 (article 6)

Article 6 discloses a CMOS semiconductor device having a structure comprised of different types of gates (dual gate structure) formed by introducing impurities of different conductivity types and discloses the use of a salicide structure and the use of titanium (Ti) or cobalt (Co) as a specific metallic material to provide the salicide structure.

The following articles disclose techniques for providing a plurality of MISFETs with an LDD (lightly doped drain) structure having various electrical characteristics to be incorporated in one semiconductor substrate.

(7) Japanese laid-open patent publication No. S62-283666 (article 7)

Article 7 discloses a technique in which the width of a side wall is changed to change the width of a semiconductor region having a high impurity concentration located under the side wall. That is, there is provided MISFETs having different offset widths of the regions between the ends of the gate electrodes and the ends of the semiconductor regions having a high impurity concentration. Article 7 does not disclose any application of the salicide technique.

(8) Japanese laid-open patent publication No. S63-226055 (article 8)

Article 8 discloses a technique for maintaining the withstand voltage of an n-channel MISFET and for improving the current driving capability of a p-channel MISFET. According to the technique disclosed in article 8, the dimensions of an LDD portion of an n-channel MISFET are increased to separate the source and drain regions having a high impurity concentration and to thereby maintain the withstand voltage between those regions, and the dimensions of an LDD portion of a p-channel MISFET are decreased to reduce series resistance of the source region and series resistance of the drain region and to thereby improve current driving capability. Article 8 does not also disclose any application of the salicide technique.

SUMMARY OF THE INVENTION

In a system on chip incorporating a flash memory array and a logic circuit such as a microcomputer, for example, an external power supply of 3.3 V is used which results in a need for a plurality of MISFETs to be driven at the external power supply of 3.3 V, and a first internal power supply voltage of 1.8 V is generated by a voltage reduction circuit for reduced power consumption and increased speed which results in a need for a plurality of MISFETs to be driven at the first internal power supply voltage. Further, a second internal power supply voltage in the range from 10 V to 12 V is generated by a boosting circuit, which results in a need for a plurality of MISFETs to be driven at the second internal power supply voltage (10 to 12 V) for purposes including writing into selected memory cells in the flash memory array. Hereinafter, the former MISFETs driven at the voltage of 3.3 V or 1.8 V are referred to as "low withstand voltage MISFETs", and the latter MISFETs driven at the voltage in the range from 10 to 12V are referred to as "high withstand voltage MISFETs". Each of the low withstand voltage MISFETs and high withstand voltage MISFETs is incorporated in one semiconductor body (semiconductor chip) in the form of a CMOS (a pair of a p-channel MISFET and an n-channel MISFET).

A possible solution to improve the capability of the devices (MISFETs) forming the system on chip is to reduce the resistance of the gate electrode and the diffusion layers (source and drain regions) using the salicide technique.

Further, a device-related technique for a second internal power supply circuit (high voltage power supply circuit) in a system on chip has been conceived in which a diffusion layer having a high concentration (contact region) is offset from a gate electrode and a field oxide film. Such a device is referred to as "offset MOS".

This technique makes it possible to increase the withstand voltage of a diffusion layer, thereby maintaining a margin to deal with the generation of a high voltage. Specifically, a region having a concentration lower than that of the diffusion layer is provided between a channel region under a gate electrode and the diffusion layer having a higher concentration to offset the channel region and the diffusion layer of a higher concentration. As a result, a high resistance layer constituted only by a region having a low concentration (extension layer) is formed between them, which improves characteristics such as drain-source breakdown voltage (gate voltage open) BVds0 of the device.

In order to manufacture a product in which a flash memory and a microcomputer are mounted on the same chip (i.e., a system LSI) with high device performance, a technique is required which provides the advantages of both of an offset MOS and salicide technique as described above. However, efforts to provide the advantages of the two techniques have revealed the following problems.

Silicidization of a diffusion layer formed with an offset MOS has also silicidized a low concentration diffusion layer (extension layer) in the offset region. This results in an increase of junction leakage attributable to absorption of the impurity in the diffusion layer during the silicidizing reaction.

Further, the offset MOS cannot provide expected performance because of factors including concentration of a current attributable to a reduction in the resistance on the surface thereof. Specifically, the diffusion layer includes a region where the silicide layer (low resistance layer) abruptly changes to the salicide layer (high resistance layer), and a concentration of a current in such a region results in local fusing which in turn deteriorates device characteristics.

One possible solution to this problem is to cover the diffusion layer having a low concentration of the offset MOS with a photoresist mask to form the silicide layer only on the diffusion layer having a high concentration.

The above-described method makes it possible to prevent silicidization on the surface of the low concentration diffusion layer, thereby providing a salicide and an offset MOS in the same chip without deteriorating characteristics.

Referring to the above-mentioned known article 1. FIG. 1(e) shows a semiconductor device at an I/O portion having an offset structure including a non-salicide region. Specifically, a salicide layer (salicide region: $TiSi_2$ 13) is selectively formed only on a diffusion layer having a high concentration. As apparent from the above description, such a semiconductor device structure makes it possible to maintain the durabiiity of not only a gate insulation film but also an end of a LOCOS oxide film even when a voltage higher than an operating voltage is applied to the source and drain diffusion layers.

However, this method inevitably results in a cost increase attributable to an increase in the number of masks because it involves a step of covering the surface of a low concentration diffusion layer as described above to prevent it from being silicidized.

A problem also arises in that it is difficult to achieve fineness because layout designing must be carried out in consideration to misalignment between the mask to form a non-silicide region and a diffusion layer surrounding the region.

How to reduce the number of masks is an important technical challenge in achieving a high level of integration of a system on chip at a reduced cost.

This is because a reduction of the number of masks makes it possible not only to reduce the manufacturing cost of masks but also to reduce a series of processes for forming photoresist patterns using the masks, i.e., application, exposure, development, cleaning and drying of the photoresist, which significantly reduces the processing cost of a semiconductor integrated circuit device. Further, it is possible to reduce the rate of occurrence of defects attributable to foreign substances, which makes it possible to improve the yield and reliability of semiconductor integrated circuit devices.

Under such circumstances, the inventors studied the possibility of deletion of the photoresist masking step to form a salicide region of an offset MOS and the study focused on a mask for forming an n+ (high concentration) diffusion layer and a mask for forming a p+ (low concentration) diffusion layer.

It is a first object of the invention to provide a novel semiconductor integrated circuit device incorporating a MISFET capable of operating at a high speed and a MISFET which can be driven at a high voltage.

It is a second object of the invention to provide a method of manufacturing a semiconductor integrated circuit device incorporating MISFETs with channels of the same conductivity type having different characteristics at a low cost and improved production yield.

It is a third object of the invention to provide a novel semiconductor integrated circuit device incorporating a low withstand voltage MISFET and a high withstand voltage MISFET.

It is a fourth object of the invention to provide a method of manufacturing a semiconductor integrated circuit device incorporating a low withstand voltage MISFET and a high withstand voltage MISFET at a low cost.

It is a fifth object of the invention to provide a novel CMOS semiconductor integrated circuit device incorporating a MISFET capable of operating at a high speed and a MISFET which can be driven at a high voltage.

It is a sixth object of the invention to provide a method of manufacturing a CMOS semiconductor integrated circuit device incorporating p-channel MISFETs having different characteristics and n-channel MISFETs having different characteristics at a low cost. It is a seventh object of the invention to provide a novel semiconductor integrated circuit device in which a flash memory and a logic circuit capable of operating at a high speed are incorporated in a single semiconductor chip.

It is an eighth object of the invention to provide a method of manufacturing a semiconductor integrated circuit device in which a flash memory and a logic circuit capable of operating at a high speed are incorporated in a single semiconductor chip at a low cost.

It is a ninth object of the invention to provide a novel semiconductor integrated circuit device in which an SRAM and a logic circuit capable of operating at a high speed are incorporated in a single semiconductor chip.

It is a tenth object of the invention to provide a method of manufacturing a semiconductor integrated circuit device in which an SRAM and a logic circuit capable of operating at a high speed are incorporated in a single semiconductor chip at a low cost.

It is an eleventh object of the invention to provide a novel semiconductor integrated circuit device in which a DRAM and a logic circuit capable of operating at a high speed are incorporated in a single semiconductor chip.

It is a twelfth object of the invention to provide a method of manufacturing a semiconductor integrated circuit device in which a DRAM and a logic circuit capable of operating at a high speed are incorporated in a single semiconductor chip at a low cost.

(1) According to a first aspect of the invention, on a semiconductor body having a first semiconductor principal surface and a second semiconductor principal surface separated from each other, there is provided:

a first MISFET formed by a first gate electrode provided on the first semiconductor principal surface with a gate insulation film interposed therebetween, a first region having a relatively low concentration which is aligned with the first gate electrode and which exhibits the conductivity type opposite to the conductivity type of the first semiconductor principal surface, a first insulation film provided on a side wall of the first gate electrode on the first region, a second region having a relatively high concentration which is aligned with an end of the first insulation film, which exhibits the same conductivity type as the first region and which is in contact with the first region, and a metal-semiconductor reaction layer on the principal surface in the second region which is aligned with an end of the first insulation film; and a second MISFET formed by a second gate electrode provided on the second semiconductor principal surface with a gate insulation film interposed therebetween, a third region having a relatively low concentration which is aligned with the second gate electrode and which exhibits the conductivity type opposite to the conductivity type of the second semiconductor principal surface, a second insulation film provided on a side wall of the second gate electrode on the third region which is greater than the first insulation film in the width in the direction of the gate length, a fourth region having a relatively high concentration which is aligned with an end of the second insulation film, which exhibits the same conductivity type as the third region and which is in contact with the third region, and a metal-semiconductor reaction layer on the principal surface in the fourth region which is aligned with an end of the second insulation film.

According to the above-described first aspect, each of the second region of the first MISFET and the metal-semiconductor reaction layer is aligned with an end of the first insulation film; each of the fourth region of the second MISFET and the metal-semiconductor reaction layer is aligned with an end of the second insulation film; and the resistance of electrode extracting portions of the second and fourth regions is decreased by the metal-semiconductor reaction layers.

Thus, each of the first and second MISFETs can operate at a high speed. Since the second insulation film is wider than the first insulation film, the distance between an end of a p-n junction formed by the second semiconductor and the first region and the metal-semiconductor reaction layer is greater than the distance between an end of a p-n junction formed by the first semiconductor and the second region and the metal-semiconductor reaction layer. This makes it possible to allow a depletion layer to spread in the third region sufficiently, which allows the second MISFET to be provided with a withstand voltage higher than that of the first MISFET, i.e., which makes it possible to provide a MISFET that can be driven at a high voltage.

(2) According to a second aspect of the invention, there is provided:

a first semiconductor and a second semiconductor separated from each other by an insulating isolation layer;

a first MISFET formed by a first gate electrode provided on the first semiconductor with a gate insulation film interposed therebetween, a first region having a first impurity concentration which is aligned with the first gate electrode and the insulating isolation layer and which exhibits the conductivity type opposite to the conductivity type of the first semiconductor, a first insulation film selectively left on a side wall of the first gate electrode on the first region, a second region which is aligned with the first insulation film and the insulating isolation layer, which is of the same conductivity type as the first region, which exhibits a concentration higher than the first impurity concentration and which is in contact with the first region, and a metal-semiconductor reaction layer on a principal surface in the second region which is aligned with the first insulation film; and a second MISFET formed by a second gate electrode provided on the second semiconductor with a gate insulation film interposed therebetween, a third region having a third impurity concentration which is aligned with the second gate electrode and the insulating isolation layer and which exhibits the conductivity type opposite to the conductivity type of the second semiconductor, a second insulation film selectively formed on the third region such that it protrudes from a side wall of the second gate electrode and the insulating isolation layer, a fourth region which is aligned with the second insulation film and the insulating isolation layer, which is of the same conductivity type as the third region, which exhibits a concentration higher than the third impurity concentration and which is in contact with the third region, and a metal-semiconductor reaction layer on a principal surface in the fourth region which is aligned with the second insulation film. The pattern width of the second gate insulation from an end of the second gate electrode is greater than the pattern width of the first insulation film from an end of the first gate electrode.

According to the above-described second aspect, it is possible to allow a depletion layer to spread in the third region sufficiently, which allows the second MISFET to be provided with a withstand voltage higher than that of the first MISFET. Further, the problem of junction leakage can be solved because the metal-semiconductor reaction layer of the second MISFET is formed apart from the third region and the insulating isolation layer.

(3) According to a third aspect of the invention, there is provided the steps of:

forming a pattern of each of a first gate electrode on a principal surface of a first semiconductor with a first gate insulation film interposed therebetween and forming a second gate electrode on a principal surface of a second semiconductor with a second gate insulation film interposed therebetween;

introducing an impurity exhibiting the conductivity type opposite to the conductivity type of the first semiconductor to a region of the first semiconductor principal surface unmasked by the first gate electrode to form a first region having a first impurity concentration;

introducing an impurity exhibiting the second conductivity type opposite to the first conductivity type of the first semiconductor to a region of the second semiconductor principal surface unmasked by the second gate electrode to form a third region having a third impurity concentration;

forming an insulation film on each of the first semiconductor principal surface having the first gate electrode formed thereon and the second semiconductor principal surface having the second gate electrode formed thereon;

performing anisotropic etching on the insulation film on the first semiconductor principal surface to leave a first insulation film on a side wall of the first gate electrode;

providing a pattern mask on the insulation film on the second semiconductor principal surface and performing pattern etching of the insulation film with the mask to leave a second insulation film on a side wall of the second gate electrode;

introducing an impurity exhibiting the second conductivity type to a region of the first semiconductor principal surface unmasked by the first insulation film to form a second region having a second impurity concentration higher than the first impurity concentration and introducing an impurity exhibiting the second conductivity type to a region of the second semiconductor principal surface unmasked by the second insulation film to form a fourth region having a fourth impurity concentration higher than the third impurity concentration; and forming a metal-semiconductor reaction layer aligned with the first insulation film and a metal-semiconductor reaction layer aligned with the second insulation film on the surfaces of the second and fourth regions, respectively.

According to the third aspect, since self-aligning formation occurs between the second region and the metal-semiconductor reaction layer on the surface thereof and between the fourth region and the metal-semiconductor reaction layer on the surface thereof as a result of the intervention of the first and second insulation films respectively, the number of masks can be reduced. This makes it possible not only to reduce the manufacturing cost of masks themselves but also to reduce a series of processes for forming photoresist patterns using the masks, i.e., application, exposure, development, cleaning and drying of the photoresist, which significantly reduces the processing cost of a semiconductor integrated circuit device. Further, it is possible to reduce the rate of occurrence of defects attributable to foreign substances, which makes it possible to improve the yield and reliability of semiconductor integrated circuit devices.

(4) According to a fourth aspect of the invention, on a substrate having a first semiconductor region and a second semiconductor region, there is provided:

a first MISFET formed by a first gate electrode provided on a principal surface of the first semiconductor region with a gate insulation film having a first thickness interposed therebetween, a first region having a first impurity concentration which is aligned with the first gate electrode, which is provided in the first semiconductor region and which exhibits the conductivity type opposite to the conductivity type of the first semiconductor region, a first insulation film having a first side wall width selectively formed on a side wall of the first gate electrode on the first region, a second region which is aligned with the first insulation film, which is of the same conductivity type as the first region, which exhibits a concentration higher than the first impurity concentration and which partially overlaps the first region, and a metal-semiconductor reaction layer formed on a principal surface of the second region; and a second MISFET formed by a second gate electrode provided on the principal surface of the second semiconductor region with a gate insulation film having a second thickness larger than the first thickness interposed therebetween, a third region having a third impurity concentration which is aligned with the second gate electrode and which is provided in the second semiconductor region and which exhibits the conductivity type opposite to the conductivity type of the first semiconductor region, a second insulation film having a second side wall width selectively formed on a side wall of the second gate electrode on the third region, a fourth region which is aligned with the second insulation film, which is of the same conductivity type as the third region, which exhibits a concentration higher than the third impurity concentration and which partially overlaps the third region, and a metal-semiconductor reaction layer formed on a principal surface of the fourth region.

According to the above-described fourth aspect, higher speed and lower power consumption can be achieved because a metal-semiconductor reaction layer is formed on the surface of each of the second region serving as the contact region of the first MISFET and the fourth region serving as the contact region of the second MISFET to reduce the resistance thereof. Since the fourth region of the second MISFET is formed in alignment with the second insulation film having the second side wall width, an offset length of the third region under the second insulation film is greater than an offset length of the second region under the first insulation film. Therefore, a depletion layer can spread sufficiently in the third region, which makes it possible to provide the second MISFET with a withstand voltage higher than that of the first MISFET.

The term "offset length" represents the distance between an end of a gate electrode in the direction of the channel length and an end of a high concentration region.

(5) According to a fifth aspect of the invention, there is provided the steps of:

forming a pattern of each of a first gate electrode on a principal surface of a first semiconductor with a first gate insulation film interposed therebetween and forming a second gate electrode on a principal surface of a second semiconductor with a second gate insulation film interposed therebetween;

introducing an impurity exhibiting the conductivity type opposite to the conductivity type of the first semiconductor to a region of the first semiconductor principal surface unmasked by the first gate electrode to form a first region having a first impurity concentration aligned with the first gate insulation film;

introducing an impurity exhibiting the second conductivity type opposite to the first conductivity type of the first semiconductor to a region of the second semiconductor principal surface unmasked by the second gate electrode to form a third region having a third impurity concentration aligned with the second gate electrode;

forming an insulation film on each of the first semiconductor principal surface having the first gate electrode formed thereon and the second semiconductor principal surface having the second gate electrode formed thereon;

performing anisotropic etching on the insulation film on the first semiconductor principal surface to leave a first insulation film on a side wall of the first gate electrode;

providing a pattern mask on the insulation film on the second semiconductor principal surface and performing pattern etching of the insulation film with the mask to leave a second insulation film having a side wall width greater than a side wall width of the first insulation film on a side wall of the second gate electrode;

introducing an impurity exhibiting the second conductivity type to a region of the first semiconductor principal surface unmasked by the first insulation film to form a second region having a second impurity concentration higher than the first impurity concentration aligned with the first insulation film and introducing an impurity exhibiting the second conductivity type to a region of the second semiconductor principal surface unmasked by the second insulation film to form a fourth region having a fourth impurity concentration higher than the third impurity concentration aligned with the second insulation film; and forming a metal-semiconductor reaction layer aligned with the first insulation film and a metal-semiconductor reaction layer aligned with the second insulation film on the surfaces of the second and fourth regions, respectively.

According to the fifth aspect, the width of the second region from an end of the second gate electrode to an end of the fourth region can be greater than the width of the first region from an end of the first gate electrode to an end of the second region. As a result, the first MISFET has the device performance (characteristics) of a low withstand voltage MISFET in that it operates at a high speed and it is suitable for driving at a relatively low voltage. Meanwhile, the second MISFET has the device performance (characteristics) of a high withstand voltage MISFET in that it operates at a low speed and it is suitable for driving at a relatively high voltage. Further, since self-aligning formation occurs between the second region and the metal-semiconductor reaction layer on the surface thereof and between the fourth region and the metal-semiconductor reaction layer on the surface thereof as a result of the intervention of the first and second insulation films respectively, the number of masks can be reduced. This makes it possible to reduce the processing cost of a semiconductor integrated circuit device significantly.

(6) According to a sixth aspect of the present invention, there is provided a CMIS semiconductor integrated circuit device comprising:

a first well of a first conductivity type and a second well of a second conductivity type opposite to the first conductivity type which are separated from each other on a single semiconductor body;

a first MISFET having a channel of the second conductivity type formed by a first gate electrode provided on a principal surface of the first well with an insulation film interposed therebetween, a first region of the second conductivity type formed in the first well, a first insulation film provided on a side wall of the first gate electrode on the first region, a second region of the second conductivity type which is aligned with the first insulation film and which is in contact with the first region, and a metal-semiconductor reaction layer aligned with the first insulation film on a principal surface of the second region; and a second MISFET having a channel of the first conductivity type formed by a second gate electrode provided on a principal surface of the second well with an insulation film interposed therebetween, a third region of the first conductivity type formed in the second well, a second insulation film provided on a side wall of the second gate electrode on the third region, a fourth region of the first conductivity type which is aligned with the second insulation film and which is in contact with the third region, and a metal-semiconductor reaction layer aligned with the second insulation film on a principal surface of the fourth region.

According to the sixth aspect, the second region serving as a contact region for the first MISFET (specifically a p-channel MISFET) and the metal-semiconductor reaction layer formed on the surface of the second region are aligned with the first insulation film, and the fourth region serving as a contact region for the second MISFET (specifically an n-channel MISFET) and the metal-semiconductor reaction layer formed on the surface of the fourth region are aligned with the second insulation film. The presence of the metal-semiconductor layers reduces the resistance of the second and fourth regions. The means employed in the present invention for solving typical problems that it confronts and operations of the same have been briefly described above. The solving means according to the invention for achieving the above-described objects will become apparent from preferred embodiments of the invention described below.

BRIEF DESCRIPTION OF THE DRAWINGS

FIG. 6 is a sectional view of the major parts of the semiconductor integrated circuit device at a step of manufacture subsequent to that shown in FIG. 5.

FIG. 7 is a sectional view of the major parts of the semiconductor integrated circuit device at a step of manufacture subsequent to that shown in FIG. 6.

FIG. 10 is a sectional view of the major parts of the semiconductor integrated circuit device at a step of manufacture subsequent to that shown in FIG. 9.

FIG. 11 is a sectional view of the major parts of the semiconductor integrated circuit device at a step of manufacture subsequent to that shown in FIG. 10.

FIG. 12 is a sectional view of the major parts of the semiconductor integrated circuit device at a step of manufacture subsequent to that shown in FIG. 11.

FIG. 13 is a sectional view of the major parts of the semiconductor integrated circuit device at a step of manufacture subsequent to that shown in FIG. 12.

FIG. 14 is a sectional view of the major parts of the semiconductor integrated circuit device at a step of manufacture subsequent to that shown in FIG. 13.

FIG. 15 is a sectional view of the major parts of the semiconductor integrated circuit device at a step of manufacture subsequent to that shown in FIG. 14.

FIG. 18 is a sectional view of the major parts of the semiconductor integrated circuit device at a step of manufacture subsequent to that shown in FIG. 17.

FIG. 19 is a sectional view of the major parts of the semiconductor integrated circuit device at a step of manufacture subsequent to that shown in FIG. 18.

FIG. 20 is a sectional view of the major parts of the semiconductor integrated circuit device at a step of manufacture subsequent to that shown in FIG. 19.

FIG. 21 is a sectional view of the major parts of the semiconductor integrated circuit device at a step of manufacture subsequent to that shown in FIG. 20.

FIG. 22 is a sectional view of the major parts of the semiconductor integrated circuit device at a step of manufacture subsequent to that shown in FIG. 21.

FIG. 23 is a sectional view of the major parts of the semiconductor integrated circuit device at a step of manufacture subsequent to that shown in FIG. 22.

FIG. 24 is a sectional view of the major parts of the semiconductor integrated circuit device at a step of manufacture subsequent to that shown in FIG. 23.

FIG. 25 is a sectional view of the major parts of the semiconductor integrated circuit device at a step of manufacture subsequent to that shown in FIG. 24.

FIG. 40 is a sectional view of major parts of a semiconductor integrated circuit device according to still another embodiment of the invention during a step of manufacture of the same.

FIG. 41 is a sectional view of the major parts of the semiconductor integrated circuit device at a step of manufacture subsequent to that shown in FIG. 40.

FIG. 42 is a sectional view of the major parts of the semiconductor integrated circuit device at a step of manufacture subsequent to that shown in FIG. 41.

FIG. 43 is a sectional view of the major parts of the semiconductor integrated circuit device at a step of manufacture subsequent to that shown in FIG. 42.

FIG. 57 is a sectional view of the major parts of the semiconductor integrated circuit device at a step of manufacture subsequent to that shown in FIG. 56.

FIG. 58 is a sectional view of the major parts of the semiconductor integrated circuit device at a step of manufacture subsequent to that shown in FIG. 57.

FIG. 59 is a sectional view of the major parts of the semiconductor integrated circuit device at a step of manufacture subsequent to that shown in FIG. 58.

FIG. 60 is a sectional view of the major parts of the semiconductor integrated circuit device at a step of manufacture subsequent to that shown in FIG. 59.

DESCRIPTION OF THE PREFERRED EMBODIMENTS

A first embodiment of the invention will now be described.

The first embodiment described here is an application of the invention to a semiconductor integrated circuit device comprising, for example, an 8 Mbit flash memory, a high speed logic circuit and peripheral devices therefore provided in the same semiconductor chip.

Figure 1:
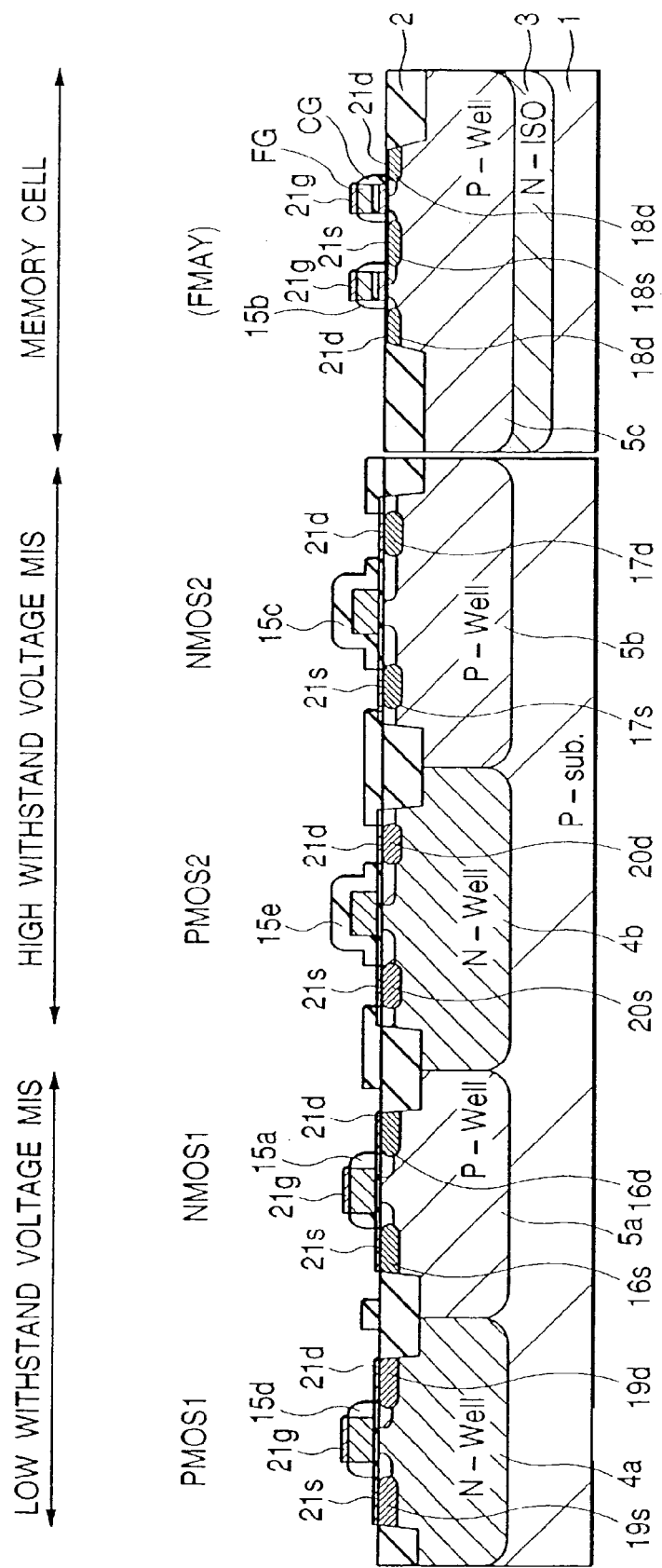
FIG. 1 is a sectional view of a semiconductor integrated circuit device according to an embodiment of the invention.
Figure 2:
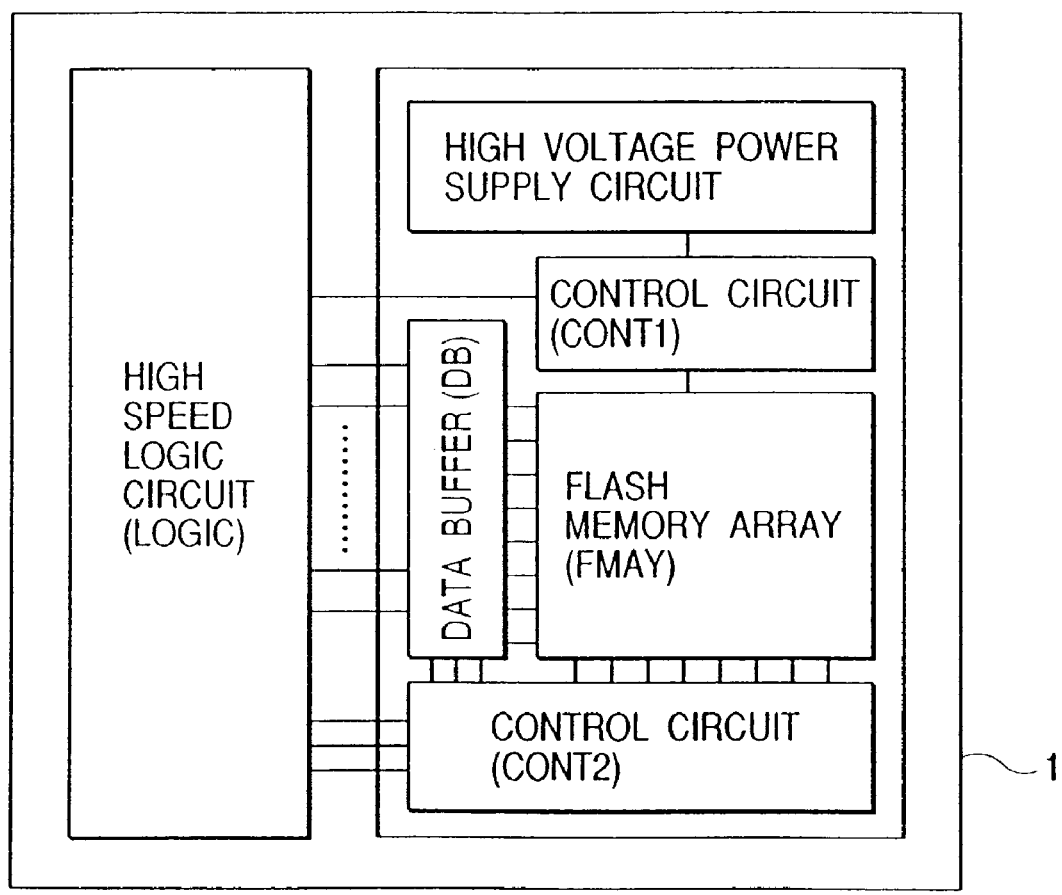
FIG. 2 is a block diagram of the semiconductor integrated circuit device according to the embodiment.

FIG. 1 is a sectional view of a semiconductor integrated circuit device that embodies the technical principal of the invention, i.e., a system on chip in which a flash memory and a logic circuit having a CMIS (complementary metal insulator semiconductor) device configuration mounted on one chip (hereinafter referred to as "system LSI incorporating a flash memory"). FIG. 2 schematically illustrates an example of a block diagram of the system LSI incorporating a flash memory.

A CMIS device comprises a complementary insulated gate field effect transistor which is a combination of a MISFET having a channel of a first conductivity type (n) and a MISFET having a channel of a second conductivity type (p) opposite to the first conductivity type. Such a complementary insulated gate field effect transistor is normally referred to as "CMOS".

Circuit blocks of the system LSI incorporating a flash memory will be first briefly described with reference to FIG. 2.

The system LSI incorporating a flash memory (semiconductor chip 1) comprises a CMOS device as a fundamental device, a high speed logic circuit LOGIC (e.g., a processor) for high speed logic operations, a flash memory array FMAY as a program memory, a data buffer DB provided between the logic circuit LOGIC and the flash memory array FMAY for temporarily storing data of the flash memory array FMAY, a high voltage power supply circuit PC required for writing and erasing, a control circuit CONT1 for writing and erasing data and a control circuit CONT2 for reading data. The flash memory array FMAY allows rewriting of information through electrical writing and erasing, and memory cells of the same may be constituted by a single transistor similarly to an EPROM (erasable PROM). It further has a function of electrically erasing all of the memory cells or a memory cell block (memory block) at one time. The flash memory array FMAY has a plurality of memory blocks representing units which can be erased at one time.

For example, an external power supply voltage of 3.3 V is used for the system LSI incorporating a flash memory. The voltage is reduced by a voltage reduction circuit (e.g., a voltage limiter which is not shown) incorporated in the chip 1 to generate an internal low voltage 1.8 V. The voltage is also boosted by a boosting circuit (not shown) in the high power supply voltage circuit PC to generate an internal high voltage in the range from 10 to 12 V. The above-described circuit blocks are formed by MISFETs having device characteristics in accordance with those power supply voltages being used.

A MISFET driven at the internal voltage of 1.8 V is referred to as "1.8 V-drive MISFET". The external power supply voltage of 3.3 V is also used as an internal low voltage, and a MISFET driven at the voltage of 3.3 V is referred to as "3.3 V-drive MISFET". Further, a MISFET driven at the internal high voltage in the range from 10 to 12 V such as the MISFET forming the high voltage power supply circuit PC is referred to as "12 V-drive MISFET".

MISFETs driven at a relatively low voltage such as a 1.8 V-drive MISFET and a 3.3 V-drive MISFET have a fine device structure for higher speeds. Therefore, such a MISFET has a low gate withstand voltage. Such a MISFET is hereinafter referred to as "low withstand voltage MISFET (low withstand voltage MIS)".

MISFETs driven at a relatively high voltage such as a 12 V-drive MISFET have a high gate withstand voltage. Such a MISFET is hereinafter referred to as "high withstand voltage MISFET (high withstand voltage MIS)".

A description will now be made with reference to FIG. 1 concerning a system LSI incorporating a flash memory according to the invention designed for reduced power consumption and low cost. FIG. 1 is a sectional view of major parts showing sectional structures of MISFETs in a low withstand voltage MISFET portion, a high withstand voltage MISFET portion and a memory cell portion.

Referring to FIG. 1, in a low withstand voltage MISFET portion on a principal surface of a single p-type semiconductor body 1 (p-type silicon substrate), there is selectively formed an n-well (N-Well) 4a of a conductivity type opposite to that of the substrate and a p-well (P-Well) 5a of the same conductivity type as the substrate. An n-well 4b and a p-well 5b are selectively formed in a high withstand voltage MISFET portion. A p-well 5c is selectively formed in a memory cell portion FMAY with an embedded n-well (N-ISO) 3 interposed. A device isolating region (shallow groove isolating region) 2 are selectively formed on the surface of each well to define an active region (a region where a MISFET is formed). The shallow groove isolating regions 2 is formed by embedding silicon oxide films in grooves formed on the substrate 1, and the surfaces of the regions are planarized such that they are substantially flush with the surfaces of the respective wells.

In the low withstand voltage MISFET portion, a p-channel MISFET (PMOS1) and an n-channel MISFET (NMOS1) are formed in the n-well 4a and p-well 5a, respectively. Each of the p-channel MISFET PMOS1 and n-channel MISFET NMOS1 constitutes a 1.8 V-drive MISFET. Their source and drain regions have an LDD structure formed by a low impurity concentration region and a high impurity concentration region to suppress short channel effects. Metal-semiconductor reaction layers 21s, 21d and 21g are respectively formed on the surfaces of the source and drain regions and the gate electrode of the p-channel MISFET PMOS1 and n-channel MISFET NMOS1 in order to reduce the resistance. A salicide structure is employed for those metal-semiconductor layers as will be detailed later.

In the high withstand voltage MISFET portion, a p-channel MISFET (PMOS2) and an n-channel MISFET (NMOS2) are formed in the n-well 4b and p-well 5b, respectively. Each of the p-channel MISFET PMOS2 and n-channel MISFET NMOS2 constitutes a 12 V-drive MISFET. Their source and drain regions also have an LDD structure formed by a low impurity concentration region and a high impurity concentration region. Metal-semiconductor reaction layers 21s and 21d and are respectively formed on the surfaces of the source and drain regions and the gate electrode of the p-channel MISFET PMOS1 and n-channel MISFET NMOS1 in order to reduce the resistance.

In the memory cell portion, a plurality of memory cells are formed in the p-well 5c. Each of the memory cells comprises a gate electrode formed by a floating electrode FG and a control electrode CG provided on the floating electrode FG with a layer insulation film interposed therebetween and source and drain regions having an LDD structure. Metal-semiconductor reaction layers 21s and 21d are formed on the surfaces of the source and drain regions respectively, and a metal-semiconductor reaction layer 21g is formed on the surface of the control electrode CG. For example, a NOR type flash memory cell array is formed by those memory cells. The p-well is separated from the substrate (P-sub) by the embedded n-well (N-ISO) and an independent substrate bias is applied thereto.

Figure 3:
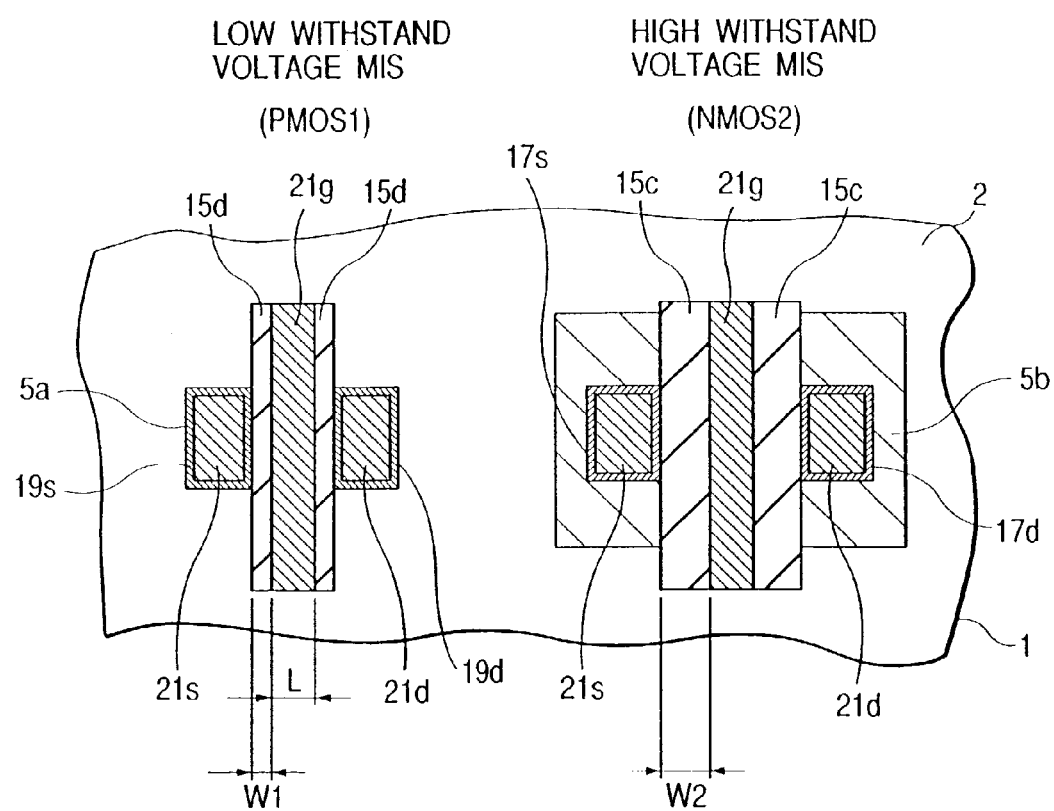
FIG. 3 is a plan view of major parts of the semiconductor integrated circuit device according to the embodiment.

According to the first embodiment, high concentration regions (wiring contact regions) 19s, 19d, 16s and 16d of the source and drain regions of the low withstand voltage MIS (PMOS1 and NMOS1) and the metal-semiconductor reaction layers 21s and 21d are aligned with ends of first insulation films (so-called side wall films or side wall spacers) 15d and 15a formed using anisotropic etching on side walls of respective gate electrodes 9a and 9b. That is, as shown in FIG. 3, the MISFET of the low withstand voltage MISFET portion has a pattern configuration in which the wiring contact regions 19s and 19d match the metal-semiconductor layers 21s and 21d, which provides a device structure in which the resistance of the principal surfaces of the wiring contact regions as a whole is reduced.

The low withstand voltage MISFET primarily constitutes a high speed logic circuit. Therefore, in order to allow the logic circuit to operate at a high speed, a salicide layer is formed on the gate electrode (wiring) 21g of the low voltage MIS to reduce the resistance.

The high withstand, voltage MISFETs PMOS2 and NMOS2 have a device structure in which the above-described problem with an offset MIS is solved. Specifically, high concentration regions (wiring contact regions) 20s, 20d, 17s and 17d and the metal-semiconductor layers 21s and 21d in the source and drain regions are aligned with ends of second insulation films 15e and 15c formed using a mask pattern. As shown in FIG. 3, the second insulation films 15e and 15c are formed with a pattern width W2 which is greater than a pattern width W1 of the first insulation film in the direction of the gate length L. A comparison between offset lengths of the regions having a low impurity concentration of the low withstand voltage MISFET PMOS1 and the high withstand voltage MISFET NMOS2 reveals a relationship expressed by NMOS2 offset length (OFF2)>PMOS1 offset length (OFF1). Thus, electrical fields at the drain end are moderated because a depletion layer sufficiently spreads in the low impurity concentration region of the high withstand voltage MISFET. This reduces the possibility of the avalanche phenomenon to improve the drain withstand voltage. The metal-semiconductor reaction layers 21s and 21d for reducing resistance are aligned with the concentration regions (wiring contact regions) 17s and 17d by the second insulation film 15c. Thus, no increase of junction leakage occurs because the metal-semiconductor reaction layers are formed in the low impurity concentration region.

No salicide layer is formed on the gate electrode 21g of the high withstand voltage MISFET. The reason for this will be understood from the method of manufacture described below. The ratio which the high withstand voltage MISFETs occupy in the system LSI is much smaller than that of the low withstand voltage MISFETs. Specifically, the high withstand voltage MISFETs are used only for part of the power supply circuit and the control circuit for writing and erasing. In addition, the high withstand voltage MISFETs are not required to operate as fast as the low withstand voltage MISFETs. Therefore, there is no need for providing a salicide layer on the surface of the gate electrodes of the high withstand voltage MISFETs.

A description will now be made with reference to FIGS. 4 through 31 of a method of manufacturing the system LSI incorporating a flash memory according to the first embodiment.

(Step for Forming Device Isolation)

Figure 4:
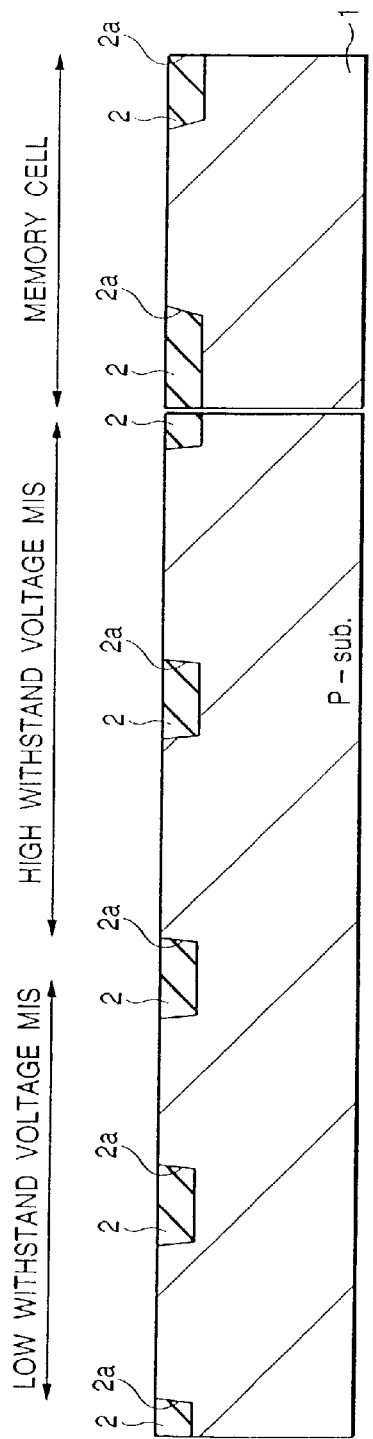
FIG. 4 is a sectional view of major parts of the semiconductor integrated circuit device according to the embodiment at a step of manufacture of the same.

FIG. 4 shows a step at which shallow groove isolating regions 2 have been formed on the semiconductor body (P-sub) 1. Although not shown, a manufacturing process for forming the shallow groove isolating regions is as follows.

The semiconductor body 1 constituted by p-type silicon (Si) single crystal having resistivity of 10 Ωcm is provided. A pad film constituted by a silicon oxide film having a thickness, for example, in the range of 10 to 30 nm is formed on the principal surface of the semiconductor body 1 using thermal oxidation. Subsequently, chemical vapor deposition (CVD) is performed to deposit a silicon nitride film having a thickness in the range from about 100 to 200 nm on the pad film. The pad film is a buffer film for preventing crystal defects of the insulation film constituted by a silicon nitride film (groove forming mask) which can be left on the surface of the film due to thermal distortion when it is deposited directly on the silicon principal surface.

Next, a photoresist mask having openings in areas corresponding to the device isolating regions is formed on the nitride film using photolithography. The silicon nitride film, pad film and semiconductor body are sequentially etched in the areas corresponding to the device isolating regions using the photoresist mask as an etching mask to form grooves 2a having a depth in the range from about 350 to 400 nm on the semiconductor body 1 (FIG. 4).

For example, $CF_4+CHF_3+Ar$ or $CF_4+Ar$ is used as a gas for dry etching of the silicon nitride film. $HBr+Cl_2+He+O_2$ is used as a gas for dry etching of the semiconductor body 1.

Next, CVD is performed to deposit a silicon oxide film having a thickness of, for example, 400 nm on the principal surface of the semiconductor body 1 including the surfaces of the grooves after removing the photoresist mask, and planarization is thereafter performed using CMP (chemical mechanical polishing) to leave the silicon oxide film only in the grooves 2a, thereby forming device isolating regions 2. Thereafter, a heating process at about 1000° C. is performed to densify the silicon oxide film embedded in the grooves 2a. Wet etching is then performed using hot phosphoric acid to leave the silicon nitride film left on the semiconductor body 1. This provides the device isolating regions 2 having a thickness in the range from 350 to 400 nm embedded in the semiconductor body 1. The pad film may be left as it is to prevent contamination of the surface of the semiconductor body 1. The pad film may be removed using wet etching, and thermal oxidation may be performed again to form a clean silicon oxide film on the surface of the semiconductor body 1. This silicon oxide film acts as a protective film for reducing ion damage caused by ion implantation at a subsequent well forming step.

(Step for Forming Wells)

Figure 5:
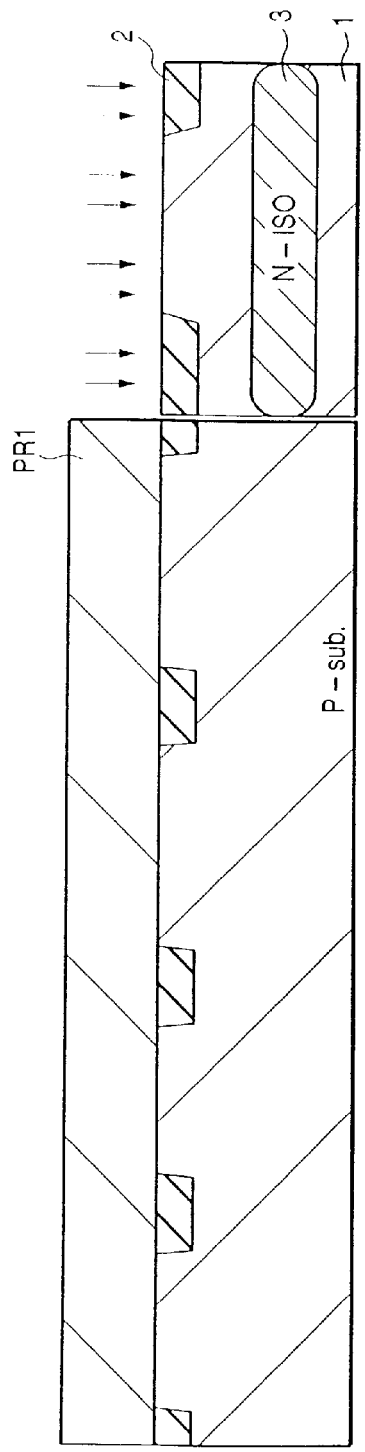
FIG. 5 is a sectional view of the major parts of the semiconductor integrated circuit device at a step of manufacture subsequent to that shown in FIG. 4.

Each of FIGS. 5 through 7 illustrates introduction of an impurity using an ion implantation technique for forming wells.

As shown in FIG. 5, an embedded n-well (N-ISO) 3 is formed at the memory cell portion on the principal surface of the semiconductor body 1 to isolate a p-well where a memory cell array is formed from the p-type semiconductor body 1.

A photoresist pattern PR1 with a thickness on the order of 5 μm having an opening in a region corresponding to the memory cell portion is formed on the principal surface of the semiconductor body 1 using photolithography. To form the embedded n-well (N-ISO) 3, ions having a high energy are selectively implanted in the semiconductor body 1 using the photoresist pattern PR1 as a mask. Specifically, phosphorus ions which are an n-type impurity are implanted in a deep position in the semiconductor body 1 with an acceleration energy at 2300 KeV and in a dose of $1\times10^{13}$ atoms/cm² using the photoresist pattern PR1 (and a part of the device isolating region 2) as a mask. Thereafter, a thermal process (annealing) for stretching diffusion is performed to form the embedded n-well 3 such that the impurity concentration peaks at a depth in the range from 2 to 3 μm from the principal surface of the semiconductor body 1.

Next, after removing the photoresist pattern (mask) PR1, as shown in FIG. 6, ion implantation is carried out to form n-wells (N-Well) 4a and 4b in regions of the principal surface of the semiconductor body 1 where the low withstand voltage MISFET PMOS1 of the low withstand voltage MIS portion and the high withstand voltage MISFET PMOS2 of the high withstand voltage MIS portion are formed respectively.

Phosphorus ions which are an n-type impurity are implanted using a photoresist pattern PR2 as a mask in three steps under different sets of conditions, e.g., an acceleration energy at 1300 KeV and a dose of $1\times10^{13}$ atoms/cm², an acceleration energy at 600 KeV and a dose of $5\times10^{12}$ atoms/cm² and an acceleration energy at 200 KeV and a dose of $5\times10^{11}$ atoms/cm². Further, boron difluoride ($BF_2$) ions which are a p-type impurity are implanted, for example, with an acceleration energy at 70 KeV and a dose of $2\times10^{12}$ atoms/cm².

The purpose of the stepwise phosphorus ion implantation is to achieve a uniform well concentration distribution in the direction of the depth to thereby eliminate the need for a thermal process (high temperature annealing) for stretched diffusion. The BF2 ion implantation is carried out to set a threshold voltage for the p-channel MISFET.

Next, after removing the photoresist pattern (mask) PR2, as shown in FIG. 7, ion implantation is carried out to respectively form p-wells (P-Well) 5a, 5b and 5c in regions where the low withstand voltage MISFET NMOS1 of the low withstand voltage MIS portion and the high withstand voltage MISFET NMOS2 of the high withstand voltage MIS portion are to be formed and in the memory cell portion.

Boron ions which are a p-type impurity are implanted using a photoresist pattern PR3 as a mask in three steps under different sets of conditions, e.g., an acceleration energy at 450 KeV and a dose of $1\times10^{13}$ atoms/cm², an acceleration energy at 200 KeV and a dose of $3\times10^{12}$ atoms/cm² and an acceleration energy at 50 KeV and a dose of $1.2\times10^{12}$ atoms/cm². The stepwise ion implantation is carried out for the same reason as for the formation of the n-wells.

After the ion implantation for forming the n-wells and p-wells, a thermal process at about 950° C. (well annealing) is carried out for stretched diffusion of phosphorus and boron to complete the wells.

(Step of Forming Gate Insulation Film at Memory Cell Portion)

Figure 8:
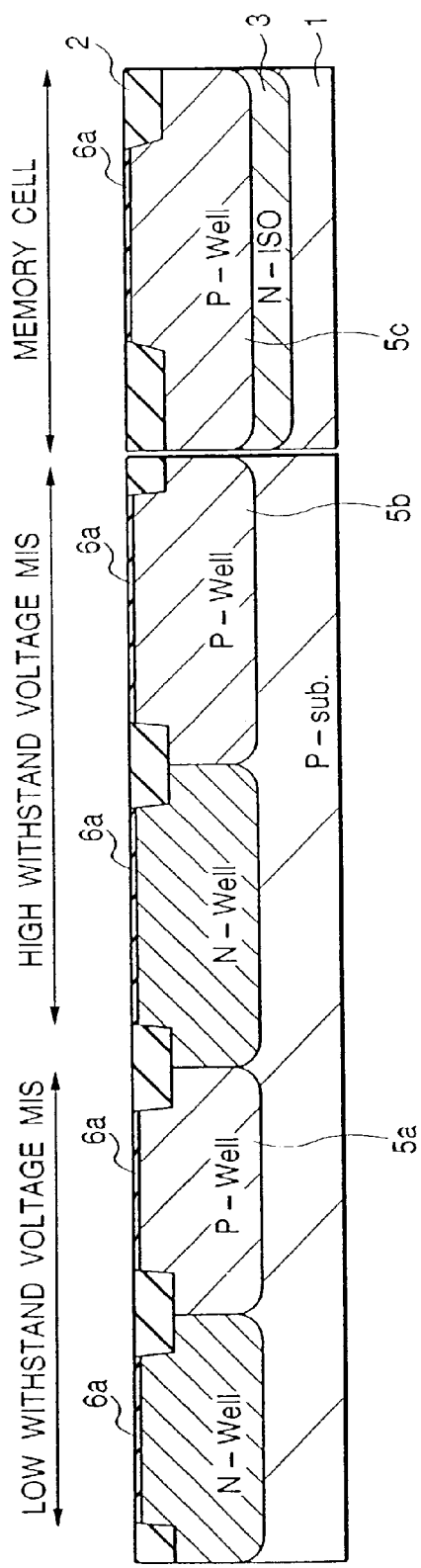
FIG. 8 is a sectional view of the major parts of the semiconductor integrated circuit device at a step of manufacture subsequent to that shown in FIG. 7.

As shown in FIG. 8, a gate insulation film (tunnel oxide film) 6a for the flash memory is formed on the principal surface of the semiconductor body 1.

For example, the principal surface of the semiconductor body 1 is cleaned using a HF (hydrofluoric acid) type cleaning solvent to clean up the surface of each well, and thermal oxidation is carried out in a wet atmosphere at about 800° C. to form a tunnel oxide film ($SiO_2$) 6 having a thickness of about 10 nm on the surface of each well.

(Step of Forming Gate Electrode at Memory Cell Portion)

Figure 9:
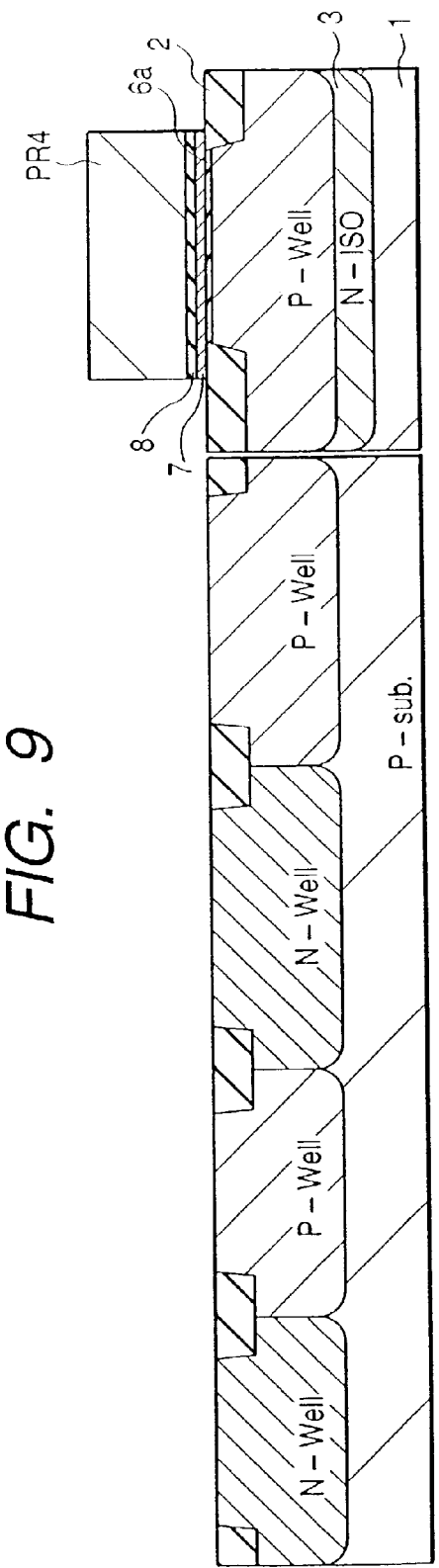
FIG. 9 is a sectional view of the major parts of the semiconductor integrated circuit device at a step of manufacture subsequent to that shown in FIG. 8.

FIG. 9 shows a structure of a floating electrode 6b formed in a pattern that defines the memory cell in the direction of the gate width. The floating electrode CG does not represent a final pattern of the floating electrode.

First, a polycrystalline silicon layer 7 including an impurity (e.g., phosphorus) to reduce resistance is formed on the entire principal surface of the semiconductor body 1 having the tunnel oxide film 6a thereon to a thickness of about 70 nm using CVD (chemical vapor deposition).

Subsequently, a silicon oxide film 8 ($SiO_2$) is formed as a layer insulation film 8 on the surface of the polycrystalline silicon layer 7 using CVD. The thickness of the layer insulation film 8 is 50 nm which is substantially five times the thickness of the tunnel oxide film and which is determined taking the ratio of the capacitive coupling of the same to the tunnel oxide film. An oxinitride film (specifically, an ONO multi-layer film) is used as the layer insulation film to improve the device characteristics of the flash memory, especially, the dielectric constant.

Next, etching is performed to remove the layer insulation film 8, polycrystalline silicon layer 7 and tunnel oxide film 6a sequentially using a photoresist pattern PR4 as a mask, thereby exposing the surface of each of the wells in the high withstand voltage MIS portion and the low withstand voltage MIS portion.

(Step of Forming Gate Insulation Film of High Withstand Voltage MISFET)

A gate insulation film for the high withstand voltage MISFETs which must be thick is formed prior to the formation of a gate insulation film for the low withstand voltage MISFETs.

As shown in FIG. 10, a gate insulation film 6b for the MISFETs in the high withstand voltage MIS portion is formed on the principal surface of the semiconductor body 1.

The gate insulation film 6b is constituted by a silicon oxide film and is formed on the surfaces of the wells 4a, 4b, 5a and 5b of the high withstand voltage MIS portion and low withstand voltage MIS portion using thermal oxidation. While the thickness of the gate insulation film 6b is on the order of 15 to 16 nm, this thickness is not the final thickness of the gate insulation film.

(Step of Forming Gate Insulation Film of Low Withstand Voltage MISFET)

After annealing the gate insulation film at about 950° C. for 20 minutes, as shown in FIG. 11, the gate insulation film 6b is selectively removed with a HF type etchant using a photoresist pattern PR5 as a mask to expose the surfaces of the wells 4a and 5a in the low withstand voltage MIS portion.

After removing the photoresist pattern PR5, as shown in FIG. 12, a gate insulation film 6c for the MISFETs in the low withstand voltage MIS portion is formed. The gate insulation film 6c is constituted by a silicon oxide film having a thickness in the range from about 4.5 to 5 nm and is formed by thermally oxidizing the exposed surfaces of the wells 4a and 5a. During the formation of the gate insulation film 6c, the gate insulation film 6b on the wells 4b and 5b in the high withstand voltage MIS portion is re-oxidized to form a thermally oxidized film (thermal $SiO_2$ film) having a thickness of about 18 nm. Such a thermally oxidized film provides a sufficient gate withstand voltage.

(Step of Forming Gate Insulation Film of Memory Cell, High Withstand Voltage MISFET and Low Withstand Voltage MISFET)

As shown in FIG. 13, a conductive layer 9 for gate electrodes is deposited on the entire principal surface of the semiconductor body 1 with the gate insulation films formed thereon. The conductive layer 9 is constituted by a polycrystalline silicon and is formed using CVD. The thickness of the conductive layer 9 is on the order of 250 nm.

Subsequently, a cap layer 100 made of $SiO_2$ is formed using CVD on the surface of the conductive layer 9 in order to protect the conductive layer 9 against damage during etching. The thickness of the cap layer is on the order of 50 nm.

Next, as shown in FIG. 14, the cap layer 100 is removed from the low withstand voltage MIS portion and high withstand voltage MIS portion using a photoresist pattern PR6 as a mask.

Subsequently, after removing the photoresist pattern (mask) PR5 as shown in FIG. 15, a cap layer having a thickness of 50 nm made of $SiO_2$ is formed using CVD again on the entire principal surface of the semiconductor body 1 (low withstand voltage MIS portion, high withstand voltage MIS portion and memory cell portion). This provides a cap layer 100a with a thickness of 50 nm on the conductive layer 9 in the low withstand voltage MIS portion and high withstand voltage MIS portion and a cap layer 100b with a thickness of 100 nm on the semiconductor layer 9 in the memory cell portion. The reason for the different thicknesses of the cap layer will be detailed in the following description of a step of patterning the gate electrodes.

The conductive layer 9 is then selectively removed to pattern the gate electrodes of the high withstand voltage MISFETs and the low withstand voltage MISFETs.

Figure 16:
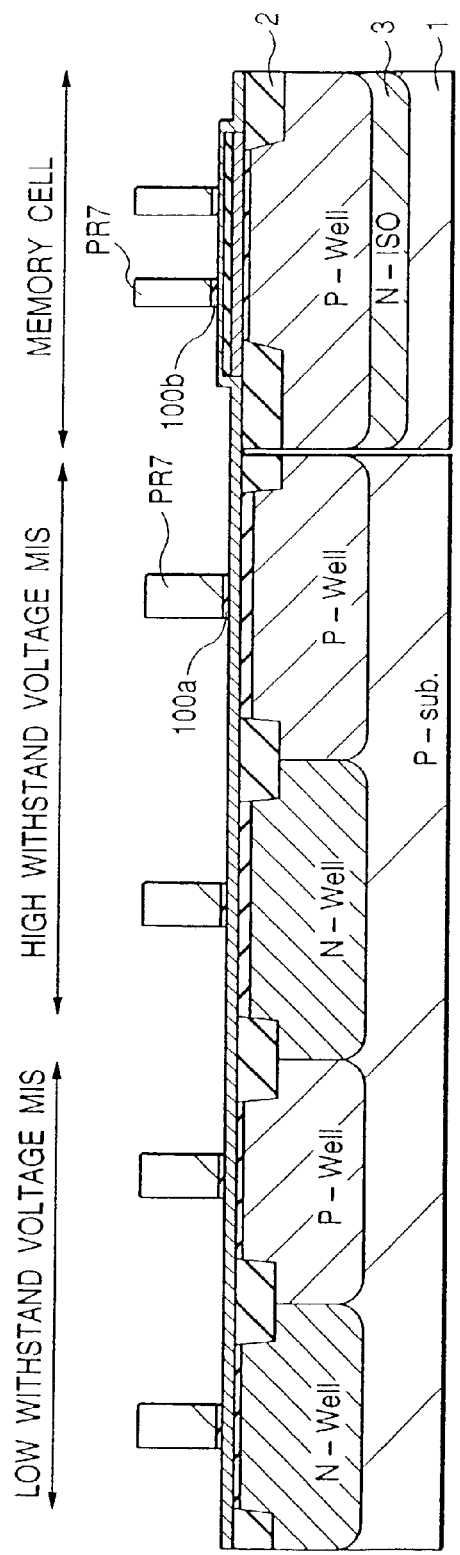
FIG. 16 is a sectional view of the major parts of the semiconductor integrated circuit device at a step of manufacture subsequent to that shown in FIG. 15.

As shown in FIG. 16, the cap layers 100a and 100b are first selectively removed using a photoresist pattern PR7 as a mask.

Figure 17:
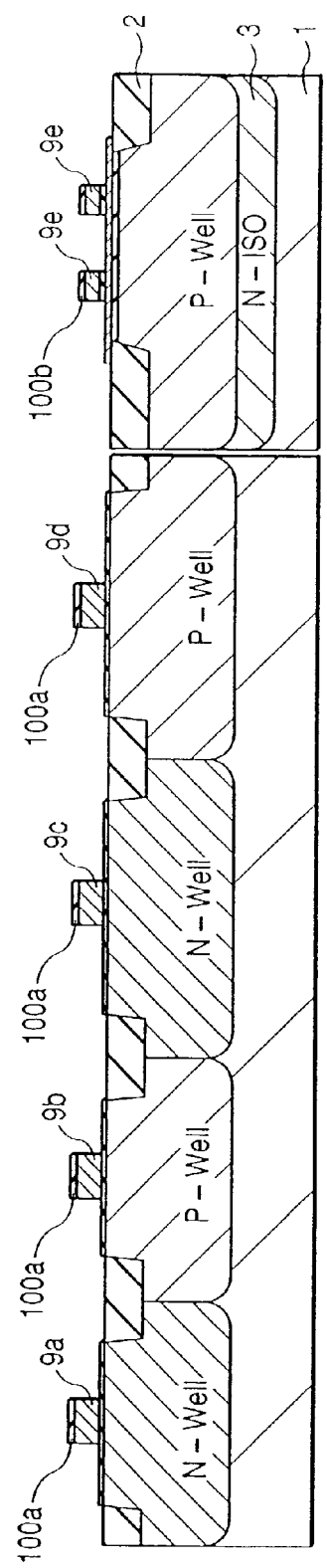
FIG. 17 is a sectional view of the major parts of the semiconductor integrated circuit device at a step of manufacture subsequent to that shown in FIG. 16.

Next, after removing the photoresist pattern (mask) PR7, as shown in FIG. 17, the polycrystalline silicon layer 9 is selectively etched (dry etching) with a chloric gas using the cap layers 100a and 100b as a mask to pattern gate electrodes 9a, 9b, 9c and 9d of the low withstand voltage MISFETs and high withstand voltage MISFET and control gates 9e of the memory cells. During this etching process, the cap layers 100a and 100b are also etched. While FIG. 17 shows the cap layers 100a and 100b as having substantially the same thickness, the thicknesses of the cap layers 100a and 100b at this point in time are about 20 nm and 70 nm, respectively.

The reason for using the cap layers as a mask for patterning the gate electrodes is as follows. When the gate electrodes are patterned with a chloric using a photoresist as a mask, a reaction product is gradually deposited on side walls of the photoresist during the process. The reaction product acts as a mask and, as a result, the gate electrodes are patterned with a tapered pattern width that is greater at the top of the pattern than the bottom. This makes it impossible to provide MISFETs having desired channel lengths. That is, a problem has arisen in that it is difficult to conduct fine patterning of gates. In order to solve this problem, the photoresist pattern (mask) PR7 is removed, and the gate electrodes are patterned using the cap layers 100a and 100b as a mask.

Next, as shown in FIG. 18, the floating electrodes 7 are patterned using a photoresist pattern PR8 having an opening in the region corresponding to the memory cell portion as a mask.

First, etching is performed to remove the layer insulation film 8 in the memory cell portion. At this time, the cap layer 100b is also etched leaving a residual film having a thickness of 20 nm. Therefore, it has a thickness which is the same or substantially the same as the thickness of the cap layer 100a covered with the mask PR8. As will be described later, this facilitates the etching of the cap layers 100a and 100b. The purpose of making the cap layer 100b thicker than the cap layer 100a is to provide the cap layers 100a and 100b with similar thicknesses at this stage.

Thereafter, the floating electrodes 7 are selectively etched such that they are defined by the control gate electrodes 9e. As a result, as shown in FIG. 18, the floating electrodes 7 are patterned in agreement with the control gate electrodes 9e in the direction of the gate length.

(Step of Forming NMOS LDD Portions)

After removing the photoresist pattern (mask) PR8, as shown in FIG. 19, semiconductor regions having a low impurity concentration (LDD portions 10s, 10d, 11s, 11d, 12s and 12d) are formed in the NMOS-forming regions of the low withstand voltage MIS portion and high withstand voltage MIS portion and the memory cell portion.

A photoresist pattern (mask) PR9 having openings in regions corresponding to the NMOS forming regions of the low withstand voltage MIS portion and high withstand voltage MIS portion and the memory cell portion is first formed on the semiconductor body 1.

Ion implantation is subsequently performed to introduce arsenic (As) as an n-type impurity into the p-well 5a to be defined by the gate electrode 9b, into the p-well 5b to be defined by the gate electrode 9d and into the p-well 5c to be defined by the gate electrode 9e. The ion implantation is carried out with an acceleration energy at 20 KeV and in a dose on the order of $1\times10^{14}$ atoms/cm$^2$.

(Step of Forming PMOS LDD Portions)

After removing the photoresist pattern (mask) PR9, as shown in FIG. 20, semiconductor regions having a low impurity concentration (LDD portions 13s, 13d, 14s and 14d) are formed in the PMOS-forming regions of the low withstand voltage MIS portion and high withstand voltage MIS portion and the memory cell portion.

A photoresist pattern (mask) PR9 having openings in regions corresponding to the PMOS forming regions of the low withstand voltage MIS portion and high withstand voltage MIS portion is first formed.

Ion implantation is subsequently performed to introduce boron (B) as an n-type impurity into the n-well 4a to be defined by the gate electrode 9a and into the n-well 4b to be defined by the gate electrode 9c. For example, the ion implantation is carried out with an acceleration energy in the range from 10 to 20 KeV and in a dose on the order of $1\times10^{14}$ atoms/cm$^2$. Boron is also introduced into each of the gate electrodes 9a and 9c during the ion implantation.

Subsequently, an annealing process is carried out to spread and diffuse the impurity to form the semiconductor regions (LDD portions) having a low impurity concentration of the NMOSS and PMOSs.

(Step of Forming Insulation Film)

After removing the photoresist pattern (mask) PR10, as shown in FIG. 21, an insulation film 15 is formed which serves as a mask to define regions having a high impurity concentration for respective MISFETs on the principal surfaces of the low withstand voltage MIS portion, high withstand voltage MIS portion and memory cell portion where the LDD portions have been formed. The insulation film 15 is constituted by a silicon nitride film formed using a plasma process. The insulation film 15 is not limited to a silicon nitride film, and it may be a SiO$_2$ film obtained using CVD. It has a thickness on the order of 100 nm.

(Step of Forming NMOS High Concentration Region)

As shown in FIG. 22, the silicon nitride film 15 is selectively removed through anisotropic etching using a photoresist pattern PR11 as a mask (hereinafter referred to as "first mask").

An opening on the first mask PR11 in the NMOS-forming region of the low withstand voltage MIS portion is configured in an opening pattern in which the ends of opening are located above the device isolating regions 2 with some margin. The ends of openings of the first mask PR 11 in the NMOS-forming region of the high withstand voltage MIS portion are offset from the device isolating regions 2 and the ends of gate electrode 9d in order to provide a high withstand voltage MISFET (NMOS2) having an offset structure as shown in FIG. 3.

Anisotropic etching is carried out on the silicon nitride film 15 using the first mask PR11. As a result, the film is removed from the top of the gate electrodes 9b and 9e, and side wall films 15a and 15b (first gate insulation films) are left on the side walls of the gate electrodes 9b and 9e. The silicon nitride film 15 is selectively etched on the side walls of the gate electrode 9d with the first mask PR11 to form patterns of silicon nitride films 15c (second insulation films).

Next, as shown in FIG. 23, ion implantation is carried out to introduce an n-type impurity, i.e., arsenic (As) into the p-wells 5a, 5b and 5c such that the impurity is defined by the silicon nitride films 15a and 15b (first insulation films) and the silicon nitride films 15c (second insulation films), respectively. For example, the ion implantation is carried out with an acceleration energy at 60 KeV and in a dose of $3\times10^{15}$ atoms/cm$^2$. As a result of the ion implantation, the impurity is introduced also into each of the gate electrodes 9b and 9e. That is, n-gate (gate electrode of the n-type conductivity) PMOS5 are provided.

(Step of Forming PMOS High Concentration Region)

After removing the first mask PR11, as shown in FIG. 24, the silicon nitride film 15 is selectively removed through anisotropic etching using a photoresist pattern PR12 as a mask (hereinafter referred to as "second mask").

An opening on the second mask PR12 in the PMOS-forming region of the low withstand voltage MIS portion is configured in an opening pattern in which the ends of opening are located above the device isolating regions 2 with some margin. The ends of openings of the second mask PR12 in the NMOS-forming region of the high withstand voltage MIS portion are offset from the device isolating regions 2 and the ends of gate electrode 9a in order to provide a high withstand voltage MISFET (NMOS2) having an offset structure as shown in FIG. 3.

Anisotropic etching is carried out on the silicon nitride film 15 using the second mask PR11.

As a result, the film is removed from the top of the gate electrode 9a, and side wall films 15d (third gate insulation films) are left on the side walls of the gate electrode 9a. The silicon nitride film 15 is selectively etched on the side walls of the gate electrode 9c with the second mask PR12 (mask pattern) to form patterns of silicon nitride films 15e (fourth insulation film).

Next, as shown in FIG. 25, ion implantation is carried out to introduce a p-type impurity, i.e., boron (B) into the n-wells 4a and 4b such that the impurity is defined by the silicon nitride films 15d (third insulation films) and the silicon nitride films 15e (fourth insulation films), respectively. For example, the ion implantation is carried out with an acceleration energy at 10 KeV and in a dose of $3\times10^{15}$ atoms/cm$^2$. As a result of the ion implantation, the impurity is introduced also into the gate electrode 9a. That is, a p-gate (gate electrode of the p-type conductivity) PMOS is provided.

(Step of Forming Silicide Layer)

Figure 26:
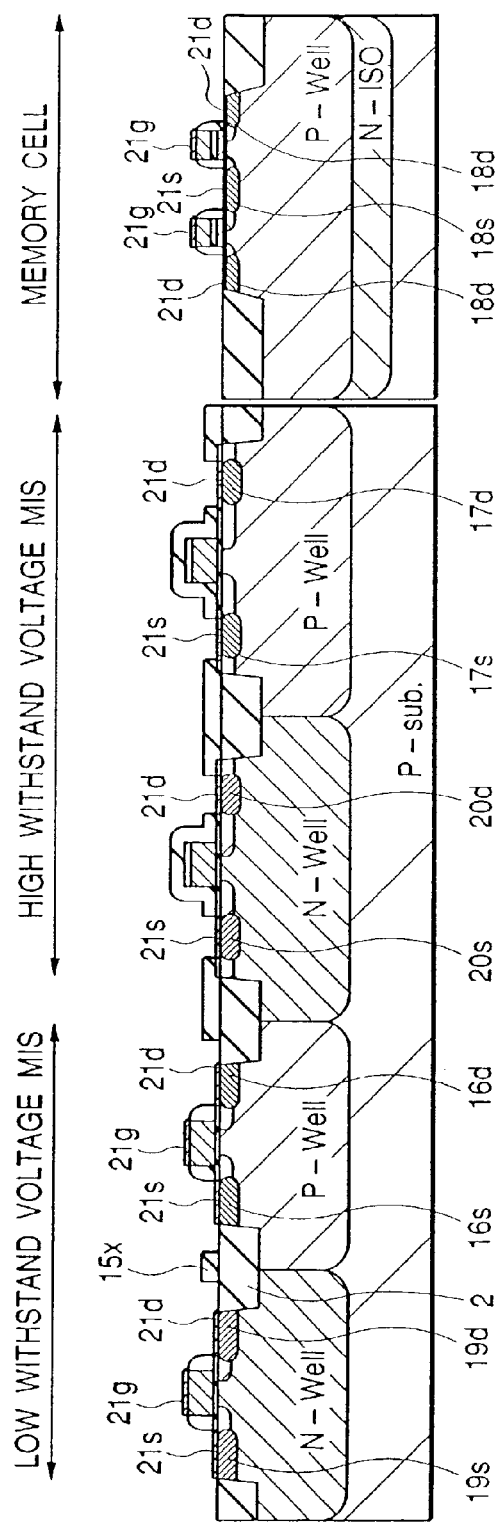
FIG. 26 is a sectional view of the major parts of the semiconductor integrated circuit device at a step of manufacture subsequent to that shown in FIG. 25.

Metal-semiconductor reaction layers 21s, 21d and 21g are formed as shown in FIG. 26.

Subsequently, a metal suitable for silicidation to reduce resistance (a refractory metal) is deposited on the principal surface of the semiconductor body 1. Cobalt (Co) is used as such a metal and is deposited to a thickness in the range from about 7 to 10 nm using sputtering. Titanium (Ti) may be used instead of cobalt. A study carried out by the inventors has revealed that cobalt is preferred to titanium in reducing resistance and achieving fineness. This is because cobalt results in a thin wire effect that is less significant compared to titanium. The thin wire effect is an increase in resistance that occurs as a result of a decrease in gate processing dimensions or wire processing dimensions.

The deposited cobalt is subjected to an annealing process at 500° C. for about one minute in a nitrogen atmosphere. This process silicidizes the surfaces of the gate electrodes 9a, 9b and 9e and the high concentration regions 19s, 19d, 16s, 16d, 20s, 20d, 17s, 17d, 18s and 18d. After etching to remove unreacted cobalt on the silicon nitride film 15 and the device isolating regions 2, another annealing process is carried out at 700° C. for about one minute in a nitrogen atmosphere. As a result, metal-semiconductor layers made of cobalt silicide ($CoSi_2$) are formed. The cobalt suicide layers 21s, 21d and 21g are formed only on the surfaces of the exposed semiconductors (gate electrodes and high concentration regions) on a self-alignment basis. Specifically, the salicide layers (cobalt suicide layers 21s, 21d and 21g) are formed in the high concentration regions aligned with the side walls (first and third insulation films) 15a and 15d in the low withstand voltage MIS portion. The salicide layers (cobalt silicide layers 21s, 21d and 21g ) are formed in the high concentration regions aligned with the insulation films 15c and 15e (second and fourth insulation films) formed using a mask pattern in the high withstand voltage MIS portion. That is, the salicide layers are formed on the entire surfaces of the high concentration regions (wiring contact regions) and are not formed in the low concentration regions (LDD portions).

Referring to FIG. 26, a silicon nitride film 15x remains after etching on the device isolating region 2 located at the boundary between the n-well 4a and p-well 5a. It is provided by forming the first and second masks in misalignment with each other to provide a layout in which two resist patterns are sufficiently overlapped at the boundary between them such that the silicon nitride film 15x having a width of about 0.5 μm always remains on the field. The purpose is to prevent the silicon nitride film 15x at the boundary from becoming a thin strip that can come off.

(Step of Forming Contacts)

Figure 27:
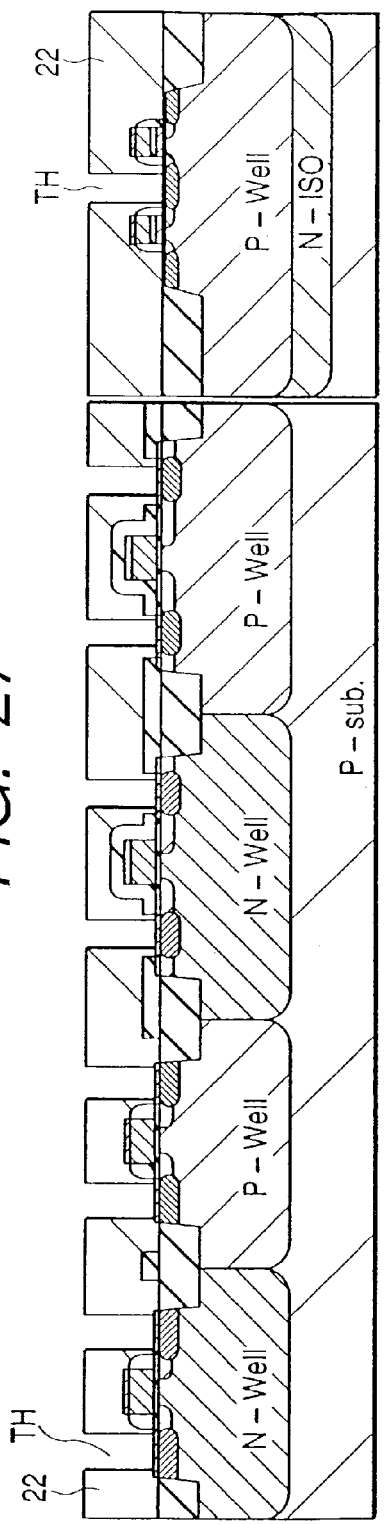
FIG. 27 is a sectional view of the major parts of the semiconductor integrated circuit device at a step of manufacture subsequent to that shown in FIG. 26.

As shown in FIG. 27, contact holes TH are formed after forming a layer insulation film 22.

First, CVD is carried out to deposit a silicon oxide film 22 as a layer insulation film on the principal surface of the semiconductor body 1 which has been silicidized, and CMP is then used to planarize the surface of the silicon oxide film 22. The thickness of the silicon oxide film 22 is appropriately set taking the planarization using CMP into consideration.

Subsequently, contact holes TH are formed to expose the surface of the salicide layers (cobalt silicide layers 21s and 21d) formed on the surface of the high concentration regions. The contact holes TH are formed using a well known technique that utilizes a photoresist pattern as a mask.

(Step of Forming First Wiring Layer)

Figure 28:
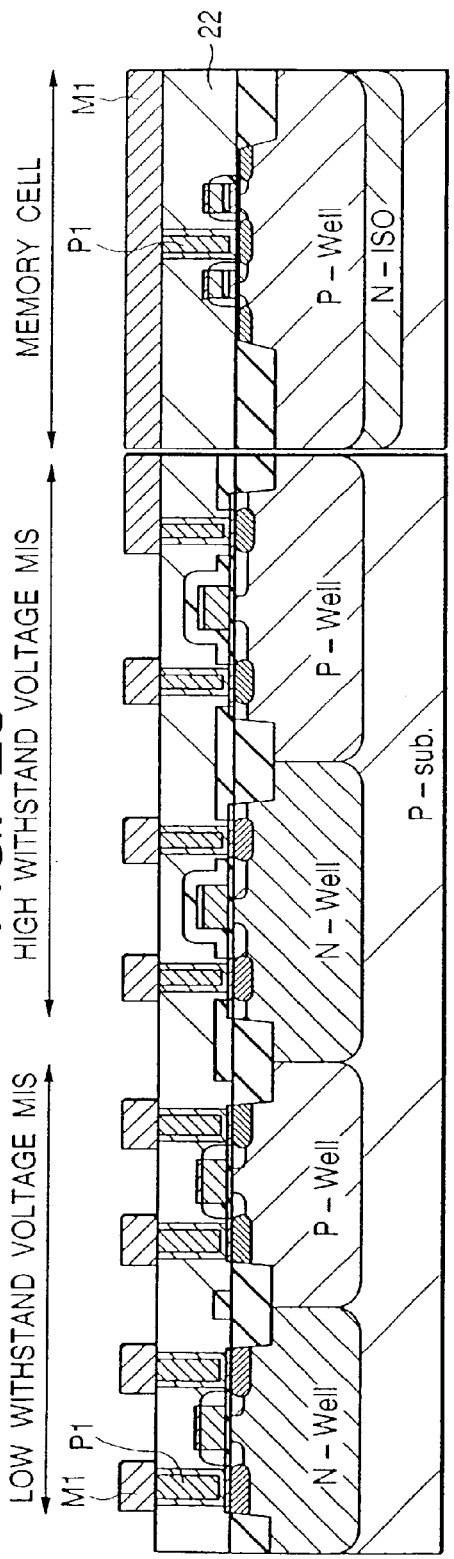
FIG. 28 is a sectional view of the major parts of the semiconductor integrated circuit device at a step of manufacture subsequent to that shown in FIG. 27.

As shown in FIG. 28, a first wiring layer M1 is patterned.

First, plugs P1 are formed to fill the contact holes TH. The plugs P1 are tungsten plugs formed as described below.

Titanium nitride (TiN) is thinly deposited using sputtering as a reaction preventing film for preventing any reaction between tungsten and the underlying salicide layers. Next, tungsten (W) is deposited on the titanium nitride films to fill the contact holes TH. In order to fill the contact holes TH with tungsten (W) completely, the tungsten must have a thickness which is equal to or greater than one half of the diameter of the contact holes. Thereafter, a method is employed to etch the deposited tungsten (W) and titanium nitride (TiN) as a whole (etch back) to leave the plugs P1 only in the contact holes.

Next, a metal layer is deposited using sputtering and is patterned into first layer wiring by means of the well known photolithography utilizing a photoresist pattern as a mask. The first wiring layer is constituted by TiN, Ti, AlCu and Ti (a top layer, upper layer, main wiring layer and bottom layer). Specifically, the first wiring layer is multi-layer wiring formed by sequentially sputtering Ti (with a thickness of 10 nm) at the bottom to provide adhesion to the $_{SiO2}$ film (layer insulation film) and to reduce contact resistance with the tungsten plugs, Al-0.5% Cu (with a thickness of 500 nm), aluminum being the primary wiring material, Ti (with a thickness of 10 nm) to improve adhesion between AlCu and TiN and TiN (with a thickness of 75 nm) as a reflection preventing film. The reflection preventing film (TiN) is a film for preventing the photoresist from being overexposed to light reflected by the metal layer during the exposure of the photoresist.

(Step of Forming Second Wiring Layer)

Figure 29:
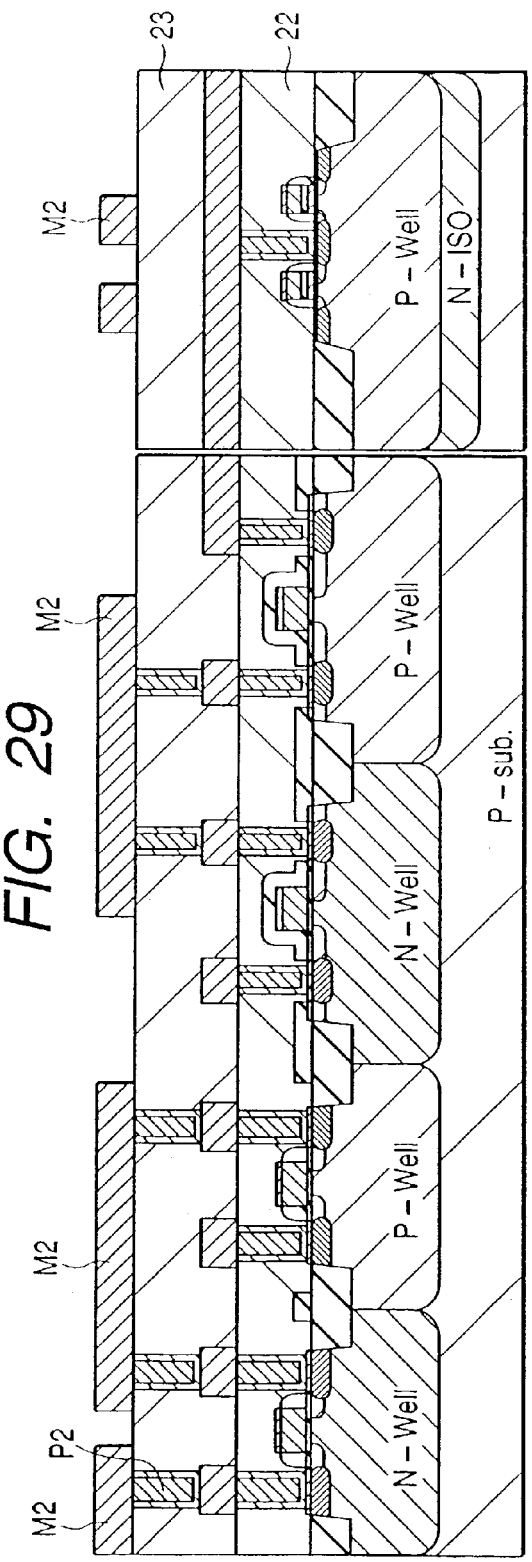
FIG. 29 is a sectional view of the major parts of the semiconductor integrated circuit device at a step of manufacture subsequent to that shown in FIG. 28.

As shown in FIG. 29, a second wiring layer M2 is patterned on a layer insulation film 23, the layer M2 being connected to the first wiring layer M1 through plugs P2.

First, similar to the formation of the layer insulation film 22 shown in FIG. 27, a silicon oxide film 23 is deposited using CVD, and CMP is then used to planarize the surface of the silicon oxide film 23.

Next, the silicon oxide film 23 is formed with contact holes, and the second wiring layer M2 is patterned using the same material and procedure as for the step of forming the first wiring layer shown in FIG. 28.

(Step of Forming Third Wiring Layer)

Figure 30:
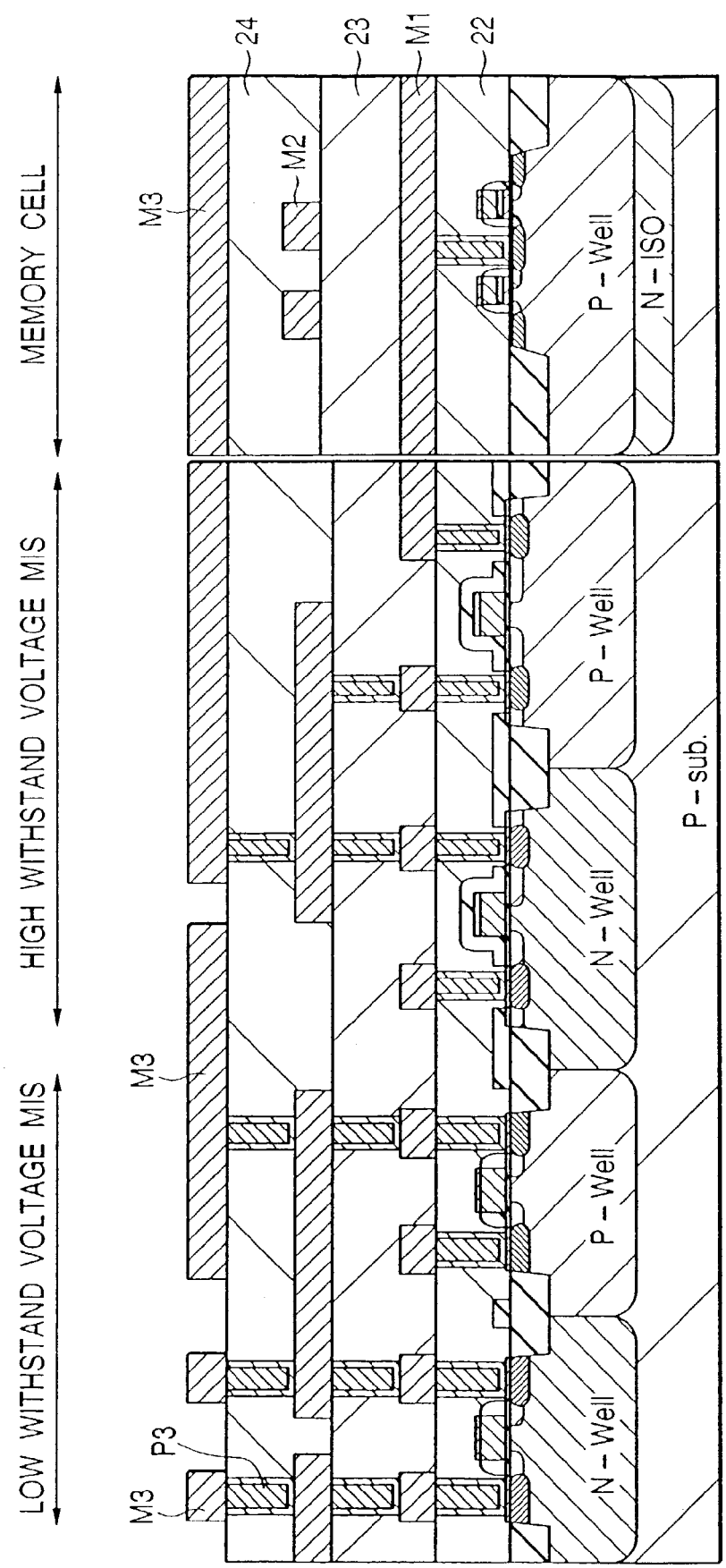
FIG. 30 is a sectional view of the major parts of the semiconductor integrated circuit device at a step of manufacture subsequent to that shown in FIG. 29.

As shown in FIG. 30, a third wiring layer M3 is patterned on a layer insulation film 24, the layer M3 being connected to the second wiring layer M2 through plugs P3.

The third wiring layer M3 is formed using the same material and procedure as for the step of forming the second wiring layer.

(Step of Forming Fourth Wiring Layer)

Figure 31:
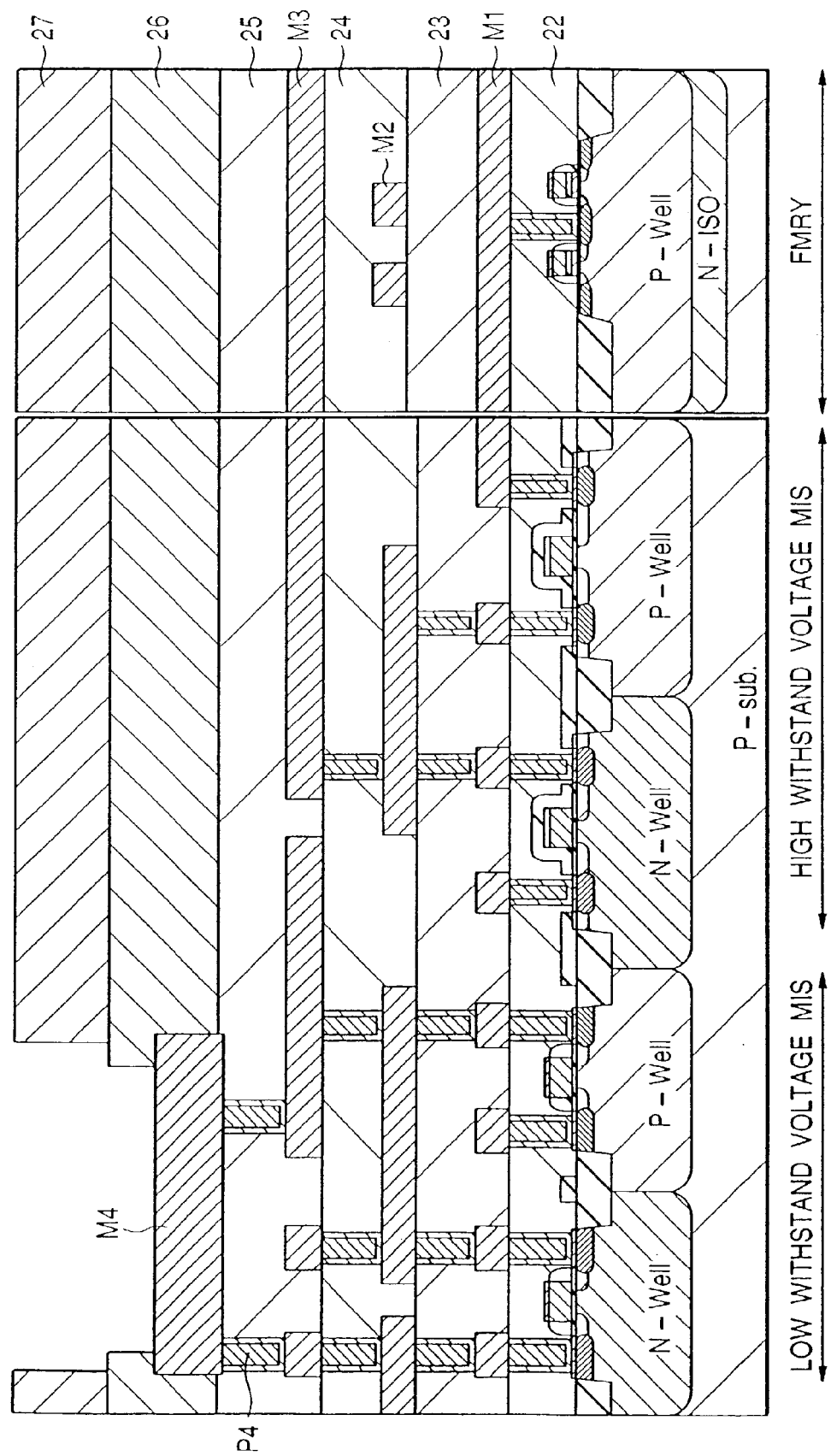
FIG. 31 is a sectional view of the major parts of the semiconductor integrated circuit device at a step of manufacture subsequent to that shown in FIG. 30.

As shown in FIG. 31, a fourth wiring layer M4 is patterned on a layer insulation film 25, the layer M4 being connected to the third wiring layer M3 through plugs P4.

In the present embodiment, the fourth wiring layer is the top layer. However, the wiring M4 is formed through the same procedure as for the step of forming the second wiring layer.

(Step of Forming Passivation Films)

As shown in FIG. 31, passivation films 26 and 27 are formed such that a part of the wiring M4 (a bonding pad potion) is exposed.

The lower passivation film 26 is constituted by an inorganic insulation film formed by stacking films of silicon nitride (TiN) and silicon oxide ($_{SiO2}$). Specifically, the passivation film 26 is constituted by a multi-layer film obtained by sequentially forming a tetra-ethyl-ortho-silicate film having a thickness of 800 μm made of an ethyl silicate and a silicon nitride film having a thickness of 1.3 pm (micron meter) using a plasma process.

The passivation film 27 is constituted by a polyimide type resin film and is formed as a buffer film for an epoxy type encapsulating resin body. The holes provided on the passivation films 26 and 27 expose a bonding pad portion of the fourth wiring layer M4, and the main wiring (AlCu) is exposed to improve bondability.

The above-described process up to the step of forming the passivation films is referred to as "pre-process" and is carried out on a semiconductor body in the form of a disc-shaped semiconductor wafer. Thereafter, the following step is carried out as a post-process.

Figure 54:
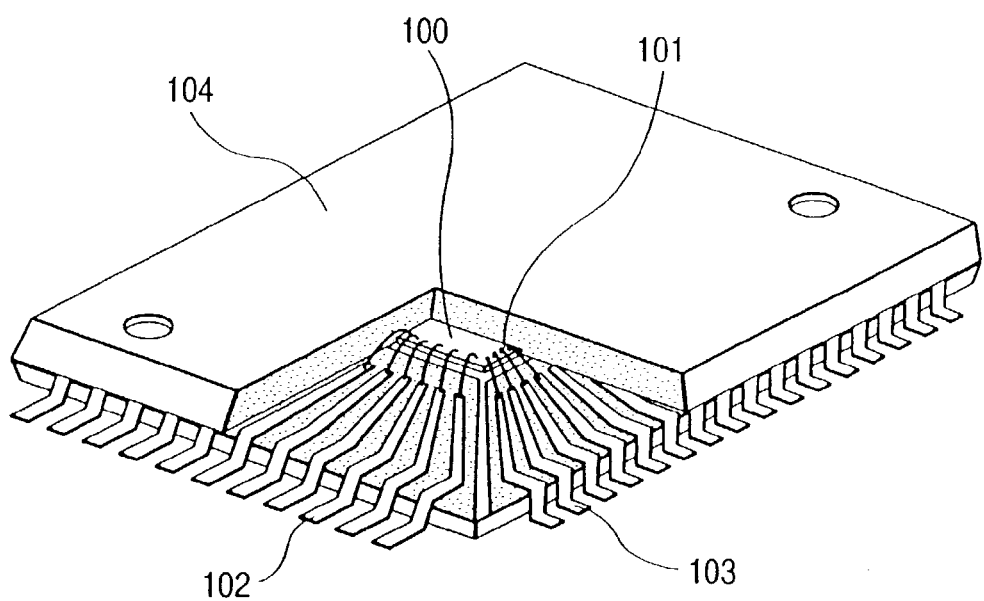
FIG. 54 is a perspective view of a resin encapsulated semiconductor integrated circuit device according to the invention.

The semiconductor wafer is comprised of a plurality of IC pellets. Therefore, in order to divide the semiconductor wafer into the IC pellets, the semiconductor wafer is ground from the rear surface thereof to a thickness appropriate for IC pellets. The semiconductor wafer is then diced to divide it into IC pellets. The IC pellets are then bonded to well known lead frames. Subsequently, outer leads of a lead frame are electrically connected to bonding pads (the bonding pad portion constituted by the wiring M4) provided on a principal surface of an IC pellet with wires. The wires are Al wires or Au wires. Then, the IC pellet, wires and a part of the lead frame are encapsulated by epoxy type resin. The outer frame of the lead frame is then cut to complete a resin encapsulated semiconductor integrated circuit device which constitutes a system LSI incorporating a flash memory as shown in FIG. 54. The resin encapsulated semiconductor device shown in FIG. 54 is referred to as "surface mount package". The surface mount package has an IC pellet 100 in the middle thereof, and bonding pads provided on the IC pellet 100 that constitutes a system LSI and inner leads 103 are electrically connected by wires 101. The IC pellet 100, wires 101 and inner leads 103 are encapsulated by a resin encapsulating body 104. Leads 102 led out on the four sides of the resin encapsulating body 104 are referred to as "outer leads" and have a gull wing structure. FIG. 54 shows only leads led out on two sides of the resin encapsulating body because it is a perspective view.

According to the first embodiment, since the high concentration regions of both of the low withstand voltage MIS portion and high withstand voltage MIS portion are formed with a silicide layer on the entire surface thereof, the resistance of the entire surfaces of the high concentration regions can be reduced. This makes it possible to provide a system LSI incorporating a flash memory having a higher speed.

When MISFETs having different device characteristics, i.e., the low withstand voltage MISFETS PMOS1 and NMOS1 and the high withstand voltage MISFETs PMOS2 and NMOS2, are provided on a single semiconductor body as in the first embodiment, since the silicide layer is aligned with the high concentration region in any of the MISFETs, the number of masks can be reduced to provide system LSIs incorporating a flash memory at a low cost and high yield.

According to the first embodiment, since the high concentration regions of the high withstand voltage MISFETs and the silicide layers are formed in alignment with each other, no silicide layer is formed on the LDD portions (offset portions). This eliminates concern about junction leakage and current-related failures on the surfaces of the LDD portions and makes it possible to provide a system LSI incorporating a flash memory suitable for a high speed logic.

The first embodiment makes it possible to provide a CMIS having a dual gate structure comprising a p-gate PMOS and an n-gate NMOS and to provide a high performance system LSI incorporating a flash memory in which fineness is achieved and the short channel effects are suppressed.

According to the first embodiment, since CMP is adapted for the formation of multi-layer wiring, fine multi-layer wiring can be achieved, and this makes it possible to provide a system LSI incorporating a flash memory at a high level of integration.

According to the first embodiment, the gate insulation films of the low withstand voltage MISFETs have a thickness in the range from about 4.5 to 5 nm; the gate insulation films of the high withstand voltage MISFETs have a thickness of about 18 nm, and they are formed sequentially at the step of forming the gate insulation films at the high withstand MIS portion and then at the step of forming the gate insulation films at the low withstand voltage MIS portion. This makes it possible to provide low withstand voltage MISFETs according to required specifications easily and to thereby provide a high performance system LSI incorporating a flash memory.

According to the first embodiment, since the gate electrodes of the high withstand voltage MISFETs are covered with a resist mask when the high concentration regions are formed, the top of the gate electrodes is not silicidized. This creates no problem because a high withstand voltage MISFET is not generally required to operate as fast as a high speed logic (e.g., a logic circuit constituted by a 1.8 v-drive MISFET).

The shallow groove isolation technique suitable for high levels of integration is adapted for the device isolating regions according to the first embodiment. Especially, the shallow groove isolation technique makes it possible to reduce the area occupied by the device isolating regions because it results in no Bird's beak unlike the LOCOS (local oxidation of silicon) technique. This makes it possible to improve the level of integration of a system LSI.

A second embodiment of the invention will now be described.

A description will be made on an embodiment in which the gate delay in high withstand MISFETs is reduced.

Figure 32:
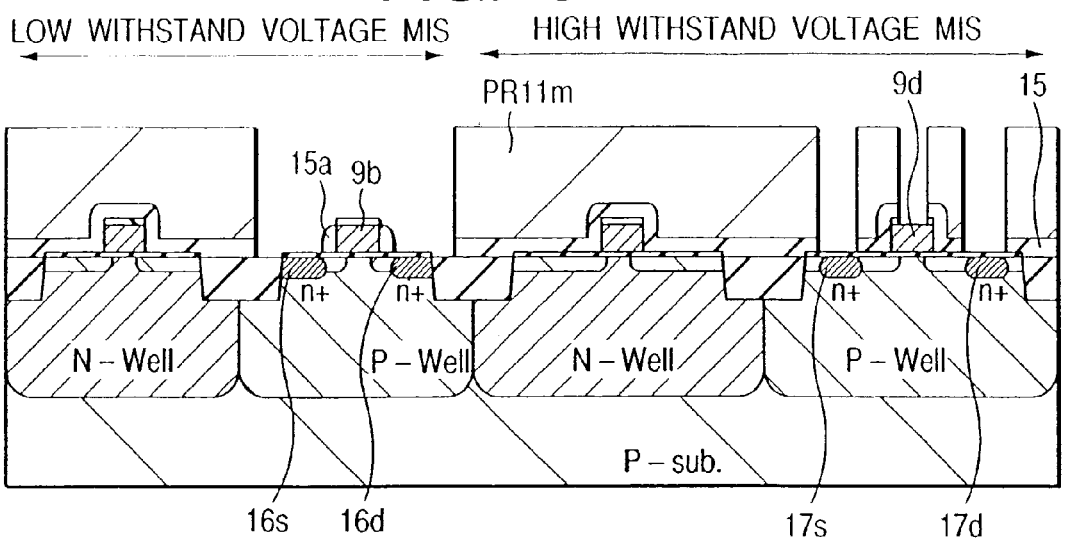
FIG. 32 is a sectional view of major parts of a semiconductor integrated circuit device according to another embodiment of the invention at a step of manufacture of the same.

As shown in FIG. 32, a mask PR11m according to the present embodiment has an opening pattern also above the gate electrode 9 of the high withstand MIS portion unlike the first mask PR11 used at the step of forming NMOS high concentration regions in the first embodiment. An insulation film 15 is selectively etched using the mask PR11m to form first insulation films 15a and second insulation films 15c. After the first and second insulation films 15a and 15c are formed, high concentration regions 16s, 16d, 17s and 17d are formed in the same manner as in the first embodiment.

Figure 33:
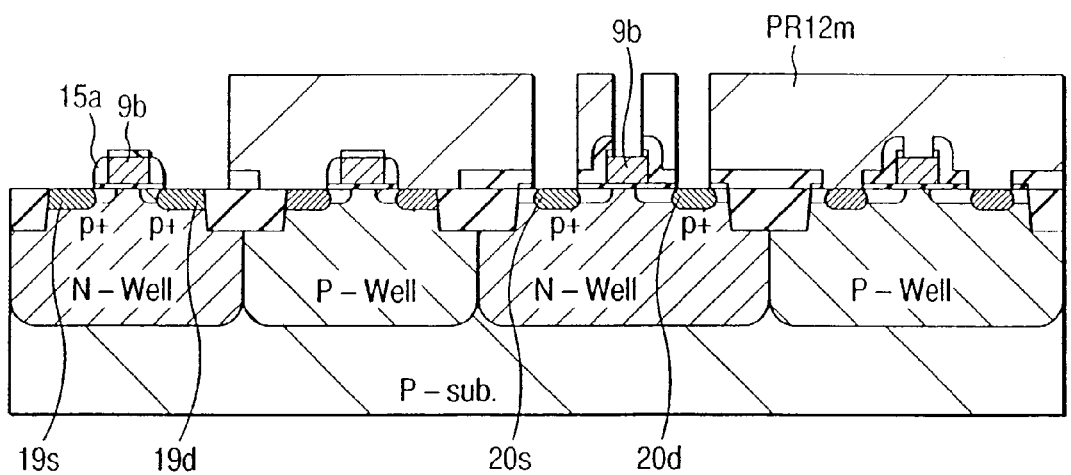
FIG. 33 is a sectional view of the major parts of the semiconductor integrated circuit device at a step of manufacture subsequent to that shown in FIG. 32.

Next, as shown in FIG. 33, a mask PR12m according to the present embodiment has an opening pattern also above the gate electrode 9 of the high withstand MIS portion unlike the second mask PR12 used at the step of forming PMOS high concentration regions in the first embodiment. The insulation film 15 is selectively etched using the mask PR12m to form third insulation films 15d and fourth insulation films 15e. After the third and fourth insulation films 15d and 14e are formed, high concentration regions 19s, 19d, 20s and 20d are formed in the same manner as in the first embodiment.

Figure 34:
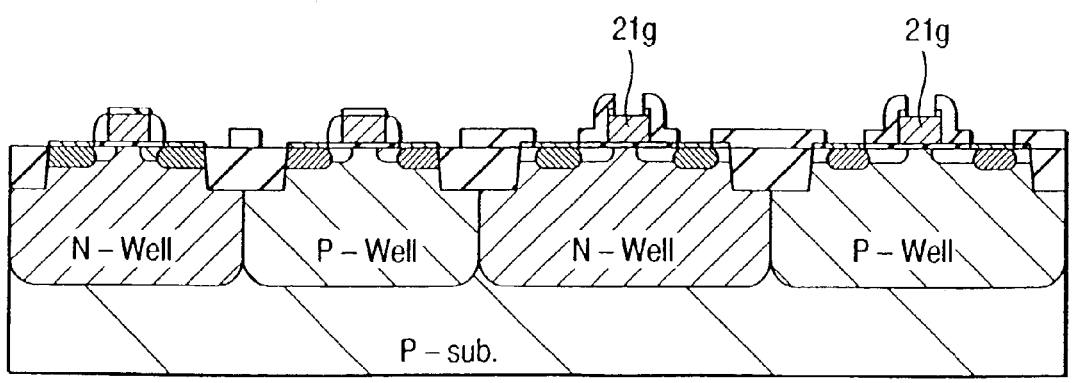
FIG. 34 is a sectional view of the major parts of the semiconductor integrated circuit device at a step of manufacture subsequent to that shown in FIG. 33.

Next, as shown in FIG. 34, a step of forming silicide layers is performed like the first embodiment.

Therefore, a silicide layer 21g is formed on the surface of the gate electrode of each of the MISFETs PMOS2 and NMOS2 of the high withstand voltage MIS portion.

The second embodiment represents a technique effective in providing a system LSI incorporating a flash memory of the next generation (0.18 µm process) in which gate delay at the high withstand voltage MISFETs and low withstand voltage MISFETs is reduced.

A third embodiment of the invention will now be described.

In the system LSI incorporating a flash memory shown in FIG. 2, a cache memory is incorporated in the high speed logic portion LOGIC, e.g., an arithmetic circuit (CPU). The present embodiment relates to cells of such a cache memory. The cache memory comprises SRAM cells as internal memory cells.

Figure 35:
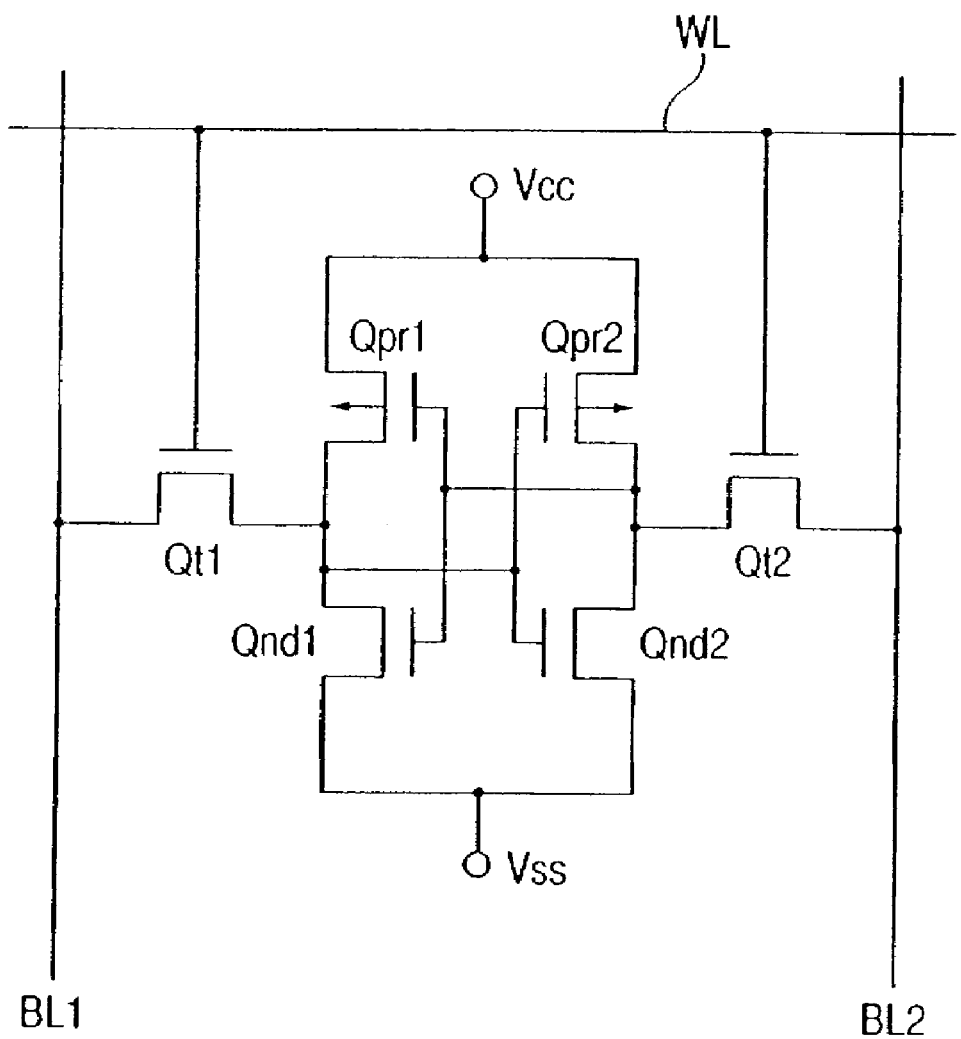
FIG. 35 is a circuit diagram of an SRAM memory cell

FIG. 35 is a circuit diagram of an SRAM cell. NMOSs Qnd1 and Qnd2 serve as MISFETS for driving the memory cell. PMOS5 Qpr1 and Qpr2 serve as load MISFETs. NMOSs Qt1 and Qt2 serve as switching MISFETs for data transfer. A word line WL is connected to the gates of the NMOSs Qt1 and Qt2. Signals which are inverted versions of each other are transmitted to bit lines BL1 and BL2.

Figure 36:
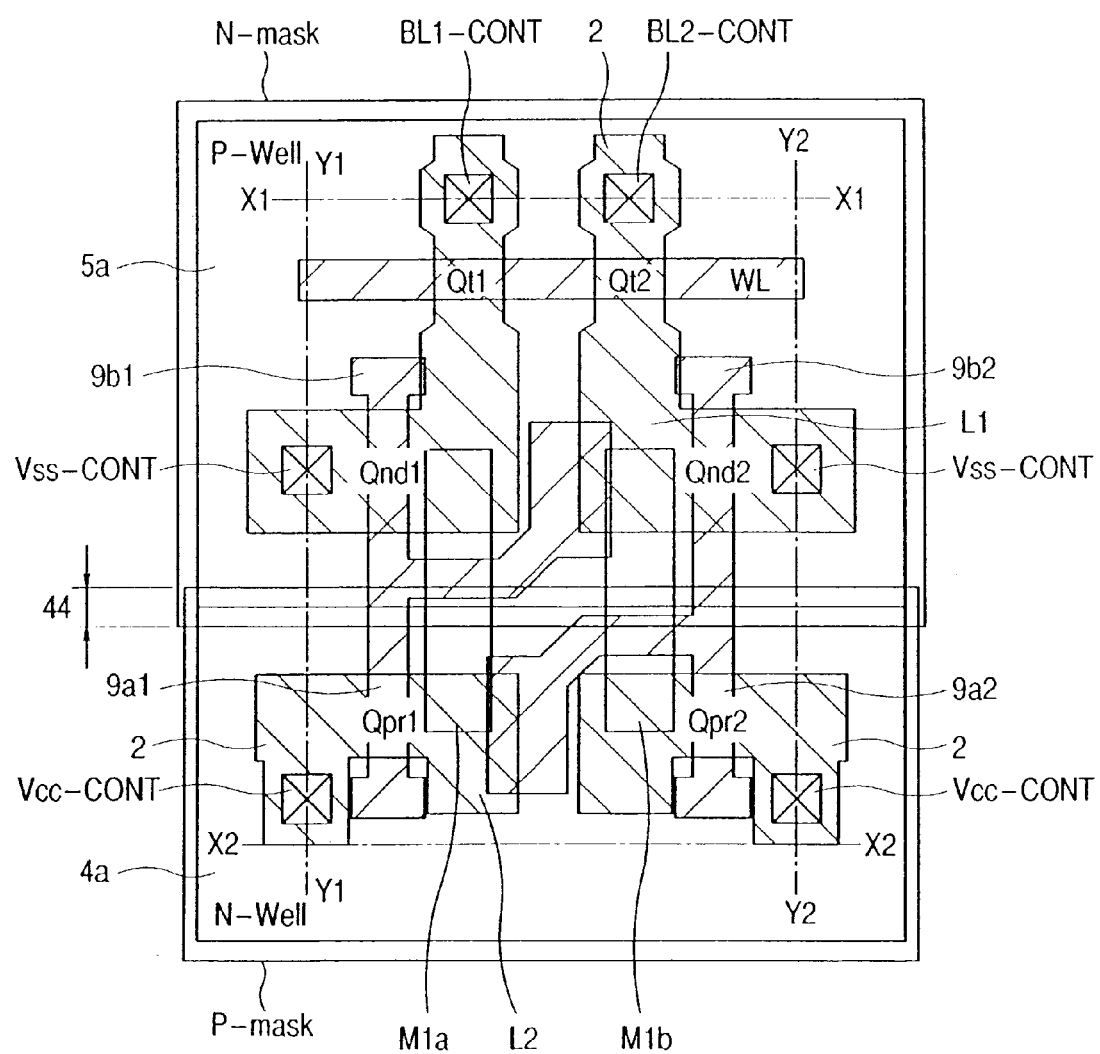
FIG. 36 is a layout diagram of an SRAM memory cell according to another embodiment of the invention.

FIG. 36 shows a plan view which is a specific layout of the SRAM cell. Referring to FIG. 36, L-shaped active regions separated by a device isolating region 2 are symmetrically provided above the cell. The word line WL is provided such that it extends in an X-direction across both of the active regions to form the NMOSs Qt1 and Qt2. A gate electrode 9b1 is provided such that it extends in a Y-direction across the inverted L-shaped active region to form the NMOS Qnd1. A gate electrode 9b2 is provided such that it extends in the Y-direction across the L-shaped active region to form the NMOS Qnd2.

Inverted U-shaped active regions separated by the device isolating region 2 are symmetrically provided under the cell. A gate electrode 9a1 integral with the gate electrode 9b1 is provided such that it extends in the Y-direction across one of the active regions to form the PMOS Qpr1. A gate electrode 9a2 integral with the gate electrode 9b2 is provided such that it extends in the Y-direction across the other active region to form the PMOS Qpr2.

Apart of the gate electrodes 9a1 and 9b1 is connected to a semiconductor region L1 shared by the NMOS Qnd2 and NMOS Qt2. A part of the gate electrodes 9a2 and 9b2 is connected to a semiconductor region L2 of the PMOS Qpr1.

The NMOSs Qt1, Qt2, Qnd1 and Qnd2 form an LDD structure and a salicide structure like the low withstand voltage MISFET shown in FIG. 1, i.e., NMOS1. The PMOSs Qpr1 and Qpr2 form an LDD structure and a salicide structure like the low withstand voltage MISFET shown in FIG. 1, i.e., PMOS1.

A memory cell having such a configuration serves as a unit, and adjoining memory cells are provided in line symmetry about lines X1—X1, X2—X2, Y1—Y1 and Y2—Y2.

As apparent from FIG. 36, the NMOSs Qnd1 and Qnd2 and the NMOS Qt1 and Qt2 are formed in a p-well (P-Well) 5a. The PMOSs Qpr1 and Qpr2 are formed in an n-well (N-Well) 4a.

The p-well (P-Well) 5a is formed using a mask P-mask and is selectively formed in a region on the principal surface of the semiconductor body which is not covered by the mask.

The n-well (N-Well) 4a is formed using a mask N-mask and is selectively formed in a region on the principal surface of the semiconductor body which is not covered by the mask.

The PMOS LDD portions and NMOS LDD portions described in the first embodiment are formed using the masks P-mask and N-mask, respectively.

Referring to FIG. 36, contact holes BL1-CONT, BL2-CONT, Vcc-CONT and Vss-CONT are filled with, for example, plugs P1 as shown in FIG. 28. The bit lines BL1 and BL2 shown in FIG. 35 are constituted by a pair of second wiring layers. They are electrically connected to a semiconductor region (source or drain region) through respective pad layers constituted by a first wiring layer (conductor) provided on the plugs in the contact holes BL1-CONT and BL2-CONT and extend in the Y-direction.

Power supply lines Vcc are constituted by the pair of second wiring layers. They are electrically connected to the semiconductor region (source or drain region) through respective pad layers constituted by the first wiring layer (conductor) provided on the plugs in the contact holes Vcc-CONT and extend in the Y-direction like the bit lines.

Reference potential (ground) lines Vss are constituted by the first wiring layer. They are electrically connected to the semiconductor region through the plugs in the contact holes Vss-CONT and extend in the X-direction.

A wire M1a shown in FIG. 36 is constituted by the first wiring layer and electrically connects a semiconductor region of the PMOS Qpr1 (L2) and a semiconductor region of the NMOS Qnd1. A wire M1b is constituted by the first wiring layer and electrically connects a semiconductor region of the PMOS Qpr2 and a semiconductor region of the NMOS Qnd2 (L1).

As shown in FIG. 36, when the masks used at the step of forming high concentration regions include a mask overlapping portion 44 as seen between the masks P-mask and N-mask, a silicon nitride film like the silicon oxide film 15x as shown in FIG. 26 is left on gate electrodes (indicated by oblique lines) located under such an overlapping portion. This prevents a part of gate electrodes 9a1 and 9a2 from being silicidized, which increases the resistance of the gate electrodes 9a1 and 9b1 connecting the NMOS Qnd1 and PMOS Qpr1 and the gate electrodes 9a2 and 9b2 connecting the NMOS Qnd2 and PMOS Qpr2, although slightly.

A fourth embodiment of the invention will now be described.

A fourth embodiment of the invention will now be described with reference to FIGS. 37 and 38. According to the present embodiment, there is provided cache memory cells which accommodate an operation at a speed higher than that available with the third embodiment. Specifically, according to the embodiment, the resistance of the gate electrodes 9a1 and 9a2 is reduced.

Figure 37:
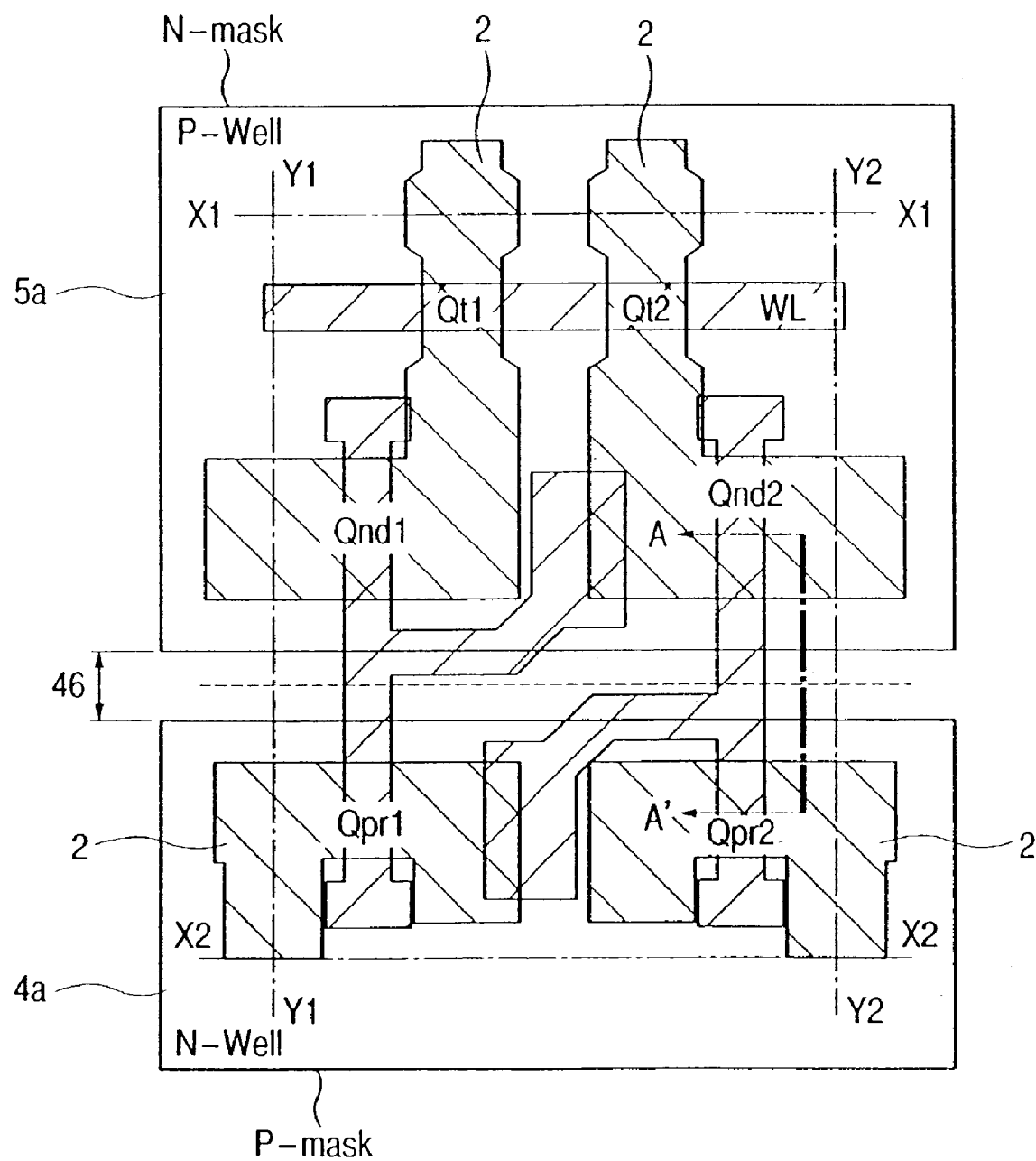
FIG. 37 is a layout diagram of an SRAM memory cell according to still another embodiment of the invention.

FIG. 37 is a plan view of a layout of an SRAM cell for which arrangement of masks is improved.

Figure 38:
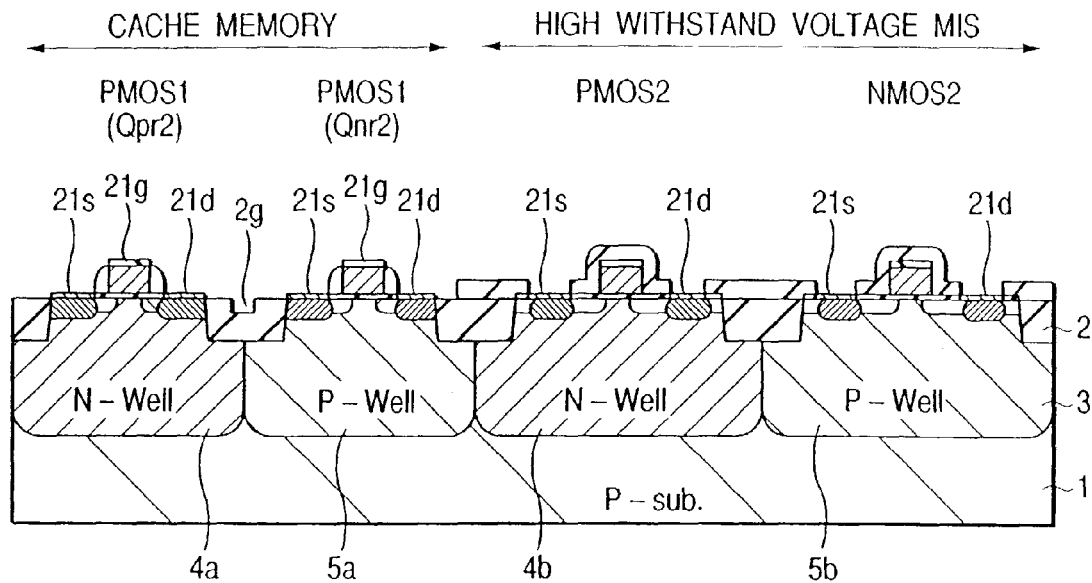
FIG. 38 is a sectional view of major parts of a semiconductor integrated circuit device according to still another embodiment of the invention.

FIG. 38 is a sectional view of a semiconductor integrated circuit device in which CMOSs (PMOS1 and NMOS1) forming a part of a cache memory (SRAM cell) and CMOSs (PMOS2 and NMOS2) in a high withstand voltage MIS portion are formed on a single semiconductor body 1. The NMOS Qnd2 and PMOS Qpr2 shown in FIG. 37 correspond to the CMOSs PMOS1 and NMOS1 shown in FIG. 38, respectively. That is, the sectional view of the cache memory portion shown in FIG. 38 is a sectional view taken along the line A—A in FIG. 37.

According to the present embodiment, as shown in FIG. 37, overlap between the masks P-mask and N-mask is avoided. The insulation film (silicon nitride film 15) for forming high concentration regions is patterned using such masks. A boundary 46 between the masks P-mask and N-mask is therefore etched twice, which makes it possible to silicidize the entire surfaces of the gate electrodes 9a1, 9b1, 9a2 and 9b2. That is, since silicide layers are formed on the entire surfaces of the gate electrodes 9a1, 9a2, 9b1 and 9b2, the resistance of those electrodes can be reduced.

As shown in FIG. 38, a groove 2g is formed in a part of the boundary 46 where no gate electrode exists because the oxide film on the device isolating region is removed when the silicon nitride film 15 is etched. However, since the groove 2g is filled with a layer insulation film (e.g., the layer insulation film 22 of the first embodiment), it does not adversely affect the characteristics of the MISFETS and the formation of wiring.

The fourth embodiment makes it possible to provide cache memory cells which accommodate a high speed operation and to thereby provide a high performance system LSI incorporating a flash memory.

A fifth embodiment of the invention will now be described.

The fifth embodiment refers to an application of the invention to a semiconductor integrated circuit device in which a DRAM, a logic circuit capable of a high speed operation (high speed logic circuit) and peripheral circuits therefore are provided in the semiconductor chip.

Figure 39:
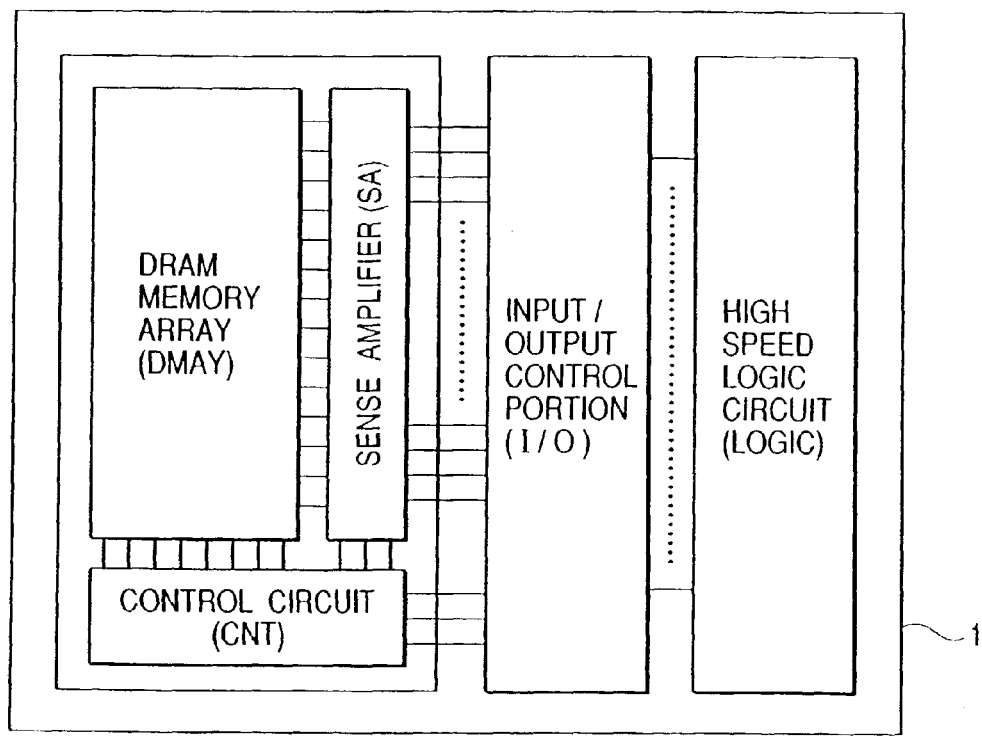
FIG. 39 is a plan view of major parts of a semiconductor integrated circuit device according to still another embodiment of the invention.

FIG. 39 schematically illustrates an example of a block diagram of a system on chip in which a DRAM, a logic circuit capable of a high speed operation (high speed logic circuit) and peripheral circuits therefore are mounted on one chip (hereinafter referred to as "system LSI incorporating a DRAM").

The system LSI incorporating a DRAM (semiconductor chip 1) comprises a CMOS device as a fundamental device, a DRAM portion formed by a DRAM memory array DMAY, a sense amplifier SA and a control circuit CONT, a high speed logic circuit portion LOGIC (e.g., a processor CPU or ASIC (application specific integrated circuit) for high speed logic operations and an input/output control portion I/O for a buffer function.

The high speed logic circuit portion LOGIC incorporates a cache memory (cache SRAM) and is constituted by, for example, a 1.8 V-drive CMOS. The input/output control portion I/O is constituted by a 3.3 V-drive CMOS.

A description will now be made with reference to FIGS. 40 through 53 on a method of forming the system LSI incorporating a DRAM.

(Step of Forming Gate Electrodes)

FIG. 40 is a sectional view of a system LSI incorporating a DRAM in which gate electrodes are formed in a DRAM cell portion and a high speed logic portion on a principal surface of a semiconductor body 1 for illustrating a step of manufacturing the same. Fundamental processes up to the formation of well according to the fifth embodiment are not described here because they are the same as those in the first embodiment. That is, reference is to be made to the first embodiment about the procedure for forming each of the wells shown in FIG. 40.

A description will now be made with reference to FIG. 40 on the procedure for forming gate electrodes 9a in the high speed logic portion and gate electrodes 9w in the DRAM cell portion shown in the same figure.

First, thermal oxidation is carried out to form a silicon oxide film (having a thickness of 4.5 nm) on the entire principal surface of the semiconductor body 1 as a gate insulation film for CMOSs in the high speed logic portion. Next, a first polycrystalline silicon film 9a is deposited on the silicon oxide film using CVD. Photolithography is then used to pattern the first polycrystalline silicon film 9a such that it is removed from the DRAM cell portion through etching and left on the entire principle surface in the high speed logic portion. The silicon oxide film is also removed from the DRAM cell portion to expose the polycrystalline silicon film is not etched.

Thereafter, the first polycrystalline silicon layer is patterned to form the gate electrodes 9a and 9b in the high speed logic portion.

According to the present embodiment, the polycide layer reduces the resistance of the word lines in the DRAM cell portion. The first polycrystalline silicon layer in the high speed logic portion is deposited prior to the polycide layer in the DRAM cell portion. The purpose is to simplify the processing of the devices by forming the layer insulation film (etching stopper) on the surface of the first polycrystalline silicon film at the same time when the gate insulation film in the DRAM cell portion is formed. Therefore, the word lines (gate electrodes) in the DRAM cell portion are patterned prior to the patterning of the gate electrodes in the high speed logic portion.

(Step of Forming Low Concentration Regions)

Subsequently, as shown in FIG. 41, low concentration regions (LDD portions) 12s, 12d, 13s, 13d, 16s and 16d self-aligned with the gate electrodes 9w, 9a and 9b are formed. The step of forming low concentration regions of the NMOSs and PMOSs is carried out through ion implantation using photoresist masks PR9 and PR10 respectively in the same way as described in the first embodiment.

(Step of Forming Insulation Films)

As shown in FIG. 42, an insulation film 15 is formed to define high concentration regions on the principle surface in the DRAM cell portion and high speed logic portion where the LDD portions have been formed. The insulation film 15 is constituted by a silicon nitride film (having a thickness of 100 nm) and is formed using the well known plasma CVD.

(Formation of Contacts in DRAM Cell Portion)

As shown in FIG. 43, after forming a layer insulation film (first layer insulation film) 23, contact holes TH are formed in the layer insulation film 23 using a photoresist pattern PR100.

Referring to FIG. 43, a silicon oxide ($_{SiO2}$) film 23 as the layer insulation film is first deposited using CVD, and the surface of the $_{SiO2}$ film is then planarized using CMP. The thickness of the $_{SiO2}$ film 23 is appropriately set taking the planarization using CMP into consideration.

More specifically, the layer insulation film 23 is constituted by a tetra-ethyl-ortho-silicate film made of ethyl silicate. This film is deposited using plasma CVD. In order to obtain more stable device characteristics, the layer insulation film 23 may be a multi-layer film obtained by sequentially depositing phosphosilictae glass (PSG) and a tetra-ethyl-ortho-silicate film.

Subsequently, contact holes TH are formed to expose the surfaces of the LDD portions 12s and 12d. The contact holes TH are formed using the well known photolithography using the photoresist pattern PR100 as a mask. The contact holes are formed above the gate electrodes 9w. Specifically, there is not strict requirement for the processing dimension of the contact holes TH, and the width between the openings of the contact holes TH may be greater than the width between the gate electrodes. The reason is as described below.

First, the layer insulation film 23 is subjected to dry etching. Subsequently, the silicon nitride film 15 is subjected to dry etching with a different etching gas (anisotropic etching) to form the contact holes TH. At this time, since the cap layers are present on top of the polycide layers 9w, the polycide layers 9w are not exposed when the silicon nitride film 15 is etched. That is, the contact holes TH are formed on a self-alignment bases at this step.

(Formation of Bit Lines)

Figure 44:
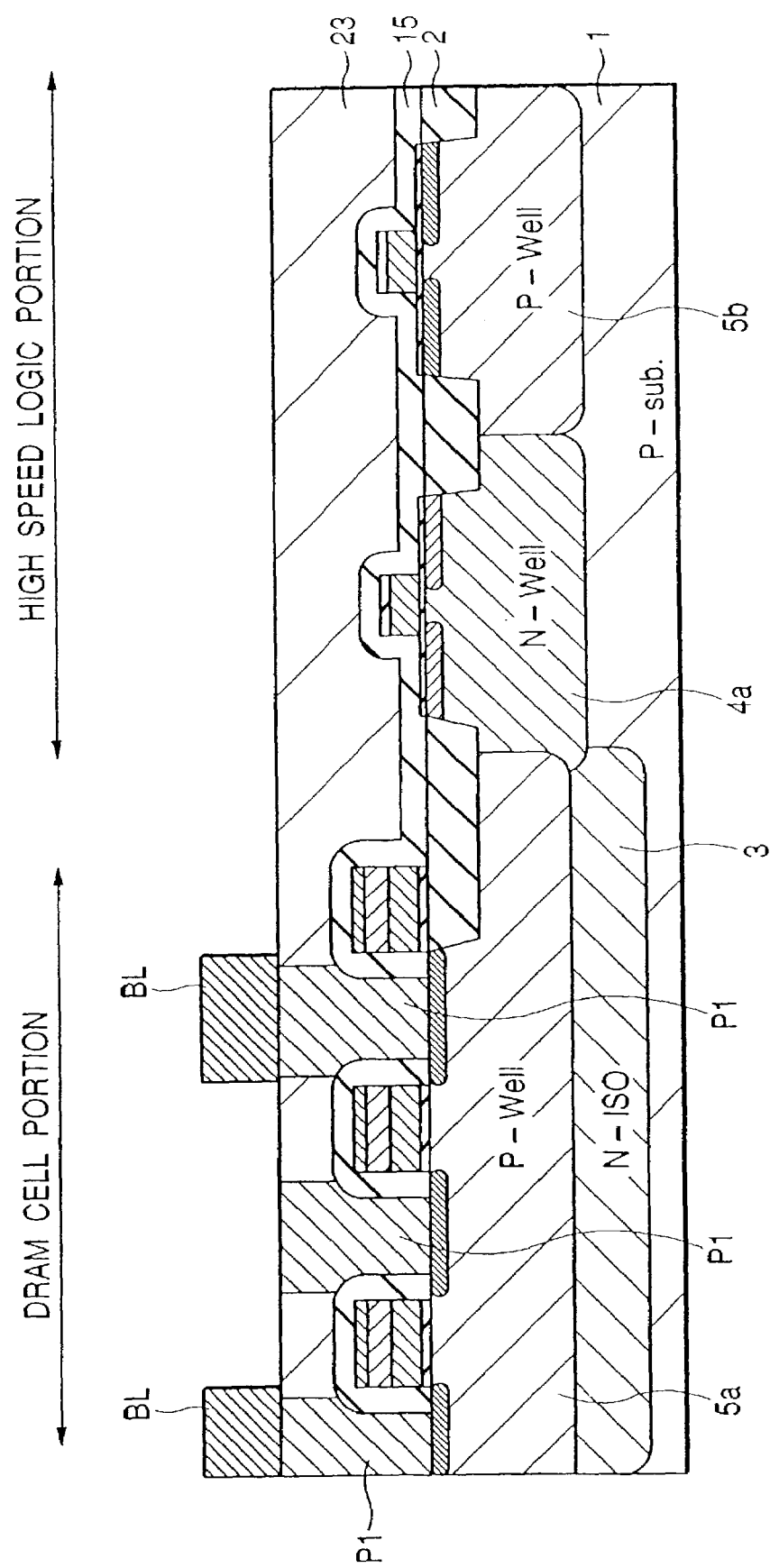
FIG. 44 is a sectional view of the major parts of the semiconductor integrated circuit device at a step of manufacture subsequent to that shown in FIG. 43.

As shown in FIG. 44, bit lines BL are formed through plugs P1 filled in the contact holes TH.

First, a polycrystalline silicon layer including an n-type impurity (doped polysilicon) is deposited to fill the contact holes TH, and the plugs P1 are formed through a process of etching the polycrystalline silicon layer as a whole, i.e., a so-called etch-back process. CMP may be used for the formation of the plugs P1. The use of CMP is rather recommendable to prevent recession of the plugs P1 attributable to over-etching.

Subsequently, the bit lines BL are formed on the layer insulation film 23. The bit lines BL are formed by depositing a TiN film and a W film on the layer insulation film 23 using sputtering, depositing a silicon nitride film (not shown) on the W film using CVD and thereafter patterning those films through etching utilizing a photoresist pattern as a mask.

(Step of Forming Capacitor in DRAM Cell Portion)

Figure 45:
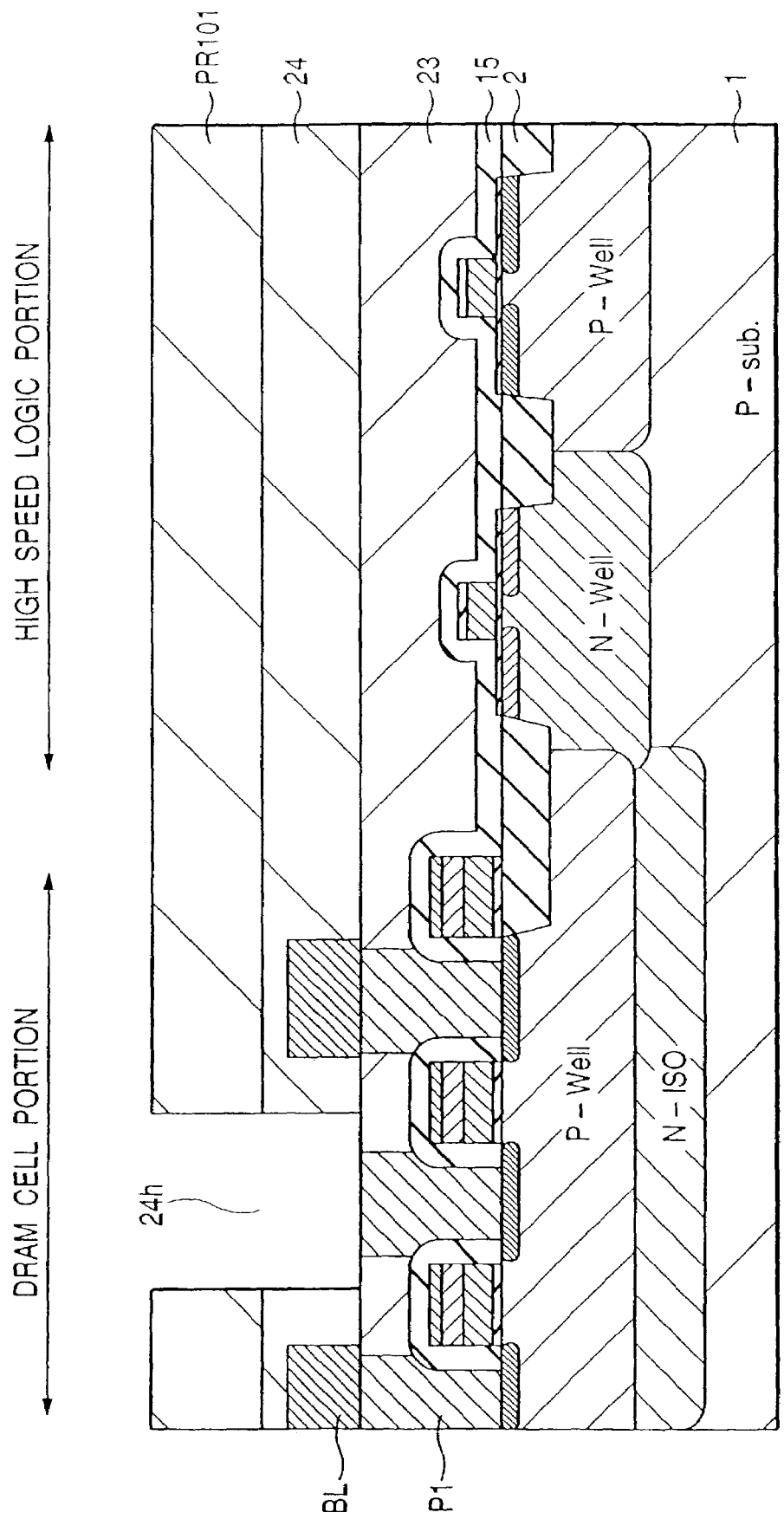
FIG. 45 is a sectional view of the major parts of the semiconductor integrated circuit device at a step of manufacture subsequent to that shown in FIG. 44.

As shown in FIG. 45, a silicon oxide film is first deposited using CVD as a layer insulation film (second layer insulation film) 24, and CMP is then used to planarize the surface of the silicon oxide film 24. The thickness of the silicon oxide film 24 is appropriately set taking the planarization using CMP into consideration. The layer insulation film 24 is constituted by a tetra-ethyl-ortho-silicate film made of ethyl silicate similarly to the layer insulation film 23.

Subsequently, an opening 24h is provided on the layer insulation film by means of etching to expose the surface of the plug P1 to which a capacitor is to be connected using a photoresist pattern PR101 as a mask.

Figure 46:
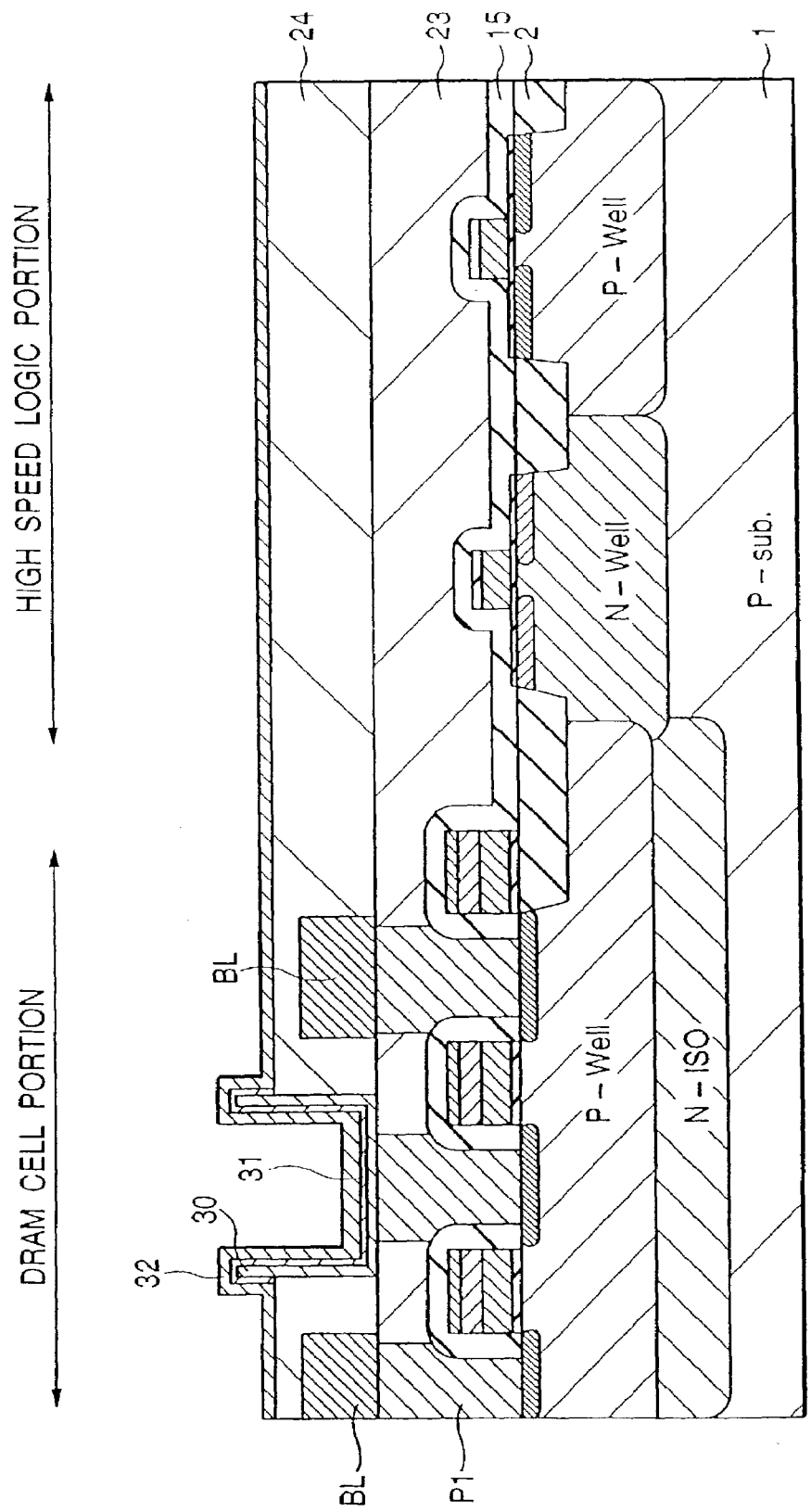
FIG. 46 is a sectional view of the major parts of the semiconductor integrated circuit device at a step of manufacture subsequent to that shown in FIG. 45.

Next, as shown in FIG. 46, a lower electrode (accumulation electrode) 30 is formed along the side wall of the opening 24h. The accumulation electrode 30 is formed by depositing a W film using CVD or sputtering and by patterning it by means of etching utilizing a photoresist pattern as a mask. Next, an insulation film (dielectric film) 31 is formed on the exposed surface of the lower electrode 30.

For example, the capacitor insulation film 30 is made of tantalum oxide ($Ta_2O_5$) having a relatively high dielectric constant. The tantalum oxide film 31 is formed by depositing amorphous tantalum oxide to a thickness of about 20 nm using CVD and by thereafter performing a thermal oxidation process to crystallize the tantalum oxide. Then, an upper (plate) electrode 31 for the capacitor insulation film is formed. The upper (plate) electrode 31 is constituted by a TiN film formed using sputtering.

While a tantalum oxide film is used as the capacitor insulation film, other metal oxide films, e.g., a high dielectric film such as (Ba, Sr) Ti03 film or Pb (Zr, Ti) 03 film may be used. While a TiN film is used to form the plate electrode, a metal film having a refractory metal film selected from among a group including a tungsten nitride (WN) film and a tungsten (W) film. In addition, the plate electrode may be a polycrystalline silicon film including an impurity. When a polycrystalline silicon film is used, the surface of the polycrystalline silicon film is also silicidized at a step of forming a silicide layer to be described later to reduce the resistance of the plate electrode.

(Step of Forming Side Wall Spacers of PMOS Gate Electrodes)

Figure 47:
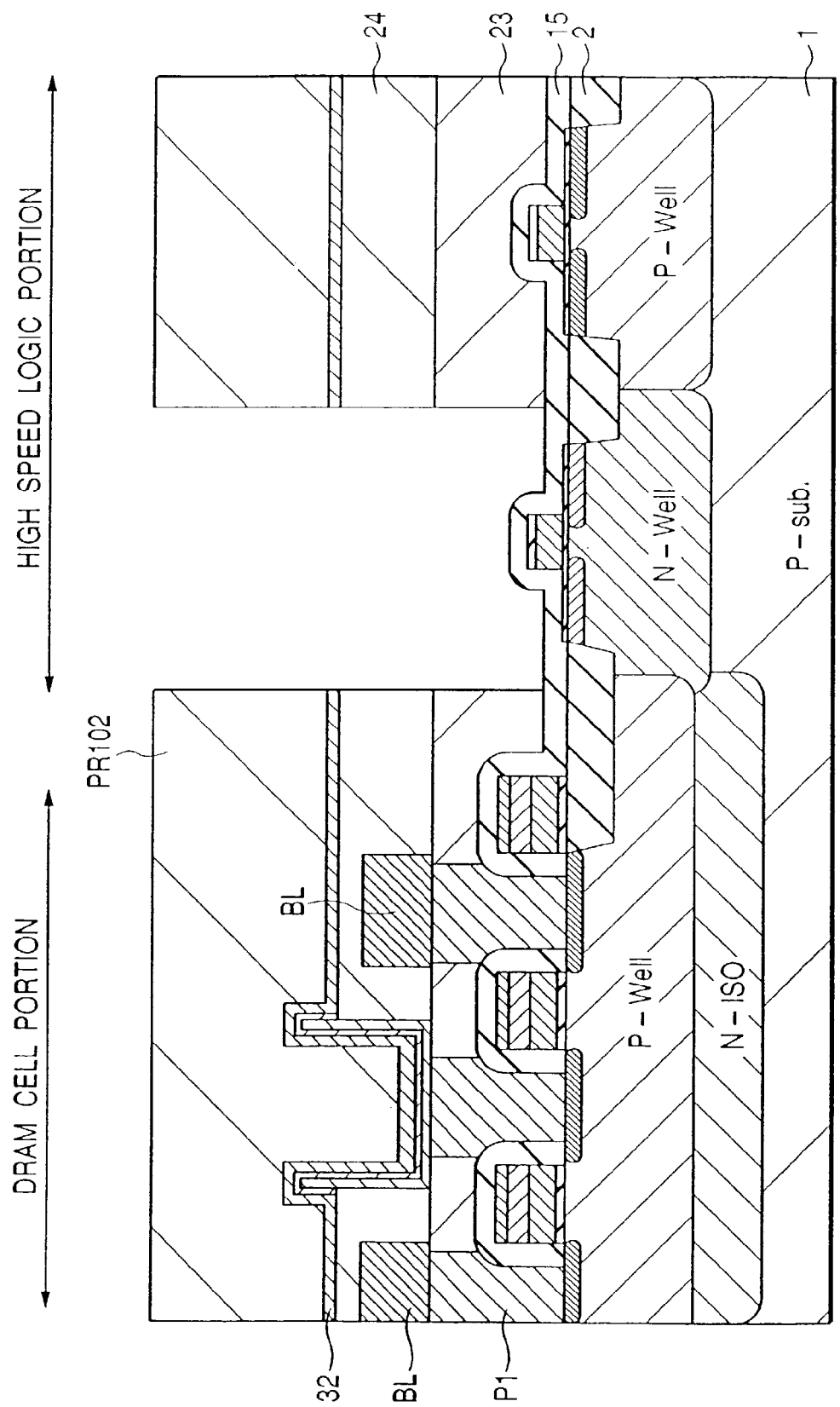
FIG. 47 is a sectional view of the major parts of the semiconductor integrated circuit device at a step of manufacture subsequent to that shown in FIG. 46.

As shown in FIG. 47, the layer insulation films 23, 24 (silicon oxide films) are selectively etched using a photoresist pattern PR102 as a mask. The etching of the layer insulation films will stop at the surface of the underlying silicon nitride film 15 without etching the same film.

Figure 48:
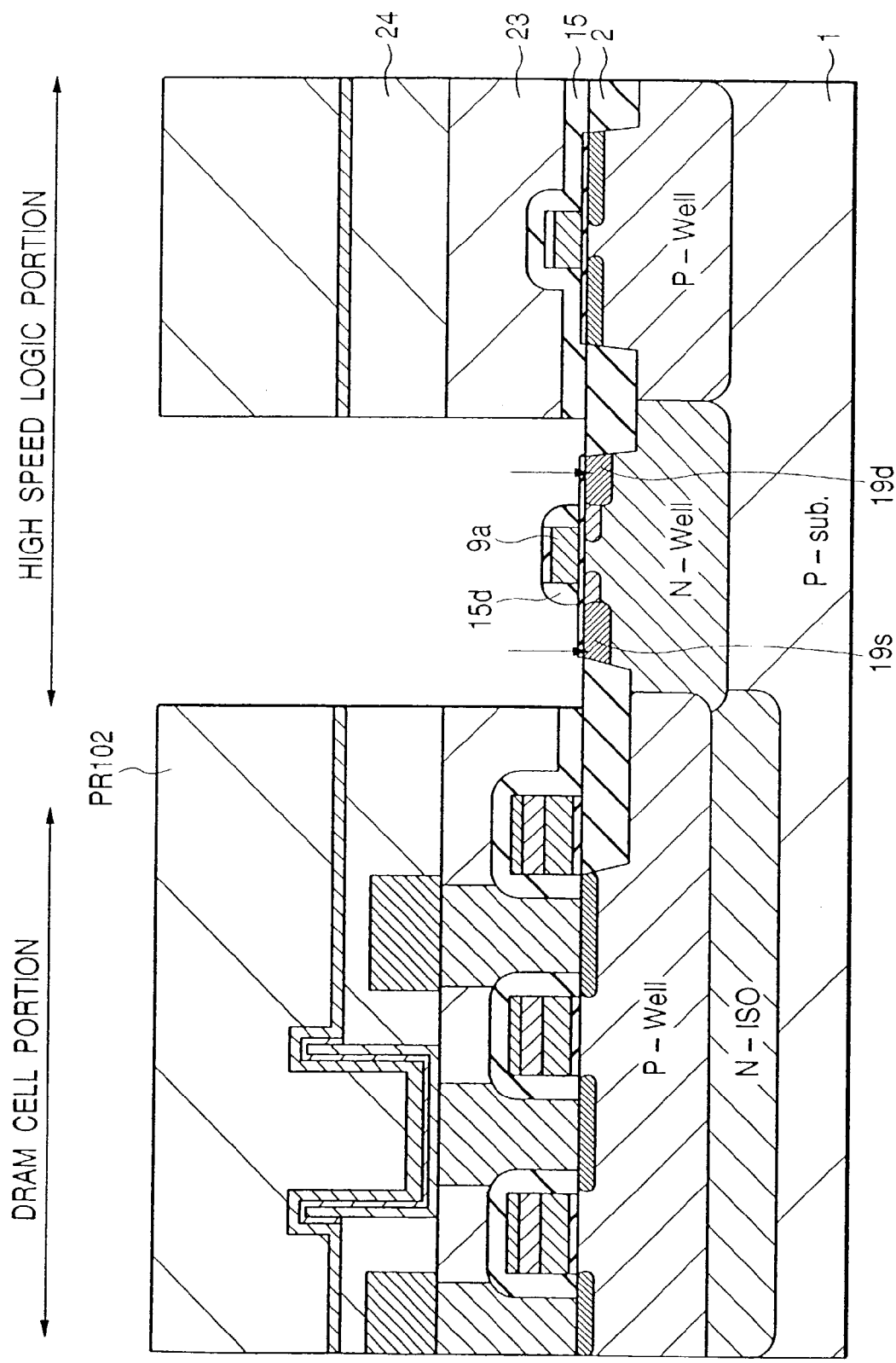
FIG. 48 is a sectional view of the major parts of the semiconductor integrated circuit device at a step of manufacture subsequent to that shown in FIG. 47.

Next, as shown in FIG. 48, the exposed silicon nitride film 15 is subjected to reactive ion etching (anisotropic etching) to form side wall spacers 15d on the side walls of the NMOS gate electrode 9a.

(Step of Forming PMOS High Concentration Regions)

Subsequently, as shown in FIG. 48, high concentration regions 19s and 19d aligned by the side wall spacers 15d are formed. Specifically, ion implantation is carried out to introduce a p-type impurity, e.g., boron (B) into the n-well 4a such that it is defined by the side wall spacers 15d. For example, the ion implantation is carried out with an acceleration energy at 10 KeV and in a dose of about $3\times10^{15}$ atoms/$cm_2$. During the ion implantation, the impurity is also introduced into the gate electrode 9a provide a p-gate (gate electrode of the p conductivity type) PMOS.

(Step of Forming Side Wall Spacers of NMOS Gate Electrodes)

Figure 49:
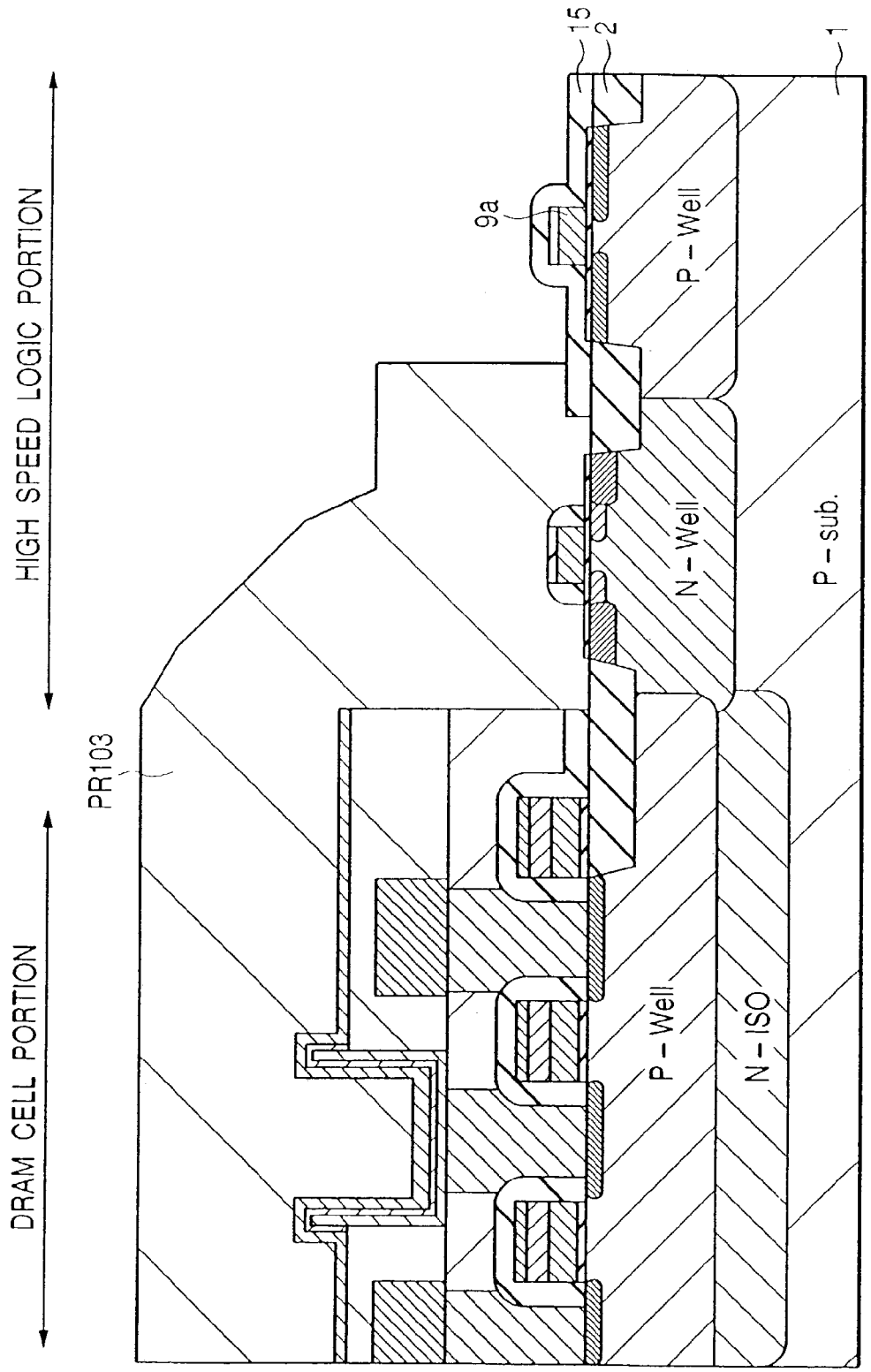
FIG. 49 is a sectional view of the major parts of the semiconductor integrated circuit device at a step of manufacture subsequent to that shown in FIG. 48.

As shown in FIG. 49, the layer insulation films 23, 24 (silicon oxide films) are selectively etched using a photoresist pattern PR103 as a mask. The etching of the layer insulation films will stop at the surface of the underlying silicon nitride film 15 without etching the same film.

Figure 50:
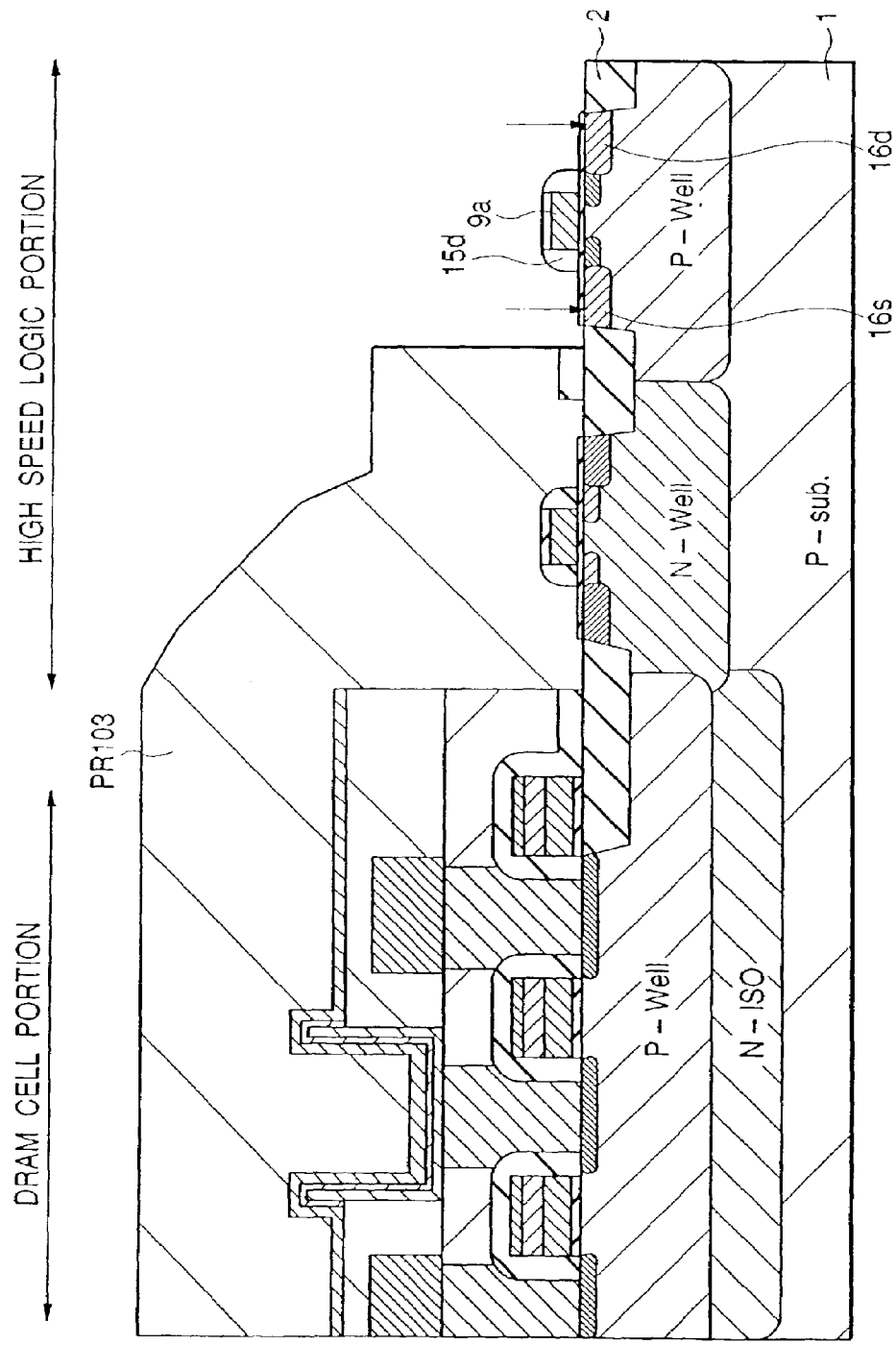
FIG. 50 is a sectional view of the major parts of the semiconductor integrated circuit device at a step of manufacture subsequent to that shown in FIG. 49.

Next, as shown in FIG. 50, the exposed silicon nitride film 15 is subjected to reactive ion etching (anisotropic etching) to form side wall spacers 15d on the side walls of the PMOS gate electrode 9a.

(Step of Forming NMOS High Concentration Regions)

Subsequently, as shown in FIG. 50, high concentration regions 16s and i6d aligned by the side wall spacers 15d are formed. Specifically, ion implantation is carried out to introduce an n-type impurity, e.g., arsenic (As) into the p-well such that it is defined by the side wall spacers 15d. For example, the ion implantation is carried out with an acceleration energy at 60 KeV and in a dose of about $3\times10^{15}$ atoms/$cm_2$. The ion implantation introduces the impurity to also each of the gate electrodes 9b and 9e to provide n-gate (gate electrodes of the n-conductivity type) NMOSs.

(Step of Forming Suicide Layer)

Figure 51:
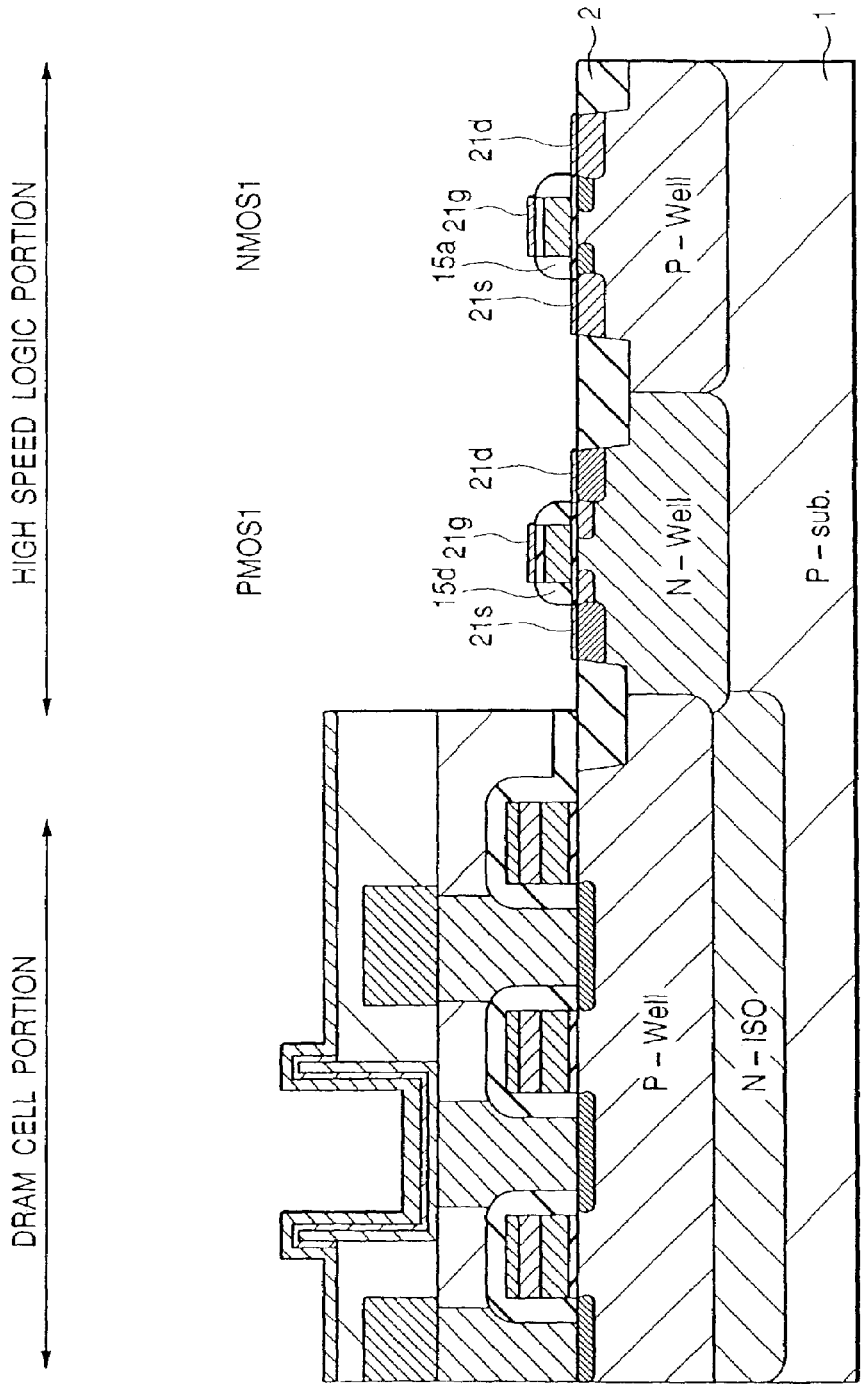
FIG. 51 is a sectional view of the major parts of the semiconductor integrated circuit device at a step of manufacture subsequent to that shown in FIG. 50.

As shown in FIG. 51, a metal-semiconductor reaction layer (salicide layer) is formed on the gate electrodes in the high speed logic portion (NMOS and PMOS) and the surface of the high concentration regions. Specifically, a cobalt suicide layer is formed using the same silicidation technique as in the first embodiment. Although not shown, when cobalt is deposited prior to the silicidation, the surface of the plate electrode 32 is protected by an insulation film such as a silicon oxide film. As a result, the cobalt silicide layer of the NMOS is formed in alignment with the side wall spacers 15a formed in the high concentration region. The cobalt silicide layer of the PMOS is formed in alignment with the side wall spacers 15a formed in the high concentration region.

When a polycrystalline silicon film is used as the plate electrode as described above, there is no need for an insulation film on the surface of the plate electrode to protect the same. In the case, cobalt is also deposited on the surface of the plate electrode 32. A cobalt silicide layer may be formed on the surface of the plate electrode 32 at the same time when the cobalt suicide layer on the gate electrode and the surface of the high concentration regions.

(Step of Forming First Wiring Layer)

Figure 52:
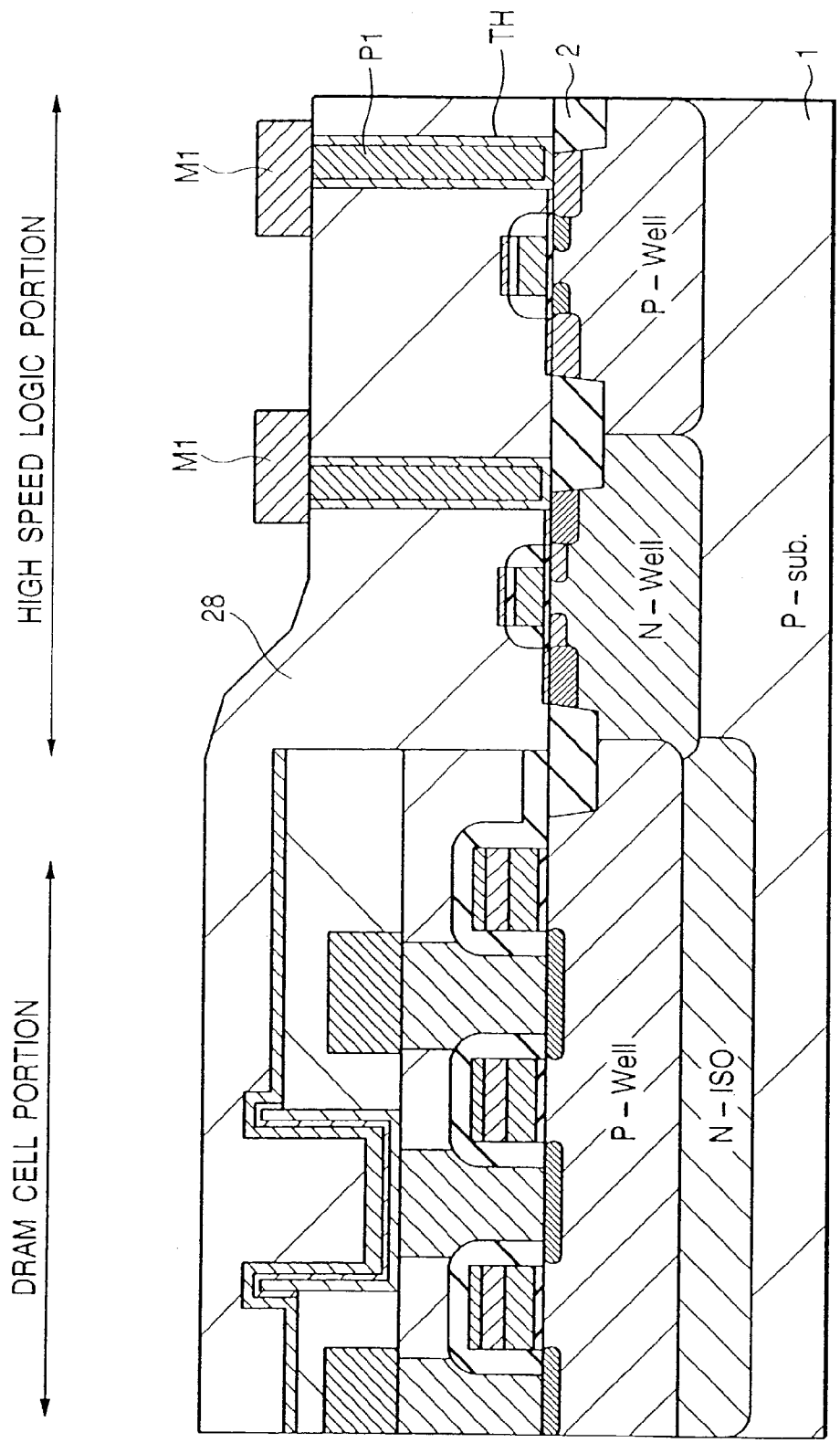
FIG. 52 is a sectional view of the major parts of the semiconductor integrated circuit device at a step of manufacture subsequent to that shown in FIG. 51.
Figure 53:
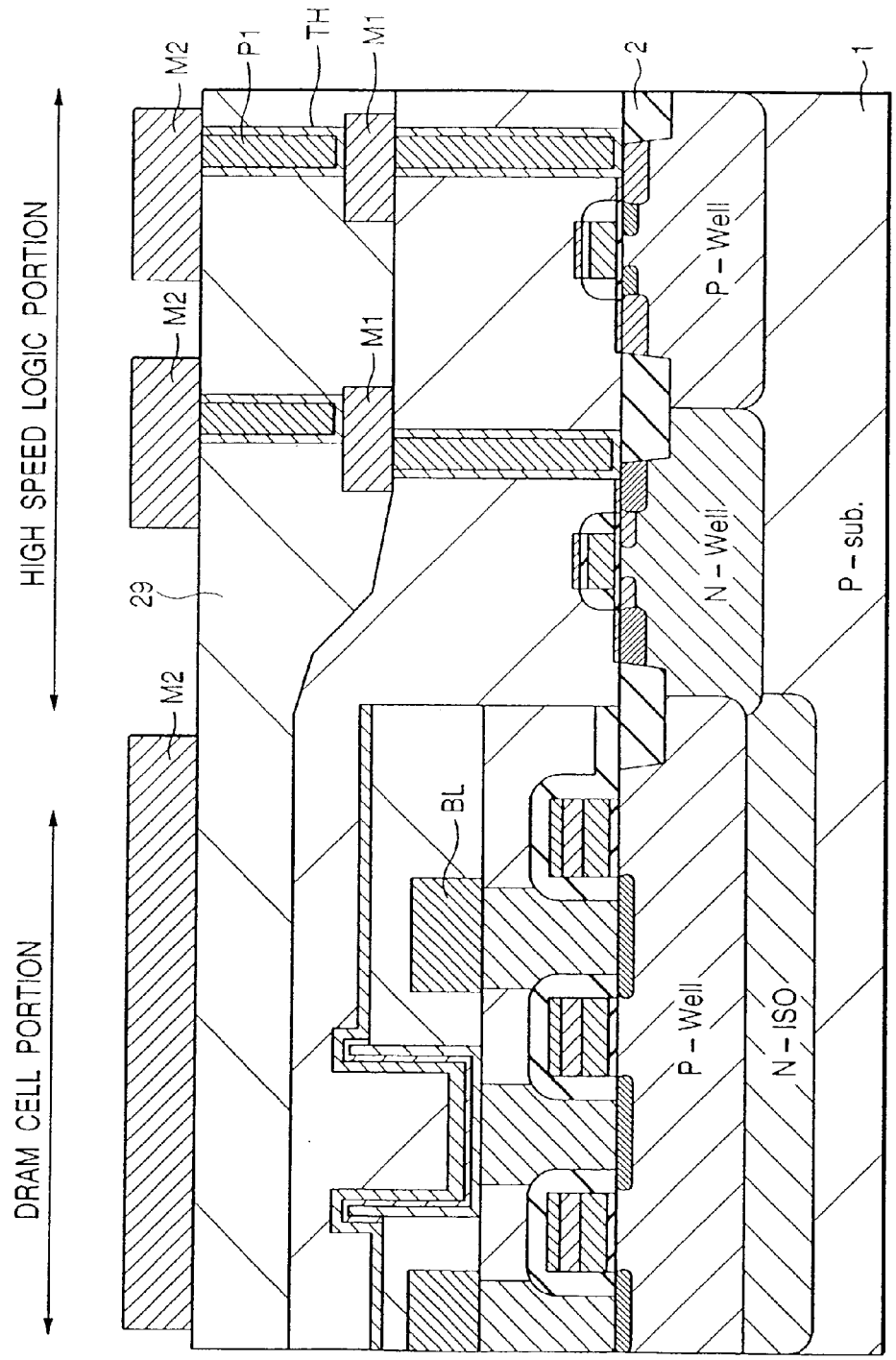
FIG. 53 is a sectional view of the major parts of the semiconductor integrated circuit device at a step of manufacture subsequent to that shown in FIG. 52.

Referring to FIG. 52, a layer insulation film (layer insulation film) 28 is deposited on the principal surface of the semiconductor body 1 which has been silicidized. The layer insulation film 28 is constituted by a multi-layer film formed by a spin-on-glass film applied to embed the high speed logic portion using a spin coating process and a silicon oxide film deposited on the spin-on-glass film using CVD. The layer insulation film 28 is planarized using a chemical mechanical polishing (CMP) process or an etch back process.

Subsequently, contact holes TH are formed to expose the surfaces of the salicide layers (cobalt silicide layers 21d) formed on the surface of the high concentration regions. The contact holes TH are formed by means of dry etching utilizing a photoresist pattern as a mask.

Next, plugs P1 are formed to fill the contact holes TH. The plugs P1 are tungsten plugs which are formed in the following procedure. First, sputtering is performed to thinly deposit titanium nitride (TiN) as a reaction preventing film for preventing reaction between tungsten and the underlying salicide layers. Subsequently, tungsten (W) is deposited on the titanium nitride film to fill the contact holes TH. A process (etch back) is performed to etch the deposited tungsten (W) and titanium nitride (TiN) as a whole to leave the plugs P1 in the contact holes TH.

Next, a metal layer is deposited, and a first wiring layer is formed using a well known technique utilizing a photoresist pattern as a mask. For example, the metal layer serving as wiring is constituted by TiN, Ti, AlCu and TiN (a top layer, upper layer, main wiring layer and bottom layer) as in the first embodiment. Specifically, the first wiring layer is multilayer wiring formed by sequentially sputtering Ti (with a thickness of 10 nm) at the bottom to provide adhesion to the $SiO_2$ film (layer insulation film) and to reduce contact resistance with the W plugs, Al-0.5% Cu (with a thickness of 500 nm), aluminum being the primary wiring material, Ti (with a thickness of 10 nm) to improve adhesion between AlCu and TiN and TiN (with a thickness of 75 nm) as a reflection preventing film.

(Step of Forming Second Wiring Layer)

Referring to FIG. 52, a layer insulation film (fourth layer insulation film 29) is deposited to cover the first wiring layer. The layer insulation film is constituted by a silicon oxide film 23 deposited using CVD. Then, CMP is used to planarize the surface of the layer insulation film 29.

Subsequently, contact holes TH are provided on the silicon oxide film 29 to expose a part of the first wiring layer M1. A metal layer is then deposited, and a second wiring layer M2 is formed using a well known technique utilizing a photoresist pattern as a mask. For example, the metal layer serving as wiring is constituted by TiN, Ti, AlCu and TiN (a top layer, upper layer, main wiring layer and bottom layer) as in like the first wiring layer. Since the layer insulation film 29 is planarized using CMP as illustrated, for example, the second wiring layer M2 may be extended on to the DRAM cell portion (DRAM memory array) to interconnect the circuit blocks. Since the freedom in arranging circuit blocks in a semiconductor chip is thus increased, it is possible to provide a system LSI incorporating a DRAM suitable for a high speed operation. The term "circuit blocks" represents the DRAM memory array DMAY, input/output control portion I/O, high speed logic circuit portion LOGIC and the like.

When the second wiring layer MR2 is the final wiring, the second wiring layer M2 is protected by a passivation film according to the procedure as described in the "Step of Forming Passivation Film" in the first embodiment. If necessary, layer insulation films and wiring may be sequentially formed on the second wiring layer to provide a system LSI incorporating a DRAM having a wiring structure with three, four or five layers.

According to the fifth embodiment, since the high concentration regions of both of the NMOS and PMOS in the high speed logic portion are formed with a suicide layer on the entire surface thereof, the resistance of the entire surfaces of the high concentration regions can be reduced. This makes it possible to provide a system LSI incorporating a DRAM having a higher speed.

Since the high concentration regions of both of the NMOS and PMOS in the high speed logic portion are formed in alignment with the silicide layers, the number of masks can be reduced to provide system LSIs incorporating a DRAM at a low cost and high yield.

Further, CMISs having a dual gate structure constituted by a p-gate PMOS and an n-gate. NMOS is provided, which makes it possible to provide a high performance system LSI incorporating a DRAM in which fineness is achieved and short channel effects are suppressed.

Further, the DRAM cell portion is formed by CMOSs having a polycide gate structure and the high speed logic portion is formed by CMOSs having a salicide gate structure. This makes it possible to provide a system LSI incorporating a DRAM at a high level of integration which achieves a higher speed and lower power consumption at the same time.

In each of the above-described embodiments, the PMOS and NMOS gate insulation films are not limited to single-layer films constituted by an oxide film (specifically a silicon oxide film). Depending on needs in view of improvement of device characteristics and reliability, they may be multi-layer films formed by a nitride film (specifically a silicon nitride) and an oxide film, composite films referred to as "oxinitride films" or single-layer films constituted by a nitride film.

A sixth embodiment of the invention will now be described.

The following modification is possible for the method of manufacturing a system LSI incorporating a flash memory described as the first embodiment of the invention. The present embodiment will be described with reference to the step of forming LDD portions shown in FIG. 20.

(Step of Forming Insulation Films)

Figure 55:
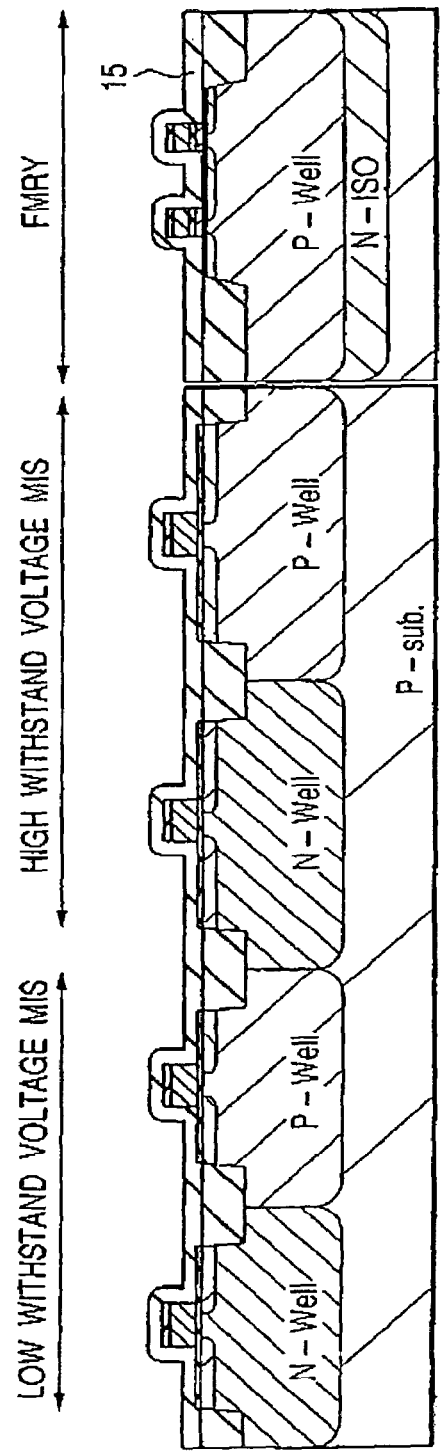
FIG. 55 is a sectional view of major parts of a semiconductor integrated circuit device according to an embodiment of the invention at a step of manufacture of the same.

As shown in FIG. 55, an insulation film 15 is formed on the principle surface of a low withstand voltage MIS portion, a high withstand voltage MIS portion and a memory cell portion formed with LDD portions to provide a mask to define high impurity concentration regions of the respective MISFETs. The insulation film 15 is constituted by a silicon nitride film formed using a plasma process. The insulation film 15 is constituted by a $SiO_2$ film having a thickness of about 150 nm formed using low-pressure CVD at a generation temperature of about 740° C. (Step of Forming Side Walls)

Figure 56:
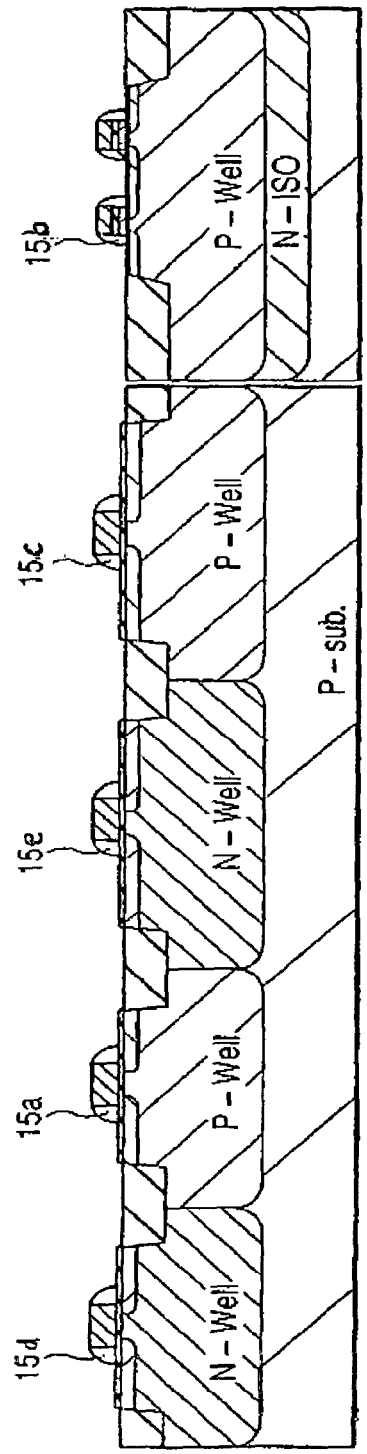
FIG. 56 is a sectional view of the major parts of the semiconductor integrated circuit device at a step of manufacture subsequent to that shown in FIG. 55.

As shown in FIG. 56, the insulation film 15 is etched back to form side walls 15a, 15b, 15c, 15d and 15e. As apparent from FIG. 56, the NMOS and PMOS side walls are formed by an etch back at the same step. Although cap layers 100a and 100b may be almost removed as a result of over-etching of the insulation film 15, this creates no problem.

(Step of Forming Insulation Films)

As shown in FIG. 57, an insulation film 115 is deposited again on the principal surface of the substrate having the side walls 15a, 15b, 15c, 15d and 15e formed thereon. The insulation film 115 is constituted by a $SiO_2$ film (silicon oxide film) having a thickness of about 20 nm formed using low-pressure CVD at a generation temperature of about 740° C.

(Step of Forming NMOS High Concentration Region)

As shown in FIG. 58, the $SiO_2$ film 115 is selectively removed using a photoresist pattern PR11 as a mask (hereinafter referred to as "first pattern mask").

An opening on the first pattern mask PR11 in the NMOS-forming region of the low withstand voltage MIS portion is configured in an opening pattern in which the ends of opening are located above the device isolating regions 2 with some margin.

The ends of an opening of the first pattern mask in the NMOS-forming region of the high withstand voltage MIS portion are offset from the device isolating regions 2 in order to provide a high withstand voltage MISFET having an offset structure.

Etching is carried out on the SiO$_2$ film (silicon oxide film) 115 using the first pattern mask PR11. As a result, the film is removed from the top of the gate electrodes 9b and 9e, and side wall films 15a and 15b (first gate insulation films) are left on the side walls of the gate electrodes 9b and 9e. The SiO$_2$ film 115 is selectively etched on the side walls of the gate electrode 9d with the first pattern mask PR11 to form patterns of silicon nitride films 115C (second insulation films).

Next, ion implantation is carried out to introduce an n-type impurity, i.e., arsenic (As) into the p-wells 5a, 5b and 5c such that the impurity is defined by the SiO$_2$ films 15a and 15b (first insulation films) and the SiO$_2$ films 15c (second insulation films), respectively. For example, the ion implantation is carried out with an acceleration energy at 60 KeV and in a dose of $3\times10^{15}$ atoms/cm$_2$. As a result of the ion implantation, the impurity is introduced also into each of the gate electrodes 9b and 9e. That is, n-gate (gate electrode of the n-type conductivity) NMOSs are provided.

(Step of Forming PMOS High Concentration Region)

After removing the first mask PR11, as shown in FIG. 59, the SiO$_2$ film 115 is selectively removed using a photoresist pattern PR12 as a mask (hereinafter referred to as "second pattern mask").

An opening on the second mask PR12 in the PMOS-forming region of the low withstand voltage MIS portion is configured in an opening pattern in which the ends of opening are located above the device isolating regions 2 with some margin. The ends of openings of the second pattern mask PR12 in the PMOS-forming region of the high withstand voltage MIS portion are offset from the ends of gate electrode 9a in order to provide a high withstand voltage MISFET having an offset structure.

Anisotropic etching is carried out on the SiO$_2$ film 115 using the second mask PR11. As a result, the film is removed from the top of the gate electrode 9a, and side wall films 15d (third gate insulation films) are left on the side walls of the gate electrode 9a. The SiO$_2$ film 115 is selectively etched on the side walls of the gate electrode 9c with the second pattern mask PR12 to form patterns of SiO$_2$ films 115e (fourth insulation films).

Next, ion implantation is carried out to introduce a p-type impurity, i.e., boron (B) into the n-wells 4a and 4b such that the impurity is defined by the SiO$_2$ films 15d (third insulation films) and the $_{SiO2}$ films 115e (fourth insulation films), respectively. For example, the ion implantation is carried out with an acceleration energy at 10 KeV and in a dose of $3\times10^{15}$ atoms/cm$_2$. As a result of the ion implantation, the impurity is introduced also into the gate electrode 9a. That is, a p-gate (gate electrode of the p-type conductivity) PMOS is provided.

(Step of Forming Silicide Layer)

Metal-semiconductor reaction layers 21s, 21d and 21g are formed as shown in FIG. 60.

Subsequently, a metal suitable for silicidation to reduce resistance (a refractory metal) is deposited on the principal surface of the semiconductor body 1. Cobalt (Co) is used as such a metal and is deposited to a thickness in the range from about 7 to 10 nm using sputtering. Titanium (Ti) may be used instead of cobalt.

The deposited cobalt is subjected to an annealing process at 500° C. for about one minute in a nitrogen atmosphere.

This process silicidizes the surfaces of the gate electrodes 9s, 9b and 9e and the high concentration regions 19a, 19d, 16s, 16d, 20s, 20d, 17s, 17d, 18s and 18d. After etching to remove unreacted cobalt on the silicon nitride film 15 and the device isolating regions 2, another annealing process is carried out at 700° C. for about one minute in a nitrogen atmosphere. As a result, metal-semiconductor layers made of cobalt silicide (CoSi$_2$) are formed. The cobalt silicide layers 21s, 21d and 21g are formed only on the surfaces of the exposed semiconductors (gate electrodes and high concentration regions) on a self-alignment basis. Specifically, the salicide layers (cobalt silicide layers 21s, 21d and 21g ) are formed in the high concentration regions aligned with the side walls (first and third insulation films) 15a and 15d in the low withstand voltage MIS portion. The salicide layers (cobalt silicide layers 21s, 21d and 21g ) are formed in the regions in the sixth embodiment, a high withstand voltage MIS may be formed with such an offset portion on one side thereof (particularly the drain side to which a high withstand voltage is applied). A system LSI includes both of high withstand MISFETS having offset portions on both of those regions and high withstand voltage MISFETS having an offset portion on one of those regions.

Figure 61:
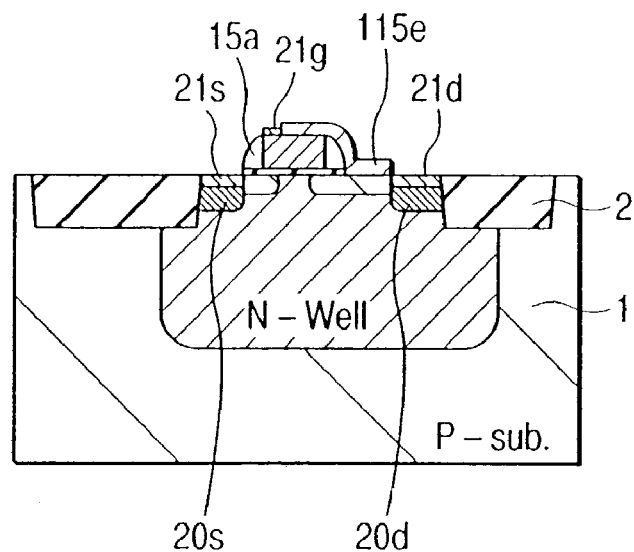
FIG. 61 is a sectional view of major parts of a semiconductor integrated circuit device according to still another embodiment of the invention.

FIG. 61 shows a sectional structure of a high withstand voltage MIS having an offset portion in the drain region thereof according to the present embodiment. While FIG. 61 shows an NMOS, the same structure is employed in a PMOS.

Figure 62:
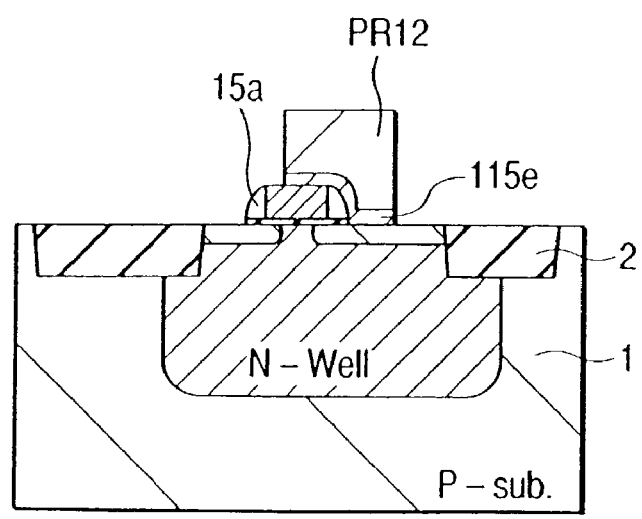
FIG. 62 is a sectional view of major parts of the semiconductor integrated circuit device shown in FIG. 61 at a step of manufacture of the same.

In such a high withstand voltage MIS offset on one side, a high concentration region is formed using a pattern mask PR12 as shown in FIG. 62.

Preferred embodiments of the present invention have been described in detail above. Specific features of the invention apparent from the embodiments are as listed below.

(1) As described in the third embodiment, according to the invention, there is provided a semiconductor integrated circuit device incorporating a flip-flop type SRAM cell having a CMOS configuration, characterized in that the SRAM cell is formed by a pair of load PMOSs, a pair of driving NMOSs and a pair of transfer NMOSs and in that the pair of load PMOS5, the pair of driving NMOSs and the pair of transfer NMOSs have a salicide electrode structure. Such a configuration represents a 6-MOS type SRAM cell suitable for a cache memory.

(2) The invention is characterized in that the gate electrodes of the pair of load PMOSs are formed by a polycrystalline silicon layer including a p-type impurity and a metal silicide layer formed on the surface of the polycrystalline silicon layer and in that the gate electrodes of each of the pair of driving NMOSs and the pair of transfer NMOS5 are formed by a polycrystalline silicon layer including an n-type impurity and a metal silicide layer formed on the surface of the polycrystalline silicon layer.

(3) As described in the third embodiment, according to the invention, there is provided a semiconductor integrated circuit device in which a first insulated gate field effect transistor for a high withstand voltage and a second insulated gate field effect transistor for a low withstand voltage are formed in a semiconductor substrate, characterized in that:

the gate electrode of the first transistor is constituted by a polycrystalline silicon layer, an insulation film being formed on the surface of the polycrystalline silicon layer;

a metal silicide layer is formed on a high concentration region of each of the source and drain regions of the first transistor;

the gate electrode of the first transistor is constituted by a polycrystalline silicon layer, a metal silicide layer being formed on the surface of the gate electrode, side wall layers made of an insulating material being formed on side walls of the gate electrode; and a metal silicide layer is formed on the surface of a high concentration region of each of the source and drain regions of the second transistor in alignment with the side wall layers.

(4) The invention is characterized in that the metal silicide layer is constituted by cobalt silicide.

(5) As described in the sixth embodiment, the invention is characterized in that the side wall layers are constituted by silicon oxide films.

(6) As described in the first embodiment, according to the invention, there is provided a semiconductor integrated circuit device in which a first insulated gate field effect transistor for a high withstand voltage and a second insulated gate field effect transistor for a low withstand voltage are formed in a semiconductor substrate, characterized in that:

the gate electrode of the first transistor is constituted by a polycrystalline silicon layer, an insulation film being formed on the top and lateral surfaces of the polycrystalline silicon layer;

each of the source and drain regions of the first transistor is constituted by a high concentration region and a low concentration region;

the insulation film is provided with an opening located above the surface of the high concentration region in each of the source and drain regions of the first transistor;

a metal silicide layer is formed on the surface of the high concentration region in the opening; the gate electrode of the second transistor is constituted by a polycrystalline silicon layer, a metal silicide layer being formed on the surface of the polycrystalline silicon layer, side wall layers made of an insulating material being formed on side walls of the gate electrode;

each of the source and drain regions of the alignment with the second side wall layers.

(8) As described in the first embodiment, the invention is characterized in that the first and second side wall layers are formed at separate steps and in that the metal silicide layers on the surface of the source and drain regions of the first transistor in alignment with the first side wall layers and the metal silicide layers on the surface of the source and drain regions of the second transistor in alignment with the second side wall layers are formed at the same step.

(9) As described in the sixth embodiment, the invention is characterized in that the first and second side wall layers are formed at the same step and in that the metal silicide layers on the surface of the source and drain regions of the first transistor in alignment with the first side wall layers and the metal silicide layers on the surface of the source and drain regions of the second transistor in alignment with the second side wall layers are formed at the same step.

Effects that can be achieved in typical aspects of the invention disclosed in this specification can be summarized as follows.

(1) According to the invention, a second region (high concentration region) of a first MISFET and a metal-semiconductor reaction layer are aligned with a first gate insulation film; a fourth region (high concentration region) of a second MISFET and a metal-semiconductor reaction layer are aligned with a second insulation film; and the resistance of electrode extraction portions of the second and fourth regions is reduced by the metal-semiconductor reaction films. This makes it possible to provide a semiconductor integrated circuit device incorporating fine MISFETs capable of a high speed operation.

Especially, the first insulation films formed on the side walls of the first gate electrode and the second insulation films formed on the side walls of the second gate electrode have different widths in the direction of the gate length, which makes it possible to provide MISFETs having different device characteristics. Specifically, since the width of the second gate insulation films is greater than the width of the first gate insulation films, the distance from an end of a p-n junction formed by a second semiconductor (second well) and a first region to the metal-semiconductor reaction layer is greater than the distance from an end of a p-n junction formed by a first semiconductor (first well) and a second region to the metal-semiconductor reaction layer. This makes it possible to allow a depletion layer to spread in a third region sufficiently and to thereby provide a second MISFET having a withstand voltage higher than that of a first MISFET, i.e., a MISFET which can be driven at a high voltage.

It is therefore possible to provide a semiconductor integrated circuit device incorporating fine MISFETs which are capable of a high speed operation and which can be driven at a high voltage.

(2) According to the invention, since the second region and the metal-semiconductor reaction layer on the surface thereof and the fourth region and the metal-semiconductor reaction layer on the surface thereof are formed in self-alignment with the first and second insulation films respectively, the number of masks can be reduced. This makes it possible not only to reduce the manufacturing cost of masks but also to reduce a series of processes for forming photoresist patterns using the masks, i.e., application, exposure, development, cleaning and drying of the photoresist, which significantly reduces the processing cost of a semiconductor integrated circuit device. Further, it is possible to reduce the rate of occurrence of defects attributable to foreign substances, which makes it possible to improve the yield and reliability of semiconductor integrated circuit devices.

What is claimed is:

1. A semiconductor integrated circuit device, comprising:
   a first semiconductor principal surface and a second semiconductor principal surface separated from each other over a semiconductor body, and a first and second MISFETs formed in said first and second semiconductor principal surfaces, respectively;
   said first MISFET comprising:
   a first gate electrode provided over said first semiconductor principal surface with a gate insulation film interposed therebetween,
   a first region having a relatively low concentration which is aligned with said first gate electrode and which exhibits the conductivity type opposite to the conductivity type of said first semiconductor principal surface,
   a first insulation film provided over a side wall of said first gate electrode, and
   a second region which is aligned with said first insulation film, which exhibits the same conductivity type as said first region and which is in contact with said first region,
   said second MISFET comprising:
   a second gate electrode provided over said second semiconductor principal surface with a gate insulation film interposed therebetween,
   a third region having a relatively low concentration which is aligned with said second gate electrode and which exhibits the conductivity type opposite to the conductivity type of said second semiconductor principal surface, a second insulation film provided over a side wall of said second gate electrode, and a fourth region which is aligned with said second insulation film, which exhibits the same conductivity type as said third region and which is in contact with said third region, wherein the thickness of said second gate insulation film is greater than that of said first gate insulation film, wherein, at the direction of the gate length, the length of said second insulation film is greater than that of said first insulation film, wherein said second insulation film is formed over the upper surface of said second gate electrode.

2. A semiconductor integrated circuit device according to claim 1, wherein said second insulation film has an opening portion via to the upper surface of said second gate electrode.

3. A semiconductor integrated circuit device according to claim 1, wherein said first and second insulation films are constituted by silicon oxide films.

4. A semiconductor integrated circuit device according to claim 1, wherein a depth of said second region is greater than a depth of said first region, and wherein a depth of said fourth region is greater than a depth of said third region.

5. A semiconductor integrated circuit device, comprising:

a first well and a second well separated from each other on a semiconductor, and a first and second MISFETs formed in said first and second wells, respectively;

said first MISFET comprising:

a first gate electrode provided over a principal surface of said first well with a gate insulation film interposed therebetween, a first region exhibiting the conductivity type opposite to the conductivity type of said well which is aligned with said first gate electrode in the principle surface of said well, a first side-wall layer provided over a side wall of said first gate electrode, and a second region which is aligned with said first insulation film, which exhibits the same conductivity type as said first region and which is in contact with said first region, and said second MISFET comprising:

a second gate electrode provided over a principal surface of said second well with a gate insulation film interposed therebetween, a third region exhibiting the conductivity type opposite to the conductivity type of said second well which is aligned with said second gate electrode in the principal surface of second well, a second side-wall layer provided over a side wall of said second gate electrode, an insulation film formed over said second MISFET, said insulation film covering said second gate electrode and second side-wall layer, and a fourth region which is aligned with said insulation film, which exhibits the same conductivity type as said third region and which is in contact with said third region, wherein the thickness of said second gate insulation film is greater than that of said first gate insulation film, wherein, at the direction of the gate length, the sum length of said second side-wall layers and said insulation film is greater than the length of said first side-wall layers, wherein said insulation film is formed over the upper surface of said second gate electrode.

6. A semiconductor integrated circuit device according to claim 5, wherein said insulation film has an opening portion via to the upper surface of said second gate electrode.

7. A semiconductor integrated circuit device according to claim 5, wherein, at the direction of the gate length, the length of said first and second side-wall layers is equal.

8. A semiconductor integrated circuit device according to claim 5, wherein said first and second side-wall layers are constituted by silicon oxide films.

9. A semiconductor integrated circuit device according to claim 5, wherein said insulation film is constituted by silicon oxide film.

10. A semiconductor integrated circuit device according to claim 5, wherein a depth of said second region is greater than a depth of said first region, and wherein a depth of said fourth region is greater than a depth of said third region.

11. A semiconductor integrated circuit device comprising:

a first semiconductor and a second semiconductor separated from each other by an insulating isolation layer, and a first and second MISFETs formed in said first and second semiconductors, respectively;

said first MISFET comprising:

a first gate electrode provided over said first semiconductor with a gate insulation film interposed therebetween, a first region having a first impurity concentration which is aligned with said first gate electrode and said insulating isolation layer and which exhibits the conductivity type opposite to the conductivity type of said first semiconductor, a first insulation film selectively left over a side waft of said first gate electrode over said first region, a second region which is aligned with said first insulation film and said insulating isolation layer, which is of the same conductivity type as said first region, which exhibits a concentration higher than said first impurity concentration and which is in contact with said first region, and a first metal-semiconductor reaction layer over a principal surface of said second region which is aligned with said first insulation film; and said second MISFET comprising:

a second gate electrode provided on the second semiconductor with a gate insulation film interposed therebetween, a third region having a third impurity concentration which is aligned with said second gate electrode and said insulating isolation layer and which exhibits the conductivity type opposite to the conductivity type of said second semiconductor, a second insulation film selectively formed over said third region such that it protrudes from a side wall of said second gate electrode and said insulating isolation layer, a fourth region which is aligned with said second insulation film and said insulating isolation layer, which is of the same conductivity type as said third region, which exhibits a concentration higher than said third impurity concentration and which is in contact with said third region, and a second metal-semiconductor reaction layer over a principal surface of said fourth region which is aligned with said second insulation film, wherein the pattern width of said second insulation film from an end of said second gate electrode is greater than the pattern width of said first insulation film from an end of said first gate electrode, wherein the thickness of said second gate insulation film is greater than that of said first gate insulation film, wherein, at the direction of the gate length, the distance between said second metal semiconductor reaction layer and the end of said second gate electrode is greater than the distance between said first metal semiconductor reaction layer and the end of said first gate electrode.

12. A semiconductor integrated circuit device according to claim 11, wherein each of said first and second semiconductors is provided over a single crystal silicon body, wherein each of said first and second electrodes is constituted by polycrystalline silicon and a metal silicide layer formed over the surface thereof, and wherein the metal-semiconductor reaction layers of said first and second MISFETs are made of metal silicide.

13. A semiconductor integrated circuit device according to claim 12, wherein said metal silicide is cobalt silicide.

14. A semiconductor integrated circuit device according to claim 11, wherein said insulating isolation layer is constituted by a groove provided in the semiconductor body and an insulation layer embedded in the groove.

15. A semiconductor integrated circuit device according to claim 14, wherein said first and second semiconductors are first and second well regions respectively which are selectively formed in said semiconductor body and wherein said insulating isolation layer is formed shallower than the depth of said first and second well regions.

16. A semiconductor integrated circuit device according to claim 11, wherein a depth of said second region is greater than a depth of said first region, and wherein a depth of said fourth region is greater than a depth of said third region.

17. A semiconductor integrated circuit device according to claim 16, wherein, at the direction of the gate length, the length of said third region is greater than the length of said first region.

18. A semiconductor integrated circuit device comprising:

a first semiconductor region and a second semiconductor region over a substrate, and a first and second MISFETs formed in said first and second semiconductor regions, respectively;

said first MISFET comprising:

a first gate electrode provided over a principal surface of said first semiconductor region with a gate insulation film having a first thickness interposed therebetween, a first region having a first impurity concentration which is aligned with said first gate electrode, which is provided in said first semiconductor region and which exhibits the conductivity type opposite to the conductivity type of said first semiconductor region, a first side-wall layer having a first width and selectively formed over a side wall of said first gate electrode, a second region which is aligned with said first insulation film, which is of the same conductivity type as said first region, which exhibits a concentration higher than said first impurity concentration and which partially overlaps said first region, and a first metal-semiconductor reaction layer provided over a principal surface of said second region in alignment with said first insulation film; and a said second MISFET comprising:

a second gate electrode provided on a principal surface of said second semiconductor region with a gate insulation film having a second thickness interposed therebetween, a third region having a third impurity concentration which is aligned with said second gate electrode and which is provided in said second semiconductor region and which exhibits the conductivity type opposite to the conductivity type of said first semiconductor region, a second side-wall layer having a second width and selectively formed over a side wall of said second gate electrode, a first insulation film formed over said second MISFET, said first insulation film covering said second wide-wall layer, and a fourth region which is aligned with said first insulation film, which is of the same conductivity type as said third region, which exhibits a concentration higher than said third impurity concentration and which partially overlaps said third region, and a second metal-semiconductor reaction layer provided over a principal surface of said fourth region in alignment with said first insulation film, wherein said second thickness is greater than said first thickness, wherein, at the direction of the gate length, the sum length of said second side-wall layers and said first insulation film is greater than the length of said first side-wall layers, wherein, at the direction of the gate length, the distance between said second metal semiconductor reaction layer and the end of said second gate electrode is greater than the distance between said first metal semiconductor reaction layer and the end of said first gate electrode.

19. A semiconductor integrated circuit device according to claim 18, wherein the metal-semiconductor reaction layer of each of said first and second MISFETs is made of cobalt silicide.

20. A semiconductor integrated circuit device according to claim 18, wherein said first and second gate electrodes are made of a semiconductor, and wherein said first and second metal-semiconductor reaction layers are formed over the surface of each of said first and second gate electrodes.

21. A semiconductor integrated circuit device according to claim 20, wherein said semiconductor is constituted by polycrystalline silicon and wherein said metal-semiconductor reaction layer is constituted by cobalt silicide.

22. A semiconductor integrated circuit device according to claim 18, wherein, at the direction of the gate length, the length of said first and second side-wall layers is equal.

23. A semiconductor integrated circuit device according to claim 18, wherein said first and second side-wall layers are constituted by silicon oxide films.

24. A semiconductor integrated circuit device according to claim 18, wherein said insulation film is constituted by silicon oxide film.

25. A semiconductor integrated circuit device according to claim 18, wherein a depth of said second region is greater than a depth of said first region, and wherein a depth of said fourth region is greater than a depth of said third region.

26. A semiconductor integrated circuit device according to claim 25, wherein, at the direction of the gate length, the length of said third region is greater than the length of said first region.

27. A semiconductor integrated circuit device comprising:
a first well of a first conductivity type and a second well of a second conductivity type opposite to said first conductivity type which are separated from each other over a single semiconductor body, and a first and second MISFETs formed in said first and second wells, respectively;
said first MISFET comprising:
a first gate electrode provided over a principal surface of said first well with a first gate insulation film interposed therebetween,
a first region of the second conductivity type formed in said first well,
a side-wall layer provided over a side wall of said first gate electrode, a second region of the second conductivity type which is aligned with said side-wall layer and which is in contact with said first region, and
a first metal-semiconductor region layer aligned with said side-wall layer on a principal surface of the second region; and
a said second misfet having comprising:
a second gate electrode provided over a principal surface of said second well with a second gate insulation film interposed therebetween,
a third region of the first conductivity type formed in said second well,
an insulation film provided over a side wall of said second gate electrode,
a fourth region of the first conductivity type which is aligned with said insulation film and which is in contact with said third region, and
a second metal-semiconductor reaction layer aligned with said insulation film over a principal surface of said fourth region,
wherein the thickness of said second gate insulation film is greater than that of said first gate insulation film,
wherein, at the direction of the gate length, the length of said insulation film is greater than that of said side-wall layer,
wherein, at the direction of the gate length, the distance between said second metal semiconductor reaction layer and the end of said second gate electrode is greater than the distance between said first metal semiconductor reaction layer and the end of said first gate electrode,
wherein said insulation film is formed over the upper surface of said second gate electrode, and
wherein said first metal-semiconductor reaction layer is formed over the upper surface of said first gate electrode.

28. A semiconductor integrated circuit device according to claim 27, wherein said first conductivity represents the n-type and said second conductivity type represents the p-type.

29. A semiconductor integrated circuit device according to claim 27, wherein each of said first and second gate electrodes is constituted by a polycrystalline semiconductor layer,
wherein said first gate electrode includes an impurity of the second conductivity type, and
wherein said second fate electrode includes an impurity of the first conductivity type.

30. A CMIS semiconductor integrated circuit device according to claim 29, wherein each of said first and second metal-semiconductor reaction layers is constituted by cobalt silicide.

31. A semiconductor integrated circuit device according to claim 27, wherein said insulation film has an opening portion via to the upper surface of said second gate electrode.

32. A semiconductor integrated circuit device according to claim 31, wherein said second metal silicide layer is formed over the upper surface of said second gate electrode in said opening portion.

33. A semiconductor integrated circuit device according to claim 32, wherein said first and second metal silicide layers are made of cobalt silicide.

34. A semiconductor integrated circuit device according to claim 27, wherein said first and second insulation film are constituted by silicon oxide films.

35. A semiconductor integrated circuit device according to claim 27, wherein a depth of said second region is greater than a depth of said first region, and wherein a depth of said fourth region is greater than a depth of said third region.

36. A semiconductor integrated circuit device according to claim 35, wherein, at the direction of the gate length, the length of said third region is greater than the length of said first region.

37. A semiconductor integrated circuit device comprising:
a first field effect transistor for a low withstand voltage formed in a semiconductor substrate, and
a second field effect transistor for a high withstand voltage formed in said semiconductor substrate,
said first field effect transistor comprising:
a first gate insulation film of said first field effect transistor formed over said semiconductor substrate,
a first gate electrode of said first field effect transistor formed over said first gate insulation film and constituted by a polycrystalline silicon layer,
first side-wall layers formed on the side walls of said first gate electrode and made of an insulating material,
a first source region and first drain region of said first field effect transistor formed into said semiconductor substrate and constituted by a high concentration region and a low concentration region, respectively, and
first metal silicide layers formed on the surface of a high concentration region of each of said first source and drain regions of said first field effect transistor, and
said second field effect transistor comprising:
a second gate insulation film of said second field effect transistor formed over said semiconductor substrate,
a second gate electrode of said second field effect transistor formed over said second gate insulation film and constituted by a polycrystalline silicon layer,
second side-wall layers formed on the side walls of said second gate electrode and made of an insulating material,
an insulation film formed over said second field effect transistor such that covering said second gate electrode and second side-wall layers,
a second source region and second drain region of said second field effect transistor formed into said semiconductor substrate and constituted by a high concentration region and a low concentration region, respectively, and
second metal silicide layers formed on the surface of a high concentration region of each of said second source and drain regions of said second field effect transistor,
wherein said first metal silicide layers are formed in alignment with said first side-wall layers and formed over the surface of said first gate electrode,
wherein said second metal silicide layers are formed in alignment with said insulation film, wherein the thickness of said second gate insulation film is greater than that of said first gate insulation film, wherein, at the direction of the gate length, the sum length of said second side-wall layers and said insulation film is greater than the length of said first side-wall layers, wherein said insulation film is formed over the upper surface of said second electrode, and wherein said first metal-semiconductor reaction layer is formed over the upper surface of said first gate electrode.

38. A semiconductor integrated circuit device according to claim 37, wherein said insulation film has an opening portion via to the upper surface of said second gate electrode.

39. A semiconductor integrated circuit device according to claim 38, wherein said second metal silicide layer is formed over the upper surface of said second gate electrode in said opening portion.

40. A semiconductor integrated circuit device according to claim 39, wherein said first and second metal silicide layers are made of cobalt silicide.

41. A semiconductor integrated circuit device according to claim 37, wherein said first and second metal silicide layers are made of cobalt silicide.

42. A semiconductor integrated circuit device according to claim 37, wherein, at the direction of the gate length, the length of said first and second side-wall layers is equal.

43. A semiconductor integrated circuit device according to claim 37, wherein said first and second side-wall layers are constituted by silicon oxide films.

44. A semiconductor integrated circuit device according to claim 37, wherein said insulation film is constituted by silicon oxide film.

45. A semiconductor integrated circuit device according to claim 37, wherein a depth of said high concentration regions is greater than a depth of said low concentration regions.

46. A semiconductor integrated circuit device according to claim 45, wherein, at the direction of the gate length, the length of said low concentration regions of said second source and drain regions is greater than the length of said low concentration regions of said first source and drain regions.

* * * * *